US011171179B2

(12) United States Patent
Kawai et al.

(10) Patent No.: US 11,171,179 B2
(45) Date of Patent: Nov. 9, 2021

(54) MEMORY ARRAY, METHOD FOR MANUFACTURING MEMORY ARRAY, MEMORY ARRAY SHEET, METHOD FOR MANUFACTURING MEMORY ARRAY SHEET, AND WIRELESS COMMUNICATION APPARATUS

(71) Applicant: TORAY INDUSTRIES, INC., Tokyo (JP)

(72) Inventors: Shota Kawai, Shiga (JP); Seiichiro Murase, Shiga (JP); Hiroji Shimizu, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 370 days.

(21) Appl. No.: 16/303,873

(22) PCT Filed: May 29, 2017

(86) PCT No.: PCT/JP2017/019953
§ 371 (c)(1),
(2) Date: Nov. 21, 2018

(87) PCT Pub. No.: WO2017/212972
PCT Pub. Date: Dec. 14, 2017

(65) Prior Publication Data
US 2020/0321399 A1 Oct. 8, 2020

(30) Foreign Application Priority Data

Jun. 6, 2016 (JP) .............................. JP2016-112416
Jul. 27, 2016 (JP) .............................. JP2016-147013
Feb. 27, 2017 (JP) .............................. JP2017-034620

(51) Int. Cl.
*H01L 27/112* (2006.01)
*H01L 27/28* (2006.01)
(Continued)

(52) U.S. Cl.
CPC ...... *H01L 27/281* (2013.01); *G06K 19/07749* (2013.01); *H01L 51/0046* (2013.01); *H01L 51/0048* (2013.01); *H01L 51/105* (2013.01)

(58) Field of Classification Search
CPC ............ H01L 27/112; H01L 27/11206; H01L 27/11213; H01L 27/11246
See application file for complete search history.

(56) References Cited

U.S. PATENT DOCUMENTS 6,329,250 B1   12/2001   Sakui
6,417,548 B1   7/2002    Sheu et al.
(Continued)

FOREIGN PATENT DOCUMENTS

CN   101097770 A   1/2008
CN   104423154 A   3/2015
(Continued)

OTHER PUBLICATIONS

Extended European Search Report for European Application No. 17810151.5, dated Jan. 7, 2020.
(Continued)

*Primary Examiner* — Jae Lee

(57) ABSTRACT

A memory array includes: a plurality of first wires; at least one second wire crossing the first wires; and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate.

6 Claims, 24 Drawing Sheets

(51) Int. Cl.
*G06K 19/077* (2006.01)
*H01L 51/00* (2006.01)
*H01L 51/10* (2006.01)

(56) References Cited

U.S. PATENT DOCUMENTS

| | | | |
|---|---|---|---|
| 7,742,351 B2 | 6/2010 | Inoue et al. | |
| 8,815,652 B2 | 8/2014 | Inoue et al. | |
| 2001/0034099 A1 | 10/2001 | Mizuhashi et al. | |
| 2006/0246643 A1* | 11/2006 | Ohsawa | H01L 51/0035 438/197 |
| 2008/0002454 A1 | 1/2008 | Inoue et al. | |
| 2008/0017923 A1 | 1/2008 | Akimoto | |
| 2008/0277648 A1 | 11/2008 | Wakita | |
| 2011/0134680 A1* | 6/2011 | Saito | G11C 17/12 365/104 |

FOREIGN PATENT DOCUMENTS

| | | |
|---|---|---|
| EP | 2221829 A1 | 8/2010 |
| JP | 61-288463 A | 12/1986 |
| JP | 5-211316 A | 8/1993 |
| JP | 7-60863 B2 | 6/1995 |
| JP | 2000-260886 A | 9/2000 |
| JP | 2001-094063 A | 4/2001 |
| JP | 2008-034083 A | 2/2008 |
| JP | 2008-305964 A | 12/2008 |
| JP | 2013-084963 A | 5/2013 |
| JP | 2014-157941 A | 8/2014 |
| KR | 10-2006-0080238 A | 7/2006 |
| KR | 10-2013-0053097 A | 5/2013 |
| WO | WO 2006/003844 A1 | 1/2006 |

OTHER PUBLICATIONS

International Search Report (PCT/ISA/210) issued in PCT/JP2017/019953, dated Aug. 8, 2017.
Office Action issued in Japanese Patent Application No. 2017-530232, dated Feb. 20, 2018.
Written Opinion (PCT/ISA/237) issued in PCT/JP2017/019953, dated Aug. 8, 2017.
Korean Office Action dated Feb. 18, 2019, for Korean Application No. 10-2018-7033802, with English translation.
Chinese Office Action and Search Report for Chinese Application No. 201780032299.0, dated Apr. 28, 2019, with an English translation of the Office Action.

* cited by examiner (PROCESS ST31)

⇩

(PROCESS ST32)

(PROCESS ST33)

(PROCESS ST34)

(PROCESS ST41)

(PROCESS ST42)

(PROCESS ST43)

(PROCESS ST44)

(PROCESS ST51)

(PROCESS ST52)

(PROCESS ST53)

(PROCESS ST54)

(PROCESS ST55)

(PROCESS ST61)

(PROCESS ST62)

(PROCESS ST63)

(PROCESS ST64)

(PROCESS ST65)

MEMORY ARRAY, METHOD FOR MANUFACTURING MEMORY ARRAY, MEMORY ARRAY SHEET, METHOD FOR MANUFACTURING MEMORY ARRAY SHEET, AND WIRELESS COMMUNICATION APPARATUS

FIELD

The present invention relates to a memory array, a method for manufacturing a memory array, a memory array sheet, a method for manufacturing a memory array sheet, and a wireless communication apparatus.

BACKGROUND

In recent years, a wireless communication system using a radio frequency identification (RFID) technique (that is, an RFID system) has been developed as a noncontact tag. In the RFID system, wireless communication is performed between a wireless transmitter/receiver called a reader/writer and an RFID tag.

The RFID tag is expected to be used for various uses such as logistics management, merchandize management, and shoplifting prevention and has started to be introduced in part of uses such as IC cards such as traffic cards and merchandize tags. The RFID tag has an IC chip and an antenna for performing wireless communication with the reader/writer and has a memory circuit within the IC chip. Information recorded in this memory circuit is read from the RFID tag using the reader/writer.

The memory circuit includes a memory array in which a plurality of memory elements recording information are arranged and peripheral circuitry such as a decoder taking out the information from the memory array. A nonvolatile memory circuit is an example of the memory circuit. For the nonvolatile memory circuit, systems such as read only memory (ROM) and random access memory (RAM) are used.

A system called mask ROM is known as ROM (refer to Patent Literatures 1 to 3, for example). In mask ROM, information is written when a memory array is manufactured, and the information cannot be changed afterward.

Consequently, at the same time as the manufacture of a memory array, information to be recorded in the memory array is determined. Using that property, pieces of unique information such as ID numbers can be recorded in respective memory arrays.

CITATION LIST

Patent Literature

Patent Literature 1: Japanese Patent Application Laid-open No. 2001-94063
Patent Literature 2: Japanese Patent Application Laid-open No. 2000-260886
Patent Literature 3: Japanese Patent Application Laid-open No. 2013-84963

SUMMARY

Technical Problem

In the mask ROM system in general, memory elements are separately manufactured using photolithography, whereby information is recorded in a memory array.

Patent Literature 1 discloses a technique that selectively provides gate electrodes by photolithography and etching processes, whereby memory elements each corresponding to data of "0" or "1" to be recorded are separately manufactured, for example.

Patent Literature 2 discloses a technique using a mask programming method that, using a patterned ion injection mask, forms channel doped layers only in its opening parts. With this method, depression type memory elements and enhancement type memory elements are separately manufactured.

However, in these techniques, to manufacture many memory arrays different from each other in unique information to be recorded, the same number of photomasks as the number of memory arrays to be manufactured must be manufactured. For this reason, there is a heavy burden in terms of both the manufacturing costs and processes of memory arrays.

Meanwhile, Patent Literature 3 discloses a method that, in place of using photolithography, applies voltage to an electrode or wire while being immersed in an electrolyte and selectively dissolves the electrode or wire to break its electric connection, thereby recording pieces of unique information different from each other in respective memory arrays. However, this method requires the electrode or wire to be immersed in the electrolyte while being electrically connected to an external control device such as a computer during the manufacturing process of memory arrays. For this reason, there is a problem in that the processes are complicated and manufacturing costs increase in the manufacturing process of memory arrays.

The present invention has been made in view of the above problems, and a first object thereof is to provide a memory array that can be manufactured at low costs using simple processes and can record unique information different each time. A second object thereof is to provide a memory array sheet in which a plurality of memory arrays that record respective pieces of unique information different from each other are formed on a sheet at low costs using simple processes. A third object thereof is to provide a wireless communication apparatus including a memory array that is manufactured at low costs using simple processes and can record unique information different from that of another memory array.

Solution to Problem

To solve the problem described above and to achieve the object, a memory array according to the present invention includes: a plurality of first wires; at least one second wire crossing the first wires; and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate, either the first electrode or the second electrode being connected to one of the first wires, at least one of the memory elements having an applied layer in an area between the first electrode and the second electrode, the memory elements including two kinds of memory elements different from each other in electrical characteristics between the first electrode and the second electrode by the applied layer, information to be recorded being determined by arrangement with any combination of the two kinds of memory elements.

In the memory array according to the present invention, the applied layer is a semiconductor layer formed of a semiconductor material applied to the area between the first electrode and the second electrode, out of the two kinds of memory elements, one kind of memory element is a memory element having the semiconductor layer, whereas another kind of memory element is a memory element not having the semiconductor layer, and the one kind of memory element and the other kind of memory element record respective pieces of information different from each other by presence or absence of the semiconductor layer.

In the memory array according to the present invention, the applied layer is formed of a semiconductor material applied to the area between the first electrode and the second electrode and is a first semiconductor layer or a second semiconductor layer, the first and the second semiconductor layers being different from each other in electrical characteristics, out of the two kinds of memory elements, one kind of memory element is a memory element having the first semiconductor layer, whereas another kind of memory element is a memory element having the second semiconductor layer, and the one kind of memory element and the other kind of memory element record respective pieces of information different from each other by a difference in electrical characteristics between the first semiconductor layer and the second semiconductor layer.

In the memory array according to the present invention, the second semiconductor layer contains a semiconductor material different from that of the first semiconductor layer.

In the memory array according to the present invention, a film thickness of the second semiconductor layer is larger than a film thickness of the first semiconductor layer.

In the memory array according to the present invention, the first semiconductor layer and the second semiconductor layer each contain one or more selected from the group consisting of carbon nanotubes, graphene, fullerenes, and organic semiconductors as the semiconductor material.

In the memory array according to the present invention, the first semiconductor layer and the second semiconductor layer each contain carbon nanotubes as the semiconductor material, and a concentration of carbon nanotubes of the second semiconductor layer is higher than a concentration of carbon nanotubes of the first semiconductor layer.

In the memory array according to the present invention, the memory elements each have a semiconductor layer formed of a semiconductor material applied so as to be in contact with the insulating layer in the area between the first electrode and the second electrode, the applied layer is formed of an insulating material applied so as to be in contact with the semiconductor layer from a side opposite the insulating layer in the area between the first electrode and the second electrode, and is a first insulating layer or a second insulating layer that changes electrical characteristics of the semiconductor layer into electrical characteristics different from each other, out of the two kinds of memory elements, one kind of memory element is a memory element having the first insulating layer, whereas another kind of memory element is a memory element having the second insulating layer, and the one kind of memory element and the other kind of memory element record respective pieces of information different from each other by a difference in the electrical characteristics of the semiconductor layer by the first insulating layer and the second insulating layer.

In the memory array according to the present invention, the semiconductor layer contains one or more selected from the group consisting of carbon nanotubes, graphene, fullerenes, and organic semiconductors.

In the memory array according to the present invention, the semiconductor layer contains carbon nanotubes.

In the memory array according to the present invention, the carbon nanotubes contain a carbon nanotube composite in which a conjugated polymer is attached to at least part of surfaces of the carbon nanotubes.

A method for manufacturing a memory array according to the present invention is a method for manufacturing a memory array including a plurality of first wires, at least one second wire crossing the first wires, and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate. The method includes an application process of forming an applied layer in an area between the first electrode and the second electrode of at least one memory element out of the memory elements by application.

In the method for manufacturing a memory array according to the present invention, the applied layer is a semiconductor layer, and the application process forms the semiconductor layer in the area between the first electrode and the second electrode of a memory element to which the applied layer is to be applied selected out of the memory elements in correspondence with information to be recorded.

In the method for manufacturing a memory array according to the present invention, the applied layer is a first semiconductor layer or a second semiconductor layer, the first and the second semiconductor layers being different from each other in electrical characteristics, and the application process forms the first semiconductor layer or the second semiconductor layer in the area between the first electrode and the second electrode of each of the memory elements in correspondence with information to be performed.

In the method for manufacturing a memory array according to the present invention, the applied layer is a first insulating layer or a second insulating layer different from each other in electrical characteristics, a semiconductor layer being in contact with the insulating layer is formed in advance in the area between the first electrode and the second electrode of each of the memory elements, and the application process forms the first insulating layer or the second insulating layer so that the first or second insulating layer to be formed is in contact with the semiconductor layer from a side opposite the insulating layer in the area between the first electrode and the second electrode of each of the memory elements in correspondence with information to be recorded.

In the method for manufacturing a memory array according to the present invention, the application is any one selected from the group consisting of ink jetting, dispensing, and spraying.

A memory array sheet according to the present invention includes a combination of a plurality of memory arrays according to any one of the above-mentioned inventions formed on a sheet, respective pieces of information recorded in the memory arrays formed on the sheet being different from each other.

A memory array sheet according to the present invention is a memory array sheet includes a combination of a plurality of memory arrays each including a plurality of first wires, at least one second wire crossing the first wires, and a plurality of memory elements provided in correspondence with respective intersections of the first wires and the at least one second wire, the memory arrays being formed on a sheet, the memory elements including two kinds of memory elements including a memory element with a first wire pattern electrically connected to both the first wire and the second wire and a memory element with a second wire pattern not electrically connected to at least either the first wire or the second wire, the first wire pattern and the second wire pattern being formed of an electric conductive material applied to the sheet, information to be recorded in the memory arrays being determined by arrangement with any combination of the two kinds of memory elements, respective pieces of information recorded in the memory arrays formed on the sheet being different from each other.

In the memory array sheet according to the present invention, the memory element with the first wire pattern has a first electrode electrically connected to one of the first wires, a second electrode electrically connected to the first electrode via a semiconductor layer, and a third electrode electrically connected to one of the at least one second wire, and the memory element with the second wire pattern lacks at least one of electric connection between one of the first wires and the first electrode, electric connection between the first electrode and the second electrode, and electric connection between one of the at least one second wire and the third electrode.

A method for manufacturing a memory array sheet according to the present invention is a method for manufacturing a memory array sheet including a combination of a plurality of memory arrays each including a plurality of first wires, at least one second wire crossing the first wires, and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the memory arrays being formed on a sheet. The method for manufacturing a memory array sheet includes an application process of forming an applied layer by application in an area between the first electrode and the second electrode of at least one memory element out of the memory elements, respective pieces of information different from each other being recorded in the memory arrays formed on the sheet.

In the method for manufacturing a memory array sheet according to the present invention, the applied layer is a semiconductor layer, and the application process forms the semiconductor layer in the area between the first electrode and the second electrode of a memory element to which the applied layer is to be applied selected out of the memory elements in correspondence with information to be recorded.

In the method for manufacturing a memory array sheet according to the present invention, the applied layer is a first semiconductor layer or a second semiconductor layer, the first and the second semiconductor layers being different from each other in electrical characteristics, and the application process forms the first semiconductor layer or the second semiconductor layer in the area between the first electrode and the second electrode of each of the memory elements in correspondence with information to be performed.

In the method for manufacturing a memory array sheet according to the present invention, the applied layer is a first insulating layer or a second insulating layer different from each other in electrical characteristics, a semiconductor layer being in contact with the insulating layer is formed in advance in the area between the first electrode and the second electrode of each of the memory elements, and the application process forms the first insulating layer or the second insulating layer so that the first or second insulating layer to be formed is in contact with the semiconductor layer from a side opposite the insulating layer in the area between the first electrode and the second electrode of each of the memory elements in correspondence with information to be recorded.

A method for manufacturing a memory array sheet according to the present invention is a method for manufacturing a memory array sheet including a combination of a plurality of memory arrays each including a plurality of first wires, at least one second wire crossing the first wires, and a plurality of memory elements provided in correspondence with respective intersections of the first wires and the at least one second wire, the memory arrays being formed on a sheet. The method for manufacturing a memory array sheet includes, for each memory element included in the memory elements, an application process of forming a first wire pattern, in which both the first wire and the second wire and the memory element are electrically connected to each other, or a second wire pattern, in which at least either the first wire or the second wire and the memory element are not electrically connected to each other, by application, respective pieces of information different from each other being recorded in the memory arrays formed on the sheet.

In the method for manufacturing a memory array sheet according to the present invention, the first wire pattern is a wire pattern including a first electrode electrically connected to one of the first wires, a second electrode electrically connected to the first electrode via a semiconductor layer, and a third electrode electrically connected to one of the at least one second wire, and the second wire pattern is a wire pattern that lacks at least one of electric connection between one of the first wires and the first electrode, electric connection between the first electrode and the second electrode, and electric connection between one of the at least one second wire and the third electrode.

In the method for manufacturing a memory array sheet according to the present invention, the application is any one selected from the group consisting of ink jetting, dispensing, and spraying.

A wireless communication apparatus includes: the memory array according to any one of the above-mentioned inventions or a memory array cut out of the memory array sheet according to any one of the above-mentioned inventions; and an antenna.

Advantageous Effects of Invention

The present invention can provide a memory array that can be manufactured at low costs using simple processes and can record unique information different each time, can provide a memory array sheet having a plurality of memory arrays that record respective pieces of unique information different from each other at low costs using simple processes, and can provide a wireless communication apparatus including a memory array that is manufactured at low costs using simple processes and records unique information different from that of another memory array.

DESCRIPTION OF EMBODIMENTS

Figure 1:
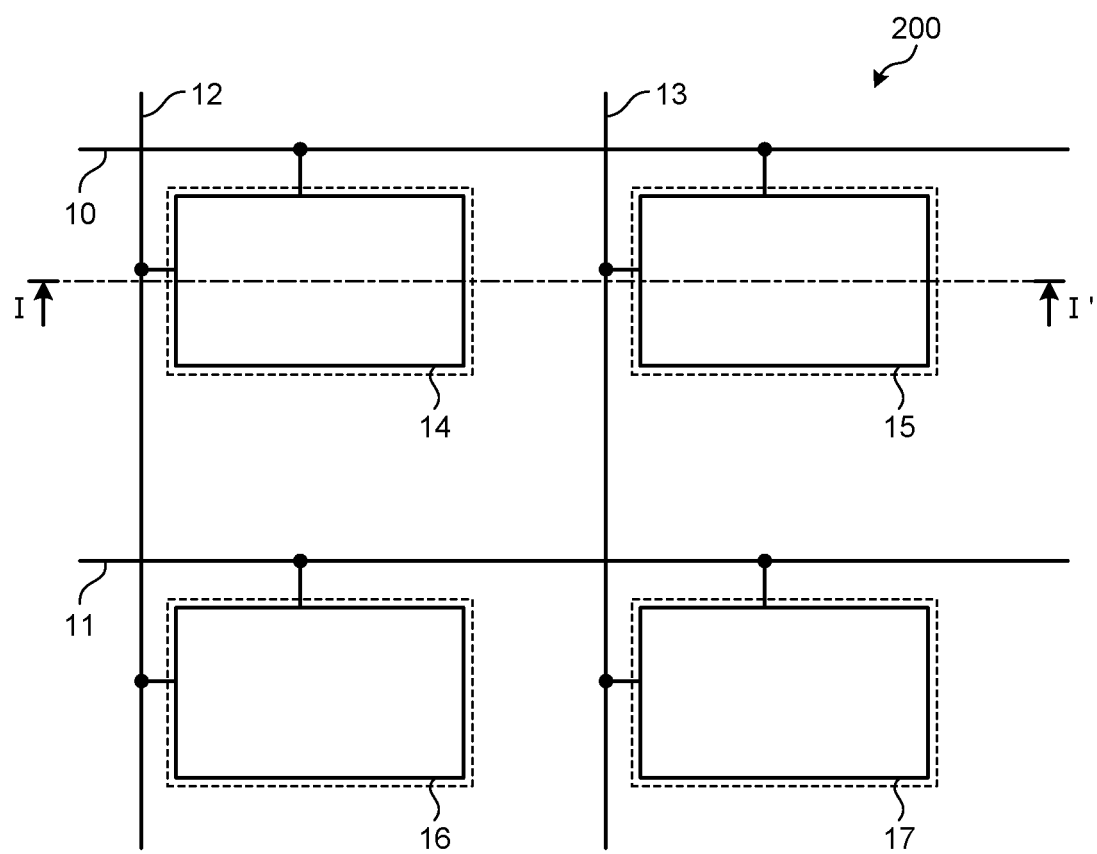
FIG. 1 is a schematic diagram of a configuration example of a memory array according to a first embodiment of the present invention.

The following describes preferred embodiments of a memory array, a method for manufacturing a memory array, a memory array sheet, a method for manufacturing a memory array sheet, and a wireless communication apparatus according to the present invention in detail with reference to the accompanying drawings as needed. These embodiments do not limit the present invention.

<Memory Array>

The memory array according to the present invention includes a plurality of first wires, at least one second wire crossing the first wires, and a plurality of memory elements provided in correspondence with respective intersections of the first wires and the at least one second wire on a substrate. These memory elements each have a first electrode and a second electrode arranged spaced apart from each other, a third electrode connected to one of the at least one second wire, and an insulating layer that electrically insulates the first electrode and the second electrode and the third electrode from each other. In each of the memory elements, either the first electrode or the second electrode is connected to one of the first wires.

In the memory array according to the present invention, at least one of the memory elements has an applied layer in an area between the first electrode and the second electrode. These memory elements include two kinds of memory elements different from each other in electrical characteristics between the first electrode and the second electrode by this applied layer. Information (unique information such as an ID number) to be recorded in the memory array is determined by arrangement with any combination of such two kinds of memory elements.

In the present invention, "the area between the first electrode and the second electrode" is, in a plan view of the first electrode and the second electrode from the thickness direction of the memory element (the film thickness direction of the insulating layer, for example), an area positioned between the first electrode and the second electrode. Such an area includes not only an area interposed between the first electrode and the second electrode but also an area facing the interposed area from the thickness direction of the memory element (above, for example) (an area not interposed between the first electrode and the second electrode).

First Embodiment

The following describes a memory array according to a first embodiment of the present invention. In the memory array according to the first embodiment, the applied layer is a semiconductor layer formed of a semiconductor material applied to the area between the first electrode and the second electrode of the memory element. The memory elements are classified into two kinds of memory elements different from each other in electrical characteristics between the first electrode and the second electrode by the presence or absence of the semiconductor layer. Out of the two kinds of memory elements, one kind of memory element is a memory element having the semiconductor layer, whereas the other kind of memory element is a memory element not having the semiconductor layer, for example. The one kind of memory element and the other kind of memory element record respective pieces of information different from each other by the presence or absence of the semiconductor layer.

FIG. 1 is a schematic diagram of a configuration example of the memory array according to the first embodiment of the present invention. As illustrated in FIG. 1, this memory array 200 according to the first embodiment has two word lines 10 and 11, two bit lines 12 and 13, and four memory elements 14, 15, 16, and 17 on a substrate (not illustrated). The word lines 10 and 11 are examples of the at least one second wire. The bit lines 12 and 13 are examples of the first wires. The memory elements 14, 15, 16, and 17 are examples of the memory elements provided in correspondence with the respective intersections of the first wires and the second wire.

As illustrated in FIG. 1, the word line 10 and the word line 11 are arranged spaced apart from each other with a certain direction as being long. The bit line 12 and the bit line 13 are arranged spaced apart from each other with a direction crossing the word line 10 and the word line 11 as being long. The word lines 10 and 11 and the bit lines 12 and 13 are arranged crossing each other insulated from each other. The memory element 14, the memory element 15, the memory element 16, and the memory element 17 are arranged in respective four areas (areas surrounded by the broken lines in FIG. 1) set by respective crossings between the word lines 10 and 11 and the bit lines 12 and 13.

Although FIG. 1 exemplifies the memory array 200 for 4 bits in order to simplify the description, naturally the memory array 200 according to the first embodiment is not limited to one for 4 bits and may be one for 2 bits or more.

Figure 2:
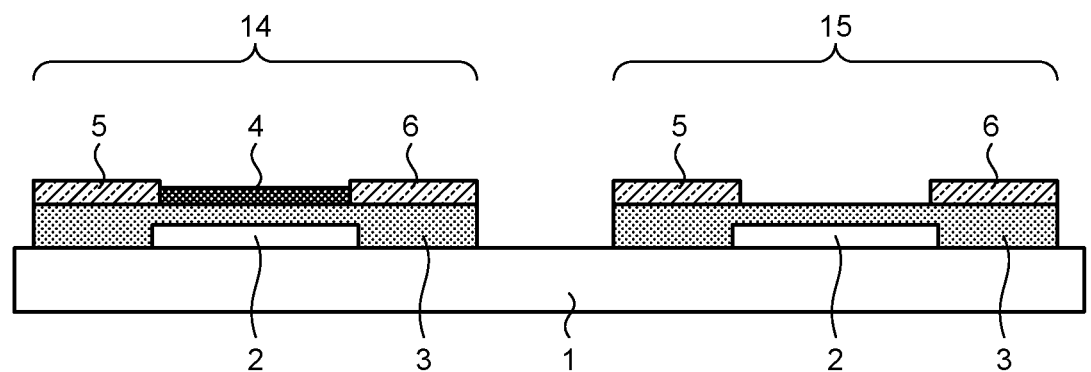
FIG. 2 is a schematic sectional view along the I-I' line of the memory array illustrated in FIG. 1.

FIG. 2 is a schematic sectional view along the I-I' line of the memory array illustrated in FIG. 1. FIG. 2 illustrates a configuration example of two kinds of memory elements included in the memory array 200 (refer to FIG. 1) according to the first embodiment.

As illustrated in FIG. 2, the memory element 14 and the memory element 15 as examples of the two kinds of memory elements are formed on a substrate 1. The memory element 14 and the memory element 15 each have a first electrode 5, a second electrode 6, an insulating layer 3, and a third electrode 2 on the substrate 1. The third electrode 2 is electrically insulated from the first electrode 5 and the second electrode 6 by the insulating layer 3. The first electrode 5 and the second electrode 6 are arranged spaced apart from each other on the insulating layer 3, for example.

In the first embodiment, the memory element 14 and the memory element 15 are examples of the two kinds of memory elements different from each other in electrical characteristics between the first electrode 5 and the second electrode 6. As illustrated in FIG. 2, out of these two kinds of memory elements, one memory element 14 further has a semiconductor layer 4 in the area between the first electrode 5 and the second electrode 6. The other memory element 15 does not have the semiconductor layer 4 in this area. In the first embodiment, depending on whether the semiconductor layer 4 is formed in the area between the first electrode 5 and the second electrode 6, respective pieces of information to be recorded in the memory element 14 and the memory element 15 such as "0" or "1" are determined. In other words, the memory element 14 and the memory element 15 record respective pieces of information different from each other by the presence or absence of the semiconductor layer 4. The reason why the respective pieces of information recorded in the two kinds of memory elements are thus different from each other is because when the memory elements 14 and 15 are selected, that is, when a certain voltage is applied to the respective third electrodes 2 of the memory elements 14 and 15, although a current passes through the memory element 14 having the semiconductor layer 4, no current passes through the memory element 15 not having the semiconductor layer 4.

Figure 3:
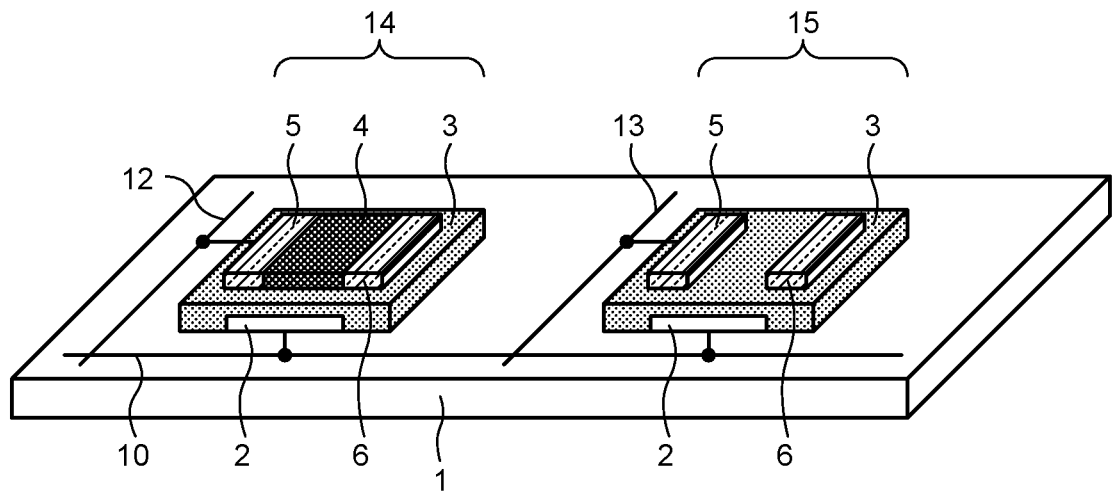
FIG. 3 is a perspective view with the surrounding part of two kinds of memory elements included in the memory array illustrated in FIG. 1 extracted.

FIG. 3 is a perspective view with the surrounding part of the two kinds of memory elements included in the memory array illustrated in FIG. 1 extracted. FIG. 3 exemplifies the memory element 14 and the memory element 15 as these two kinds of memory elements. It should be noted that although FIG. 1 illustrates the word line 10 on the drawing's upper side (far side) of the memory elements 14 and 15, FIG. 3 illustrates the word line 10 on the near side of the memory elements 14 and 15 for easy understanding.

As illustrated in FIG. 3, in each of the memory element 14 and the memory element 15, the third electrode 2 is a gate electrode, for example, and is electrically connected to the word line 10 via a wire. The first electrode 5 is a drain electrode, for example. The first electrode 5 of the memory element 14 is electrically connected to the bit line 12 via a wire. The first electrode 5 of the memory element 15 is electrically connected to the bit line 13 via a wire. The second electrode 6 is a source electrode, for example. Although not illustrated in particular, the second electrode 6 of each of the memory elements 14 and 15 is connected to a reference potential line via a wire.

The semiconductor layer 4 is a layer formed of a semiconductor material applied to the area between the first electrode 5 and the second electrode 6 by desired application. In FIG. 3, the semiconductor layer 4 is formed in the area between the first electrode 5 and the second electrode 6 of the one memory element 14 out of the two kinds of memory elements. By the presence or absence of this semiconductor layer 4, the memory elements 14 and 15 are different from each other in electrical characteristics between the first electrode 5 and the second electrode 6.

The residual memory elements 16 and 17 out of the four memory elements 14, 15, 16, and 17 included in the memory array 200 illustrated in FIG. 1 have the same structure as that of either of the two kinds of memory elements 14 and 15 illustrated in FIGS. 2 and 3. In each of the memory element 16 and the memory element 17, the third electrode is electrically connected to the word line 11 via a wire, for example. The first electrode of the memory element 16 is electrically connected to the bit line 12 via a wire. The first electrode of the memory element 17 is electrically connected to the bit line 13 via a wire. The second electrode of each of the memory elements 16 and 17 is connected to the reference potential line via a wire.

In the memory array 200, information to be recorded is determined by arrangement with any combination of the two kinds of memory elements, or "the memory element having the semiconductor layer 4" exemplified by the memory element 14 and "the memory element not having the semiconductor layer 4" exemplified by the memory element 15. This determined information can be recorded in the memory array 200 as unique information such as an ID number unique to the memory array 200. In the arrangement of the four memory elements 14, 15, 16, and 17 [memory element 14, memory element 15, memory element 16, memory element 17], when the memory elements 14 and 17 each have the semiconductor layer 4 and the memory elements 15 and 16 do not each have the semiconductor layer 4, information of [1, 0, 0, 1] or [0, 1, 1, 0] is recorded in the memory array 200 as the unique information, for example. When the memory element 15 has the semiconductor layer 4 and the memory elements 14, 16, and 17 do not each have the semiconductor layer 4, information of [0, 1, 0, 0] or [1, 0, 1, 1] is recorded in the memory array 200 as the unique information.

In the first embodiment, binary information (information of "0" or "1," for example) is recorded in each of the memory elements by the presence or absence of the semiconductor layer formed of the semiconductor material applied to the area between the first electrode and the second electrode of the memory element, and information to be recorded in the memory array is determined by arrangement with any combination of the memory elements. Consequently, a memory array can be manufactured at low costs using simpler processes such as application than the mask ROM method, and pieces of unique information different each time can be recorded in the memory array.

As exemplified in FIG. 2, the structure of the memory element used for the memory array 200 according to the first embodiment is what is called a bottom gate structure, in which the third electrode 2 is arranged below the semiconductor layer 4 (the substrate 1 side), and the first electrode 5 and the second electrode 6 are arranged on the same plane as the semiconductor layer 4. However, the structure of the memory element that can be used for the memory array 200 according to the first embodiment is not limited to this example and may be what is called a top gate structure, in which the third electrode 2 is arranged above the semiconductor layer 4 (a side opposite the substrate 1), and the first electrode 5 and the second electrode 6 are arranged on the same plane as the semiconductor layer 4, for example.

Second Embodiment

The following describes a memory array according to a second embodiment of the present invention. In the memory array according to the second embodiment, the applied layer is formed of a semiconductor material applied to the area between the first electrode and the second electrode and is a first semiconductor layer or a second semiconductor layer, the first and the second semiconductor layers being different from each other in electrical characteristics. The memory elements are classified into two kinds of memory elements different from each other in electrical characteristics between the first electrode and the second electrode depending on which of the first semiconductor layer and the second semiconductor layer is included therein. Out of the two kinds of memory elements, one kind of memory element is a memory element having the first semiconductor layer, whereas the other kind of memory element is a memory element having the second semiconductor layer, for example. The one kind of memory element and the other kind of memory element record respective pieces of information different from each other by the difference in electrical characteristics of the first semiconductor layer and the second semiconductor layer.

Figure 4:
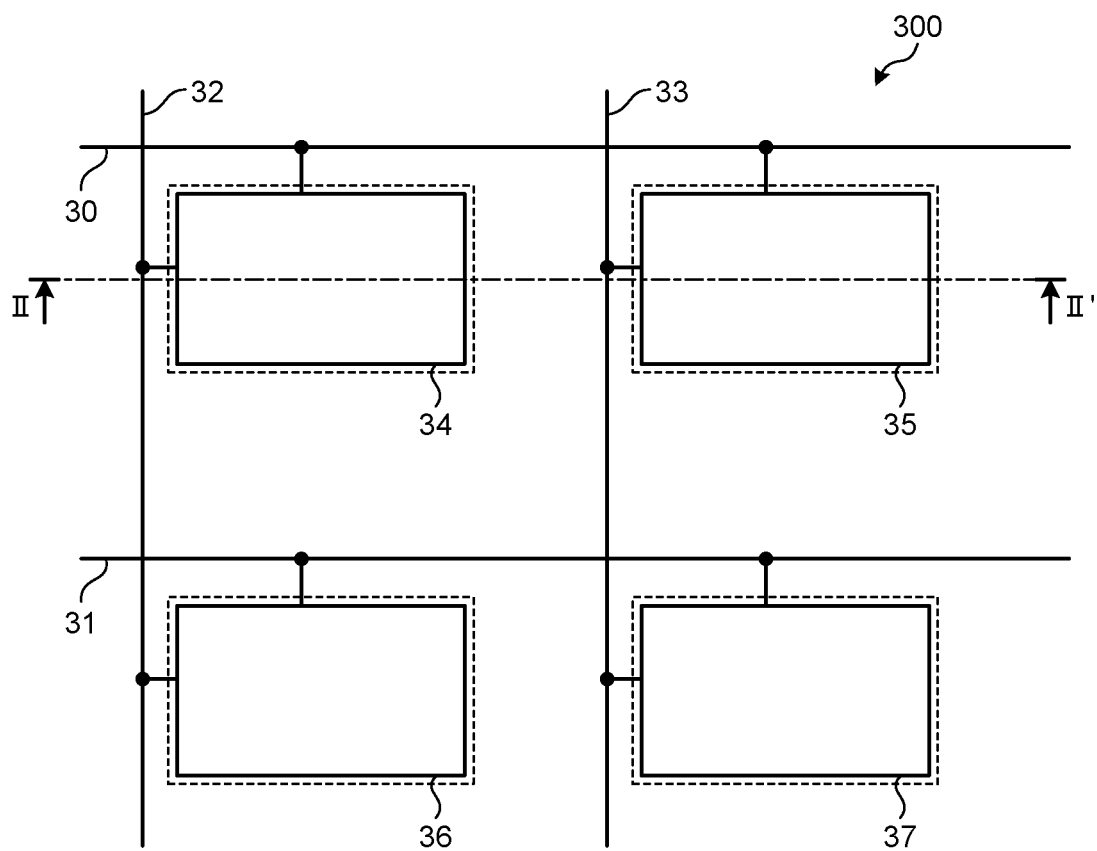
FIG. 4 is a schematic diagram of a configuration example of a memory array according to a second embodiment of the present invention.

FIG. 4 is a schematic diagram of a configuration example of the memory array according to the second embodiment of the present invention. As illustrated in FIG. 4, this memory array 300 according to the second embodiment has two word lines 30 and 31, two bit lines 32 and 33, and four memory elements 34, 35, 36, and 37 on a substrate (not illustrated). The word lines 30 and 31 are examples of the at least one second wire. The bit lines 32 and 33 are examples of the first wires. The memory elements 34, 35, 36, and 37 are examples of the memory elements provided in correspondence with the respective intersections of the first wires and the second wire.

As illustrated in FIG. 4, the word line 30 and the word line 31 are arranged spaced apart from each other with a certain direction as being long. The bit line 32 and the bit line 33 are arranged spaced apart from each other with a direction crossing the word line 30 and the word line 31 as being long. The word lines 30 and 31 and the bit lines 32 and 33 are arranged crossing each other insulated from each other. The memory element 34, the memory element 35, the memory element 36, and the memory element 37 are arranged in respective four areas (areas surrounded by the broken lines in FIG. 4) set by respective crossing between the word lines 30 and 31 and the bit lines 32 and 33.

Although FIG. 4 exemplifies the memory array 300 for 4 bits in order to simplify the description, naturally the memory array 300 according to the second embodiment is not limited to one for 4 bits and may be one for 2 bits or more.

Figure 5:
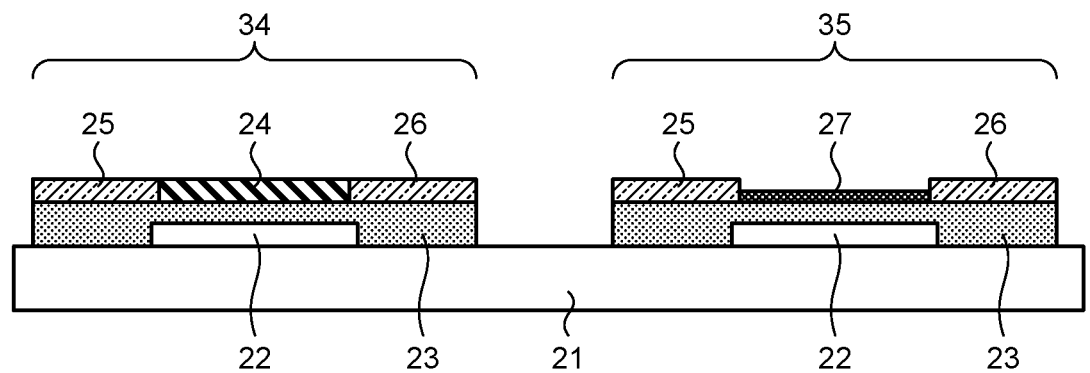
FIG. 5 is a schematic sectional view along the II-II' line of the memory array illustrated in FIG. 4.

FIG. 5 is a schematic sectional view along the II-II' line of the memory array illustrated in FIG. 4. FIG. 5 illustrates a configuration example of two kinds of memory elements included in the memory array 300 (refer to FIG. 4) according to the second embodiment.

As illustrated in FIG. 5, the memory element 34 and the memory element 35 as examples of the two kinds of memory elements are formed on a substrate 21. The memory element 34 and the memory element 35 each have a first electrode 25, a second electrode 26, an insulating layer 23, and a third electrode 22 on the substrate 21. The third electrode 22 is electrically insulated from the first electrode 25 and the second electrode 26 by the insulating layer 23. The first electrode 25 and the second electrode 26 are arranged spaced apart from each other on the insulating layer 23, for example.

In the second embodiment, the memory element 34 and the memory element 35 are examples of the two kinds of memory elements different from each other in electrical characteristics between the first electrode 25 and the second electrode 26. As illustrated in FIG. 5, out of these two kinds of memory elements, one memory element 34 further has a semiconductor layer 24 in an area between the first electrode 25 and the second electrode 26. The other memory element 35 further has a semiconductor layer 27 in the area between the first electrode 25 and the second electrode 26. The semiconductor layer 24 and the semiconductor layer 27 are different from each other in electrical characteristics. Out of the semiconductor layer 24 and the semiconductor layer 27, one is the first semiconductor layer, whereas the other is the second semiconductor layer. The memory element 34 and the memory element 35 have either the first semiconductor layer or the second semiconductor layer. With this configuration, respective pieces of information to be recorded in the memory element 34 and the memory element 35 such as "0" or "1" are determined.

In other words, out of the two kinds of memory elements, when the memory element having the first semiconductor layer is defined as Memory Element (a), whereas the memory element having the second semiconductor layer is defined as Memory Element (b), the first semiconductor layer and the second semiconductor layer in the second embodiment are different from each other in electrical characteristics, and Memory Element (a) and Memory Element (b) record respective pieces of information different from each other by the difference in electrical characteristics of the first semiconductor layer and the second semiconductor layer.

The "different in electrical characteristics" means that when Memory Elements (a) and (b) are selected, that is, when a certain voltage is applied to the respective third electrodes 22 of Memory Elements (a) and (b), Memory Elements (a) and (b) are different from each other in a current value passing between the first electrode 25 and the second electrode 26. By such a difference in the current value, a state of "0" and a state of "1" can be discriminated from each other in Memory Element (a) and Memory Element (b). To sufficiently perform this discrimination, as to the current value passing between the first electrode 25 and the second electrode 26 of a memory element recording "1" and the current value passing between the first electrode 25 and the second electrode 26 of a memory element recording "0," one is preferably 100 times or larger and more preferably 1,000 times or more larger than the other.

Figure 6:
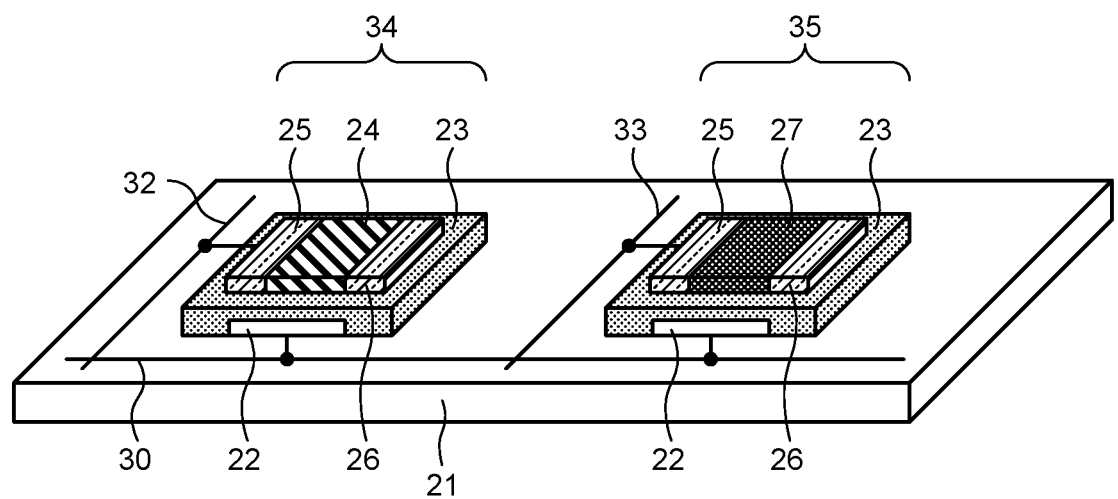
FIG. 6 is a perspective view with the surrounding part of two kinds of memory elements included in the memory array illustrated in FIG. 4 extracted.

FIG. 6 is a perspective view with the surrounding part of the two kinds of memory elements included in the memory array illustrated in FIG. 4 extracted. FIG. 6 exemplifies the memory element 34 and the memory element 35 as these two kinds of memory elements. It should be noted that although FIG. 4 illustrates the word line 30 on the drawing's upper side (far side) of the memory elements 34 and 35, FIG. 6 illustrates the word line 30 on the near side of the memory elements 34 and 35 for easy understanding.

As illustrated in FIG. 6, in each of the memory element 34 and the memory element 35, the third electrode 22 is a gate electrode, for example, and is electrically connected to the word line 30 via a wire. The first electrode 25 is a drain electrode, for example. The first electrode 25 of the memory element 34 is electrically connected to the bit line 32 via a wire. The first electrode 25 of the memory element 35 is electrically connected to the bit line 33 via a wire. The second electrode 26 is a source electrode, for example. Although not illustrated in particular, the second electrode 26 of each of the memory elements 34 and 35 is connected to a reference potential line via a wire.

The semiconductor layers 24 and 27 are formed of semiconductor materials applied to the area between the first electrode 25 and the second electrode 26 by desired application and are layers different from each other in electrical characteristics. In FIG. 6, the semiconductor layer 24 is formed in the area between the first electrode 25 and the second electrode 26 of the one memory element 34 out of the two kinds of memory elements, whereas the semiconductor layer 27 is formed in the area between the first electrode 25 and the second electrode 26 of the other memory element 35. By the difference in electrical characteristics of these semiconductor layers 24 and 27, the memory elements 34 and 35 are different from each other in electrical characteristics between the first electrode 25 and the second electrode 26.

The residual memory elements 36 and 37 out of the four memory elements 34, 35, 36, and 37 included in the memory array 300 illustrated in FIG. 4 have the same structure as that of either of the two kinds of memory elements 34 and 35 illustrated in FIGS. 5 and 6. In each of the memory element 36 and the memory element 37, the third electrode is electrically connected to the word line 31 via a wire, for example. The first electrode of the memory element 36 is electrically connected to the bit line 32 via a wire. The first electrode of the memory element 37 is electrically connected to the bit line 33 via a wire. The second electrode of each of the memory elements 36 and 37 is connected to the reference potential line via a wire.

In the memory array 300, information to be recorded is determined by arrangement with any combination of the two kinds of memory elements different from each other in electrical characteristics, that is, Memory Element (a) and Memory Element (b). This determined information can be recorded in the memory array 300 as unique information such as an ID number unique to the memory array 300. In the arrangement of the four memory elements 34, 35, 36, and 37 [memory element 34, memory element 35, memory element 36, memory element 37], when the memory elements 34 and 37 are each one kind of Memory Element (a) and the memory elements 35 and 36 are each the other kind of Memory Element (b), information of [1, 0, 0, 1] or [0, 1, 1, 0] is recorded in the memory array 300 as the unique information, for example. When the memory element 34 is one kind of Memory Element (a) and the memory elements 35, 36, and 37 are each the other kind of Memory Element (b), information of [1, 0, 0, 0] or [0, 1, 1, 1] is recorded in the memory array 300 as the unique information.

In the second embodiment, binary information (information of "0" or "1," for example) is recorded in each of the memory elements by the difference in the electrical characteristics of the semiconductor layer formed of the semiconductor material applied to the area between the first electrode and the second electrode of the memory element, and information to be recorded in the memory array is determined by arrangement with any combination of the memory elements. Consequently, a memory array can be manufactured at low costs using simpler processes such as application than the mask ROM method, and pieces of unique information different each time can be recorded in the memory array.

As exemplified in FIG. 5, the structure of the memory element used for the memory array 300 according to the second embodiment is what is called a bottom gate structure. However, the structure of the memory element that can be used for the memory array 300 according to the second embodiment is not limited to this example and may be what is called a top gate structure.

That the semiconductor layer 24 and the semiconductor layer 27 are different from each other in electrical characteristics is preferably caused by the difference in configuration between them. Examples of the difference in configuration between the first semiconductor layer and the second semiconductor layer in the second embodiment include a difference in the film thickness of the semiconductor layers and a difference in the semiconductor material contained in the semiconductor layers. In addition, the difference in configuration between the first semiconductor layer and the second semiconductor layer is not limited to these examples so long as it makes the respective electrical characteristics of the first semiconductor layer and the second semiconductor layer sufficiently different from each other.

Examples of the difference in the semiconductor material contained in the semiconductor layers, when the second semiconductor layer contains a semiconductor material different from that of the first semiconductor layer, include a case in which the semiconductor material contained in the second semiconductor layer is a material higher in mobility than the semiconductor material contained in the first semiconductor layer and a case in which the first semiconductor layer contains an enhancement type semiconductor material, whereas the second semiconductor layer contains a depression type semiconductor material.

Examples of the difference in the film thickness of the semiconductor layers include a case in which the film thickness of the second semiconductor layer is larger than the film thickness of the first semiconductor layer. With this configuration, the second semiconductor layer and the first semiconductor layer are different from each other in resistivity. Consequently, when a certain voltage is applied to the respective third electrodes of the memory elements, the memory elements can be made different from each other in a current value passing between the first electrode and the second electrode.

Figure 7:
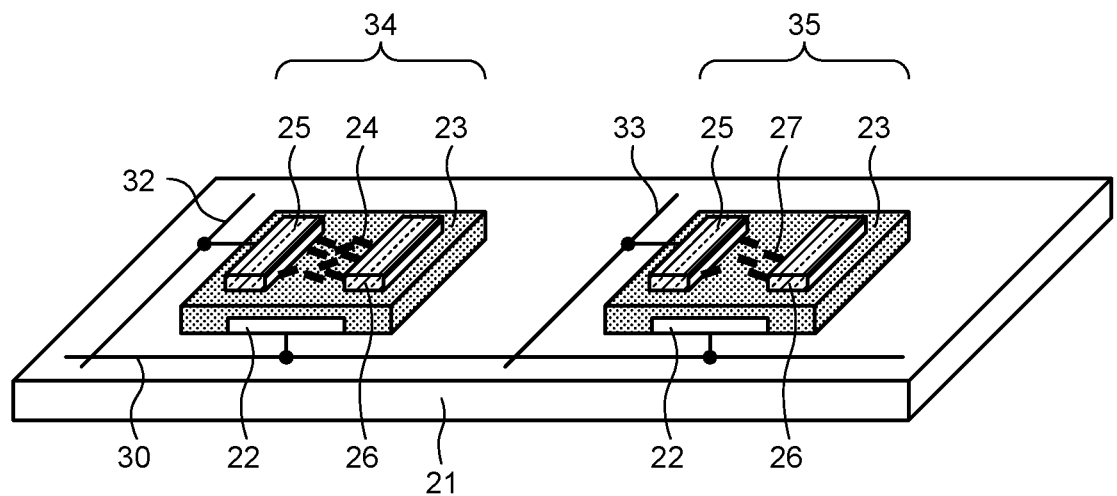
FIG. 7 is a diagram of a modification of the two kinds of memory elements included in the memory array according to the second embodiment of the present invention.

When the first semiconductor layer and the second semiconductor layer each contain carbon nanotubes (CNT) as the semiconductor material, a difference in the concentration of the contained CNT can make the respective electrical characteristics of the first semiconductor layer and the second semiconductor layer sufficiently different from each other. FIG. 7 is a diagram of a modification of the two kinds of memory elements included in the memory array according to the second embodiment of the present invention. FIG. 7 illustrates the memory elements 34 and 35 when the semiconductor material contained in each of the semiconductor layers 24 and 27 illustrated in FIG. 6 is CNT. In addition, the same components as those illustrated in FIG. 6 are denoted by the same symbols. As illustrated in FIG. 7, the concentration of CNT of the semiconductor layer 24 of the memory element 34 (the second semiconductor layer) is higher than the concentration of CNT of the semiconductor layer 27 of the memory element 35 (the first semiconductor layer), for example. In this case, the memory element 34 having the semiconductor layer 24 higher in the concentration of CNT makes it easier for the current to pass between the first electrode 25 and the second electrode 26 than the other memory element 35.

The concentration of CNT refers to the number of CNT present in any 1 μm² area in the semiconductor layer. Examples of a method for measuring the number of CNT include a method that selects any 1 μm² area out of an image of the semiconductor layer obtained by an atomic force microscope, a scanning electron microscope, a transmission electron microscope, or the like and counts the number of all CNT contained in the area.

Third Embodiment

The following describes a memory array according to a third embodiment of the present invention. In the memory array according to the third embodiment, the memory elements each have a semiconductor layer formed of a semiconductor material applied so as to be in contact with the insulating layer in the area between the first electrode and the second electrode. The applied layer is formed of an insulating material applied so as to be in contact with the semiconductor layer from a side opposite the insulating layer in the area between the first electrode and the second electrode and is a first insulating layer or a second insulating layer that changes the electrical characteristics of the semiconductor layer into electrical characteristics different from each other. The memory elements are classified into two kinds of memory elements different from each other in electrical characteristics between the first electrode and the second electrode depending on which of the first insulating layer and the second insulating layer is included therein. Out of the two kinds of memory elements, one kind of memory element is a memory element having the first insulating layer, whereas the other kind of memory element is a memory element having the second insulating layer, for example. The one kind of memory element and the other kind of memory element record respective pieces of information different from each other by the difference in the electrical characteristics of the semiconductor layer by the first insulating layer and the second insulating layer.

Figure 8:
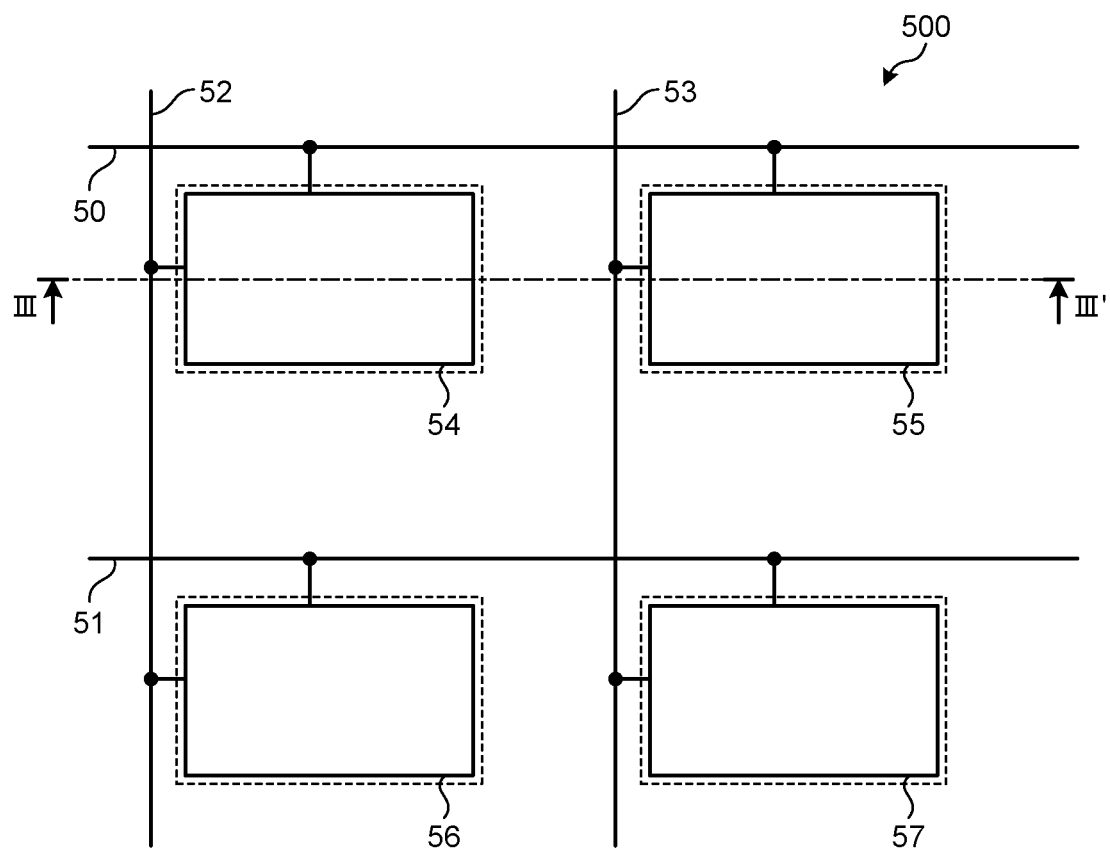
FIG. 8 is a schematic diagram of a configuration example of a memory array according to a third embodiment of the present invention.

FIG. 8 is a schematic diagram of a configuration example of the memory array according to the third embodiment of the present invention. As illustrated in FIG. 8, this memory array 500 according to the third embodiment has two word lines 50 and 51, two bit lines 52 and 53, and four memory elements 54, 55, 56, and 57 on a substrate (not illustrated). The word lines 50 and 51 are examples of the at least one second wire. The bit lines 52 and 53 are examples of the first wires. The memory elements 54, 55, 56, and 57 are examples of the memory elements provided in correspondence with the respective intersections of the first wires and the second wire.

As illustrated in FIG. 8, the word line 50 and the word line 51 are arranged spaced apart from each other with a certain direction as being long. The bit line 52 and the bit line 53 are arranged spaced apart from each other with a direction crossing the word line 50 and the word line 51 as being long. The word lines 50 and 51 and the bit lines 52 and 53 are arranged crossing each other insulated from each other. The memory element 54, the memory element 55, the memory element 56, and the memory element 57 are arranged in respective four areas (areas surrounded by the broken lines in FIG. 8) set by respective crossings between the word lines 50 and 51 and the bit lines 52 and 53.

Although FIG. 8 exemplifies the memory array 500 for 4 bits in order to simplify the description, naturally the memory array 500 according to the third embodiment is not limited to one for 4 bits and may be one for 2 bits or more.

Figure 9A:
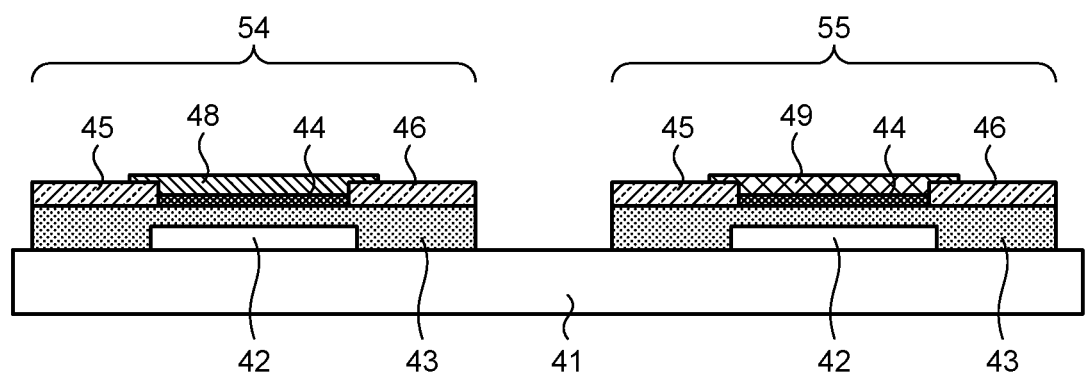
FIG. 9A is a schematic sectional view along the III-III' line of the memory array illustrated in FIG. 8.

FIG. 9A is a schematic sectional view along the III-III' line of the memory array illustrated in FIG. 8. FIG. 9A illustrates a configuration example of two kinds of memory elements included in the memory array 500 (refer to FIG. 8) according to the third embodiment.

As illustrated in FIG. 9A, the memory element 54 and the memory element 55 as examples of the two kinds of memory elements are formed on a substrate 41. The memory element 54 and the memory element 55 each have a first electrode 45, a second electrode 46, an insulating layer 43, and a third electrode 42 on the substrate 41. The third electrode 42 is electrically insulated from the first electrode 45 and the second electrode 46 by the insulating layer 43. The first electrode 45 and the second electrode 46 are arranged spaced apart from each other on the insulating layer 43, for example. The memory element 54 and the memory element 55 each have a semiconductor layer 44 in an area between the first electrode 45 and the second electrode 46.

In the third embodiment, the memory element 54 and the memory element 55 are examples of the two kinds of memory elements different from each other in electrical characteristics between the first electrode 45 and the second electrode 46. As illustrated in FIG. 9A, out of these two kinds of memory elements, one memory element 54 further has a first insulating layer 48 in an area between the first electrode 45 and the second electrode 46. The other memory element 55 further has a second insulating layer 49 in the area between the first electrode 45 and the second electrode 46.

Figure 9B:
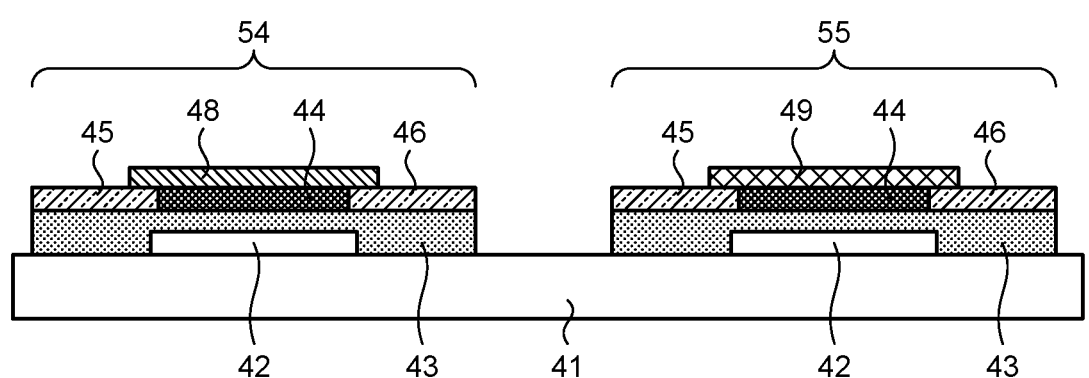
FIG. 9B is a schematic sectional view along the III-III' line of a modification of the memory array illustrated in FIG. 8.

FIG. 9B is a schematic sectional view along the line of a modification of the memory array illustrated in FIG. 8. In each of the memory element 54 and the memory element 55 illustrated in FIG. 9B, the thickness of the semiconductor layer 44 is comparable to those of the first electrode 45 and the second electrode 46. In this case, the memory element 54 has the first Insulating layer 48 in the area between the first electrode 45 and the second electrode 46, the area facing the semiconductor layer 44 interposed between these electrodes from its thickness direction (above, for example) (specifically, the area not being interposed between the first electrode 45 and the second electrode 46). The memory element 55 has the second insulating layer 49 in an area similar to that of this memory element 54. The other components in FIG. 9B are the same as those illustrated in FIG. 9A.

The first insulating layer 48 and the second insulating layer 49 are formed of respective insulating materials applied so as to be in contact with the semiconductor layer 44 from the side opposite the insulating layer 43 by desired application. The first insulating layer 48 and the second insulating layer 49 contain respective different materials. When brought into contact with the semiconductor layer 44, the first insulating layer 48 and the second insulating layer 49 change the electrical characteristics of the semiconductor layer 44 being in contact therewith. With this change, the electrical characteristics of the semiconductor layer 44 on the first insulating layer 48 side and the electrical characteristics of the semiconductor layer 44 on the second insulating layer 49 side are made different from each other. The following can be considered as the reason for that.

When being in contact with the air, the semiconductor layer 44 is influenced by oxygen and water in an atmosphere being in contact therewith. Consequently, the electrical characteristics of the semiconductor layer 44 may change. However, the first insulating layer 48 or the second insulating layer 49 covers the semiconductor layer 44 in contact therewith (refer to FIGS. 9A and 9B), thereby eliminating such influence on the semiconductor layer 44 by the external environment.

It is considered that the material contained in the first insulating layer 48 exerts some influence on the electrical characteristics of the semiconductor layer 44 being in contact therewith and that the material contained in the second insulating layer 49 exerts some influence on the electrical characteristics of the semiconductor layer 44 being in contact therewith. As illustrated in FIGS. 9A and 9B, when the first insulating layer 48 is in contact with the semiconductor layer 44, with the influence on the semiconductor layer 44 by the external environment eliminated, a current value passing between the first electrode 45 and the second electrode 46 via the semiconductor layer 44 decreases or increases depending on the kind of the material contained in this first insulating layer 48, for example. This phenomenon can also occur when the second insulating layer 49 is in contact with the semiconductor layer 44. When the respective materials contained in the first insulating layer 48 and the second insulating layer 49 are different from each other, the degree of change in the electrical characteristics of the semiconductor layer 44 of the memory element 54 and the degree of change in the electrical characteristics of the semiconductor layer 44 of the memory element 55 are different from each other. Consequently, the electrical characteristics of the semiconductor layer 44 of the memory element 54 and the electrical characteristics of the semiconductor layer 44 of the memory element 55 are made different from each other.

By the difference in the electrical characteristics of the respective semiconductor layers 44 by the first insulating layer 48 and the second insulating layer 49, respective pieces of information to be recorded in the memory element 54 and the memory element 55 such as "0" or "1" are determined.

In other words, out of the two kinds of memory elements in the third embodiment, when the memory element having the first insulating layer 48 such as the memory element 54 is defined as Memory Element (c), whereas the memory element having the second insulating layer 49 such as the memory element 55 is defined as Memory Element (d), and when the first insulating layer 48 and the second insulating layer 49 have materials different from each other, Memory Element (c) and Memory Element (d) record respective pieces of information different from each other by the difference in the electrical characteristics of the respective semiconductor layers 44 by the first insulating layer 48 and the second insulating layer 49.

The "changes the electrical characteristics of the semiconductor layer" means that when Memory Elements (c) and (d) are selected, that is, when a certain voltage is applied to the respective third electrodes 42 of Memory Elements (c) and (d), Memory Elements (c) and (d) are different from each other in a current value passing between the first electrode 45 and the second electrode 46. By such a difference in the current value, a state of "0" and a state of "1" can be discriminated from each other in Memory Element (c) and Memory Element (d). To sufficiently perform this discrimination, as to the current value passing between the first electrode 45 and the second electrode 46 of a memory element recording "1" and a current value passing between the first electrode 45 and the second electrode 46 of a memory element recording "0," one is preferably 100 times or larger and more preferably 1,000 times or more larger than the other.

The first insulating layer 48 and the second insulating layer 49 may also have a function as protective layers protecting the semiconductor layer 44 from the external environment and the like. The semiconductor layer 44 is protected by either the first insulating layer 48 or the second insulating layer 49, whereby the reliability of the memory elements improves.

Figure 10:
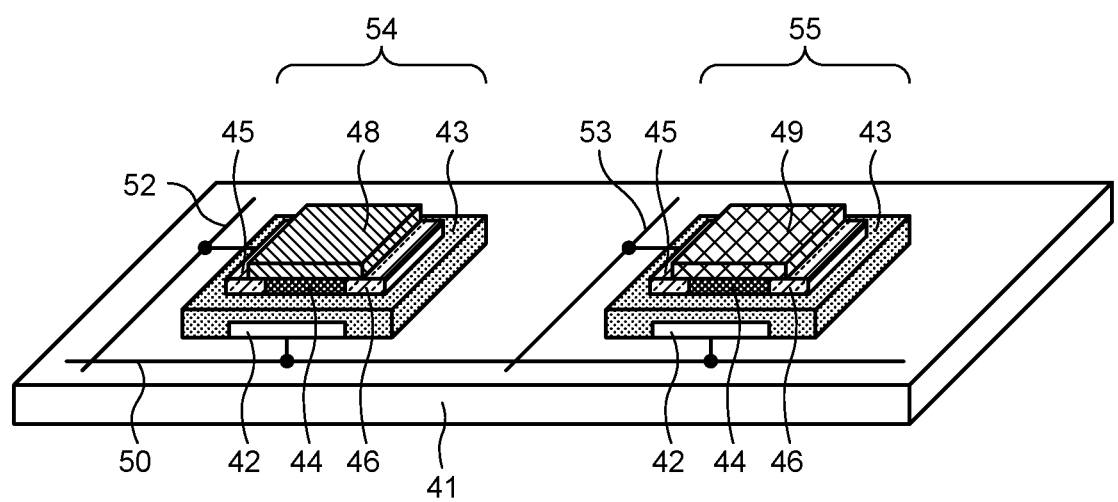
FIG. 10 is a perspective view with the surrounding part of two kinds of memory elements included in the memory array illustrated in FIG. 8 extracted.

FIG. 10 is a perspective view with the surrounding part of the two kinds of memory elements included in the memory array illustrated in FIG. 8 extracted. FIG. 10 exemplifies the memory element 54 and the memory element 55 as these two kinds of memory elements. It should be noted that although FIG. 8 illustrates the word line 50 on the drawing's upper side (far side) of the memory elements 54 and 55, FIG.

10 illustrates the word line 50 on the near side of the memory elements 54 and 55 for easy understanding.

As illustrated in FIG. 10, in each of the memory element 54 and the memory element 55, the third electrode 42 is a gate electrode, for example, and is electrically connected to the word line 50 via a wire. The first electrode 45 is a drain electrode, for example. The first electrode 45 of the memory element 54 is electrically connected to the bit line 52 via a wire. The first electrode 45 of the memory element 55 is electrically connected to the bit line 53 via a wire. The second electrode 46 is a source electrode, for example. Although not illustrated in particular, the second electrode 46 of each of the memory elements 54 and 55 is connected to a reference potential line via a wire. The semiconductor layer 44 is formed in the area between the first electrode 45 and the second electrode 46 on each insulating layer 43 of the memory element 54 and the memory element 55.

As illustrated in FIG. 10, the first insulating layer 48 in the memory element 54 is in contact with the semiconductor layer 44 from a side opposite the insulating layer 43 (the upper face side, for example) and covers this semiconductor layer 44. With this configuration, the first insulating layer 48 holds this semiconductor layer 44 in cooperation with the insulating layer 43 in the film thickness direction. Similarly, the second insulating layer 49 in the memory element 55 is in contact with the semiconductor layer 44 from a side opposite the insulating layer 43 and covers this semiconductor layer 44 and, with this configuration, holds this semiconductor layer 44 in cooperation with the insulating layer 43 in the film thickness direction.

The residual memory elements 56 and 57 out of the four memory elements 54, 55, 56, and 57 included in the memory array 500 illustrated in FIG. 8 have the same structure as that of either of the two kinds of memory elements 54 and 55 illustrated in FIGS. 9A, 9B, and 10. In each of the memory element 56 and the memory element 57, the third electrode is electrically connected to the word line 51 via a wire, for example. The first electrode of the memory element 56 is electrically connected to the bit line 52 via a wire. The first electrode of the memory element 57 is electrically connected to the bit line 53 via a wire. The second electrode of each of the memory elements 56 and 57 is connected to the reference potential line via a wire.

In the memory array 500, information to be recorded is determined by arrangement with any combination of the two kinds of memory elements different from each other in electrical characteristics, that is, Memory Element (c) and Memory Element (d). This determined information can be recorded in the memory array 500 as unique information such as an ID number unique to the memory array 500. In the arrangement of the four memory elements 54, 55, 56, and 57 [memory element 54, memory element 55, memory element 56, memory element 57], when the memory elements 54 and 55 are each one kind of Memory Element (c) and the memory elements 56 and 57 are each the other kinds of Memory Element (d), information of [1, 1, 0, 0] or [0, 0, 1, 1] is recorded in the memory array 500 as the unique information, for example. When the memory elements 54, 55, and 57 are each one kind of Memory Element (c) and the memory element 56 is the other kind of Memory Element (d), information of [1, 1, 0, 1] or [0, 0, 1, 0] is recorded in the memory array 500 as the unique information.

In the third embodiment, the semiconductor layer is formed in the area between the first electrode and the second electrode of the memory element, the first insulating layer or the second insulating layer formed of the insulating material applied to the area between the first electrode and the second electrode so as to be in contact with this semiconductor layer is further formed, binary information (information of "0" or "1," for example) is recorded in each of the memory elements by the difference in the electrical characteristics of the semiconductor layer by the first insulating layer and the second insulating layer, and information to be recorded in the memory array is determined by arrangement with any combination of the memory elements. Consequently, a memory array can be manufactured at low costs using simpler processes such as application than the mask ROM method, and pieces of unique information different each time can be recorded in the memory array.

As exemplified in FIGS. 9A and 9B, the structure of the memory element used for the memory array 500 according to the third embodiment is what is called a bottom gate structure. However, the structure of the memory element that can be used for the memory array 500 according to the third embodiment is not limited to this example and may be what is called a top gate structure.

The following describes components common to the first to the third embodiments in detail. In the description of the substrate, the respective substrates in the first to the third embodiments will be collectively referred to as "the substrate" as appropriate. In the description of the electrodes and wires, the first electrode, the second electrode, and the third electrode in the first to the third embodiments will be collectively referred to as "the electrode" as appropriate. The various kinds of wires on the substrate including the word lines and the bit lines in the first to the third embodiments will be collectively referred to as "the wire" as appropriate. In the description of the semiconductor, the semiconductor layer in the first and the third embodiments and the first semiconductor layer and the second semiconductor layer in the second embodiment will be collectively referred to as "the semiconductor layer" as appropriate.

(Substrate)

The substrate may be formed of any material so long as at least the surface on which the electrodes are arranged is electrically insulating. Preferred examples of the substrate include ones formed of inorganic materials such as silicon wafers, glass, sapphire, and alumina sintered bodies and organic materials such as polyimide, polyvinyl alcohol, polyvinyl chloride, polyethylene terephthalate, polyvinylidene fluoride, polysiloxane, polyvinylphenol (PVP), polyester, polycarbonate, polysulfone, polyethersulfone, polyethylene, polyphenylene sulfide, and poly-p-xylene.

The substrate is not limited to the above and may be formed of a plurality of materials stacked such as a PVP film formed on a silicon wafer and a polysiloxane film formed on polyethylene terephthalate.

(Electrode and Wire)

A material for use in the electrode and the wire may be any material so long as it is an electric conductive material that can be generally used as electrodes. Examples of such an electric conductive material include electric conductive metal oxides such as tin oxide, indium oxide, and indium tin oxide (ITO). Examples thereof include metals such as platinum, gold, silver, copper, iron, tin, zinc, aluminum, indium, chromium, lithium, sodium, potassium, cesium, calcium, magnesium, palladium, molybdenum, amorphous silicon, and polysilicon, alloys of a plurality of metals selected from these metals, and inorganic electric conductive materials such as copper iodide and copper sulfide. Examples thereof include polythiophene, polypyrrole, polyaniline, a complex of polyethylenedioxythiophene and polystyrene sulfonic acid, and electric conductive polymers with conductivity improved by doping iodide or the like. Further examples thereof include carbon materials and materials containing an organic component and a conductor. However, the electric conductive material of the electrode and the wire is not limited to these materials. These electric conductive materials may be used singly, or a plurality of materials may be used in a stacked or mixed manner.

The width and thickness of the electrode and the spacing between the electrodes (the spacing between the first electrode and the second electrode, for example) have any values. Specifically, the width of the electrodes is preferably 5 µm or more and 1 mm or less. The thickness of the electrodes is preferably 0.01 µm or more and 100 µm or less. The spacing between the first electrode and the second electrode is preferably 1 µm or more and 500 µm or less. However, these dimensions are not limited to the above.

Further, the width and the thickness of the wire also have any values. Specifically, the thickness of the wire is preferably 0.01 µm or more and 100 µm or less. The width of the wire is preferably 5 µm or more and 500 µm or less. However, these dimensions are not limited to the above.

Examples of a method for forming the electrode and the wire include methods for forming them using known techniques such as resistance heating deposition, electron beam techniques, sputtering, plating, chemical vapor deposition (CVD), ion plating coating, ink jetting, and printing. Examples thereof include applying a paste of the material containing an organic component and a conductor described above to an insulating substrate by a known technique such as spin coating, blade coating, slit die coating, screen printing, bar coating, casting, printing and transferring, or immersing and pulling up and performing drying using an oven, a hot plate, infrared rays, or the like. However, the method for forming the electrode and the wire is not limited to a particular method so long as it is a method that can establish continuity.

Examples of a method for patterning the electrode and the wire include, but are not limited to, a method that patterns an electrode thin film manufactured by the above methods into a desired shape by known photolithography or the like. Examples thereof include a method that performs patterning via a mask with a desired shape when the electric conductive material of the electrode and the wire is deposited or sputtered. Examples thereof include a method that directly forms patterns using ink jetting or printing.

An electrode pattern and a wire pattern may be processed and formed separately, or at least two of a plurality of electrode patterns and wire patterns may be processed and formed by one operation. In view of a reduction in manufacturing processes and the easiness of connection and accuracy of patterns, the electrode pattern and the wire pattern are preferably processed by one operation.

(Insulating Layer)

Examples of an insulating material for use in the insulating layer include, but are not limited to, inorganic materials such as silicon oxide and alumina; organic polymer materials such as polyimide, polyvinyl alcohol, polyvinyl chloride, polyethylene terephthalate, polyvinylidene fluoride, polysiloxane, and polyvinyl phenol; and mixtures of inorganic material powder and organic materials. Among these, the insulating material for use in the insulating layer preferably contains an organic compound containing a bond between a silicon atom and a carbon atom. In addition, it further preferably contains a metal compound containing a bond between a metal atom and an oxygen atom.

The insulating layer may be formed of a single layer or formed of a plurality of layers. One insulating layer may be formed of a plurality of insulating materials, or a plurality of insulting layers may be formed by stacking a plurality of insulating materials.

Examples of a method for forming the insulating layer include known techniques such as resistance heating deposition, electron beam techniques, sputtering, plating, CVD, ion plating coating, ink jetting, printing, spin coating, blade coating, slit die coating, screen printing, bar coating, casting, printing and transferring, and immersing and pulling up. However, the method for forming the insulating layer is not limited to these examples.

(Semiconductor Layer)

A semiconductor material used for the semiconductor layer is not limited to a particular semiconductor material so long as it has semiconductor properties; examples thereof include inorganic semiconductors such as silicon semiconductors and oxide semiconductors, organic semiconductors, and carbon semiconductors such as CNT, graphene, and fullerenes.

Examples of the organic semiconductors include polythiophenes, polypyrroles, poly(p-phenylenevinylene)s such as poly(p-phenylenevinylene), polyanilines, polyacetylenes, polydiacetylenes, polycarbazoles, polyfurans, polyheteroaryls, condensed polycyclic low molecular weight compound semiconductors, low molecular weight compound semiconductors having heteroaromatic rings. Examples of polythiophenes include poly-3-hexylthiophene and polybenzothiophene. Examples of polyfurans include polyfuran and polybenzofuran. Examples of polyheteroaryls include compounds with a nitrogen-containing aromatic ring such as pyridine, quinoline, phenanthroline, oxazole, or oxadiazole as a structural unit. Examples of condensed polycyclic low molecular weight compound semiconductors include anthracene, pyrene, naphthacene, pentacene, hexacene, and rubrene. Examples of low molecular weight compound semiconductors having heteroaromatic rings include furan, thiophene, benzothiophene, dibenzofuran, pyridine, quinoline, phenanthroline, oxazole, and oxadiazole.

Among these compounds, in view of the capability of forming the semiconductor layer by application, the semiconductor layer preferably contains one or more selected from the group consisting of CNT, graphene, fullerenes, and organic semiconductors as the semiconductor material. In view of the capability of being formed at low temperatures of 200° C. or less and being high in semiconductor characteristics, the semiconductor layer more preferably contains CNT as the semiconductor material.

Among CNT, particularly preferred is a CNT composite in which a conjugated polymer is attached to at least part of surfaces of CNT. This is because CNT can be uniformly dispersed in a solution for forming the semiconductor layer without impairing high electrical characteristics of ONT. The solution in which CNT is uniformly dispersed is used, whereby a film in which CNT is uniformly dispersed can be formed as the semiconductor layer by application such as ink jetting.

"The state in which a conjugated polymer is attached to at least part of surfaces of CNT" means a state in which the conjugated polymer covers part or the whole of surfaces of CNT. It is estimated that the reason why the conjugated polymer can cover CNT is because interaction occurs by the overlapping of π electron clouds originating from conjugated structures of the two. Whether CNT is covered with the conjugated polymer can be determined by the reflected color of the covered CNT approaching the color of the conjugated polymer from the color of CNT not covered. The presence of an attached substance and the weight ratio of the attached substance to CNT can be quantitatively identified by elemental analysis such as X-ray photoelectron spectroscopy (XPS).

Examples of a method for attaching the conjugated polymer to CNT include the following four methods. The first method is a method that adds CNT to a melted conjugated polymer to mix them together. The second method is a method that dissolves the conjugated polymer in a solvent and adds CNT thereto to mix them together. The third method is a method that preliminarily disperses CNT in a solvent through ultrasonic waves or the like and adds the conjugated polymer thereto to mix them together. The fourth method is a method that puts the conjugated polymer and CNT in a solvent and irradiates the mixed system with ultrasonic waves to mix them together. The present invention may use any method and combine a plurality of methods out of these methods.

Examples of the conjugated polymer include, but are not limited to, polythiophene-based polymers, polypyrrole-based polymers, polyaniline-based polymers, polyacetylene-based polymers, poly-p-phenylene-based polymers, and poly-p-phenylenevinylene-based polymers. For the polymers, ones with single monomer units arranged are preferably used, and ones with different monomer units block copolymerized or randomly copolymerized are also used. Graft copolymerized ones can also be used.

In the second embodiment of the present invention, organic semiconductor polymers such as polythiophenes, polypyrroles, and polyanilines are preferably used as the semiconductor material of the first semiconductor layer, whereas CNT is preferably used as the semiconductor material of the second semiconductor layer, for example. By doing so, when a certain voltage is applied to the respective third electrodes of Memory Element (a) and Memory Element (b), Memory Element (a) and Memory Element (b) can be made different from each other in a current value passing between the first electrode and the second electrode.

(First Insulating Layer and Second Insulating Layer)

The following describes the first insulating layer and the second insulating layer in the third embodiment of the present invention (refer to the first insulating layer 48 and the second insulating layer 49 exemplified in FIGS. 9A, 9B, and 10). An insulating material for use in the first insulating layer and the second insulating layer is not limited to a particular material so long as it can change the electrical characteristics of the semiconductor layer. Formation of the first insulating layer and the second insulating layer can also protect the semiconductor layer from the external environment such as oxygen or water.

Examples of the insulating material for use in the first insulating layer and the second insulating layer include acrylic resins, epoxy resins, novolak resins, phenol resins, polyimide precursor resins, polyimide resins, polysiloxane resins, fluorine-based resins, and polyvinyl acetal resins.

Acrylic resins are resins containing a structure originating from at least an acrylic monomer as a repeating unit. Specific examples of the acrylic monomer include all compounds having a carbon-carbon double bond. Preferred examples of the acrylic monomer include acrylic monomers such as methyl acrylate, acrylic acid, 2-ethylhexyl acrylate, ethyl methacrylate, n-butyl acrylate, i-butyl acrylate, i-propyl acrylate, glycidyl acrylate, N-methoxymethyl acrylamide, N-ethoxymethyl acrylamide, N-n-butoxymethyl acrylamide, N-isobutoxymethyl acrylamide, butoxytriethylene glycol acylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, 1-naphthyl acrylate, 2-naphthyl acrylate, thiophenol acrylate, and benzyl mercaptan acrylate and compounds obtained by replacing acrylate of these monomers with methacrylate. These acrylic monomers may be used singly, or two or more may be used in combination.

Epoxy resins are resins containing a structure having a prepolymer containing two or more epoxy groups in a molecular structure. Examples of the prepolymer include compounds having a biphenyl skeleton and compounds having dicyclopentadiene skeleton. The insulating material for use in the first insulating layer and the second insulating layer may have a curing agent in addition to the epoxy resin. Examples of the curing agent include phenol novolak resins, bisphenol A type novolak resins, amino triazine compounds, naphthol compounds, and diamine compounds. The insulating layer for use in the first insulating layer and the second insulating layer may further have a curing accelerator such as a metal chelate compound. Examples of the metal chelate compound include triphenylphosphine, benzimidazole-based compounds, and tris(2,4-pentanedionato)cobalt.

Polyimide precursor resins refers to resins to be converted into polyimide resins by at least one of thermal and chemical ring-closing reactions. Examples of polyimide precursor resins include polyamide acids, polyamide acid esters, and polyamide acid silyl esters.

Polyimide precursor resins can be synthesized by a polymerization reaction of a diamine compound and an acid dianhydride or its derivative. Examples of the acid dianhydride derivative include tetracarboxylic acid, acid chlorides, and mono, di, tri and tetraesters of tetracarboxylic acid. Specific examples of the esterified structure include structures esterified with a methyl group, an ethyl group, an n-propyl group, an isopropyl group, an n-butyl group, a sec-butyl group, a tert-butyl group, or the like. The method of the polymerization reaction is not limited to a particular method so long as it can manufacture target polyimide precursor resins, and known reaction methods can be used therefor.

Polysiloxane resins are polycondensates of silane compounds. Examples of silane compounds include, but are not limited to, diethoxydimethylsilane, diethoxydiphenylsilane, tetramethoxysilane, tetraethoxysilane, vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, and γ-methacryloxypropyltrimethoxysilane. These silane compounds may be used singly, or two or more may be used in combination.

Examples of fluorine-based resins include, but are not limited to, polyvinylidene fluoride (PVDF), poly(vinylidene fluoride-trifluoroethylene) (PVDF-TrFE), poly(vinylidene fluoride-tetrafluoroethylene) (PVDF-TeFE), poly(vinylidene fluoride-chlorotrifluoroethylene) (PVDF-CTFE), poly(vinylidene fluoride-chlorofluoroethylene) (PVDF-CFE), poly(vinylidene fluoride-trifluoroethylene-chlorofluoroethylene) (PVDF-TrFE-CFE), poly(vinylidene fluoride-trifluoroethylene-chlorotrifluoroethylene) (PVDF-TrFE-CTFE), tetrafluoroethylene, poly(vinylidene fluoride-hexafluoropropylene), polytrichlorofluoroethylene, polychlorotrifluoroethylene, ethylene-chlorotrifluoroethylene copolymer, polyvinyl fluoride, tetrafluoroethylene-perfluorodioxole copolymer, ethylene-tetrafluoroethylene copolymer, perfluoroethylenepropene copolymer, and perfluoroalkoxyalkanes. These fluorine-based resins may be used singly, or two or more may be used in combination.

Polyvinyl acetal resins are resins obtained by acetalizing polyvinyl alcohols. Examples of polyvinyl acetal resins include polyvinyl butyral.

Examples of the other resins include styrene, styrene derivatives such as p-methylstyrene, o-methylstyrene, m-methylstyrene, p-hydroxystyrene, o-hydroxystyrene, m-hydroxystyrene, α-methylstyrene, chloromethylstyrene, and hydroxymethylstyrene, resins containing a structure originating from a vinyl-based monomer such as 1-vinyl-2-pyrrolidone, and resins containing a cyclic hydrocarbon structure such as cycloolefin. The vinyl-based monomer, which is not limited to these monomers, may be used singly, or two or more may be used in combination.

The first insulating layer and the second insulating layer may contain, in addition to the insulating material, inorganic materials such as silicone oxide, alumina, zirconia and nitrogen atom-containing compounds such as amide-based compounds, imide-based compounds, urea-based compounds, amine-based compounds, imine-based compounds, aniline-based compounds, and nitrile-based compounds. The first insulating layer and the second insulating layer contain the compounds and can thereby further change the electrical characteristics of the semiconductor layer such as a threshold voltage and a current value.

Specifically, examples of amide-based compounds include polyamide, formamide, acetamide, poly-N-vinylacetamide, N,N-dimethylformamide, acetanilide, benzanilide, N-methylbenzanilide, sulfonamide, nylon, polyvinylpyrrolidone, N-methylpyrrolidone, polyvinylpolypyrrolidone, β-lactam, γ-lactam, δ-lactam, and ε-caprolactam. Examples of imide-based compounds include polyimide, phthalimide, maleimide, alloxan, and succinimide. Examples of urea-based compounds include uracil, thymine, urea, polyurethane, acetohexamide, allantoin, 2-imidazolidinone, 1,3-dimethyl-2-imidazolidinone, dicyandiamidine, and citrulline. Examples of amine-based compounds include methylamine, dimethylamine, trimethylamine, ethylamine, diethylamine, triethylamine, diisopropylethylamine, cyclohexylamine, methylcylohexylamine, dimethylcyclohexylamine, dicyclohexylamine, dicyclohexylmethylamine, tricyclohexylamine, cyclooctylamine, cyclodecylamine, cyclododecylamine, 1-azabicyclo[2.2.2]octane (quinuclidine), 1,8-diazabicyclo[5.4.0]undec-7-ene (DBU), 1,5-diazabicyclo[4.3.0]non-5-ene (DBN), 1,5,7-triazabicyclo[4.4.0]dec-5-ene (TBD), 7-methyl-1,5,7-triazabicyclo[4.4.0]dec-5-ene (MTBD), poly(melamine-co-formaldehyde), tetramethylethylenediamine, piperidine, julolidine, and phenylalanine. Examples of imine-based compounds include imidazole, pyrimidine, and poly(melamine-co-formaldehyde) methylaminobenzoic acid. Examples of aniline-based compounds include aniline, diphenylamine, and triphenylamine. Examples of nitrile-based compounds include acetonitrile and acrylonitrile.

Out of the first insulating layer and the second insulating layer, one of them preferably contains a resin having a polar group, whereas the other of them does not preferably contain any resin having a polar group. Examples of the polar group include a hydroxy group, a carboxy group, a carbonyl group, an aldehyde group, an amino group, an imino group, a nitro group, a sulfo group, a cyano group, a glycidyl group, and halogen. Part of these polar groups may be substituted.

In the present invention, the resin having a polar group refers to a resin having a polar group in a repeating unit of the resin. When the resin contains a plurality of repeating units, the polar group is only required to be contained in at least one of these repeating units.

The first insulating layer containing the resin having a polar group and the second insulting layer not containing the resin having a polar group are different from each other in relative permittivity. With this configuration, the respective threshold voltages of the semiconductor layers in contact with the first insulating layer and the second insulating layer can be changed to the extent that they are different from each other.

The relative permittivity of the respective insulating materials contained in the first insulating layer and the second insulating layer can be measured as follows. First, the respective structure materials of the first insulating layer and the second insulating layer are determined. This determination processing can be performed by using various kinds of organic analysis methods and inorganic analysis methods such as elemental analysis, nuclear magnetic resonance analysis, infrared spectroscopic analysis, and X-ray photoelectron spectroscopy singly or in combination. A capacitor is made with each of the structure materials determined by this determination processing used as a dielectric layer, and capacitance when an AC voltage is applied to this capacitor with a frequency of 1 kHz is measured. From the measured capacitance (C), the electrode area of the capacitor (S), and the film thickness of the dielectric layer (d), the relative permittivity ($\varepsilon_r$) is calculated using the following expression.

$$C = \varepsilon_r \varepsilon_0 S/d$$

where the permittivity in the vacuum ($\varepsilon_0$) is $8.854 \times 10^{-12}$.

The film thickness of the first insulating layer and the second insulating layer is generally 50 nm or more and 10 μm or less and preferably 100 nm or more and 3 μm or less. The first insulating layer and the second insulating layer may each be formed of a single layer or formed of a plurality of layers. In each of the first insulating layer and the second insulating layer, one layer may be formed of a plurality of insulating materials, or a plurality of layers may be formed by stacking a plurality of insulating materials.

<Method for Manufacturing Memory Array>

The following describes the method for manufacturing a memory array according to the present invention. The method for manufacturing a memory array according to the present invention manufactures the memory array according to the first embodiment, the memory array according to the second embodiment, or the memory array according to the third embodiment. This method of manufacture includes at least an application process that forms an applied layer in an area between the first electrode and the second electrode of at least one memory element out of the memory elements by application. In this method of manufacture, methods for forming the electrodes, the insulating layers, and the semiconductor layers included in the memory elements included in the memory array to be manufactured are as described above. An order of these methods of formation is appropriately selected, whereby the memory array according to the present invention can be manufactured.

Figure 11:
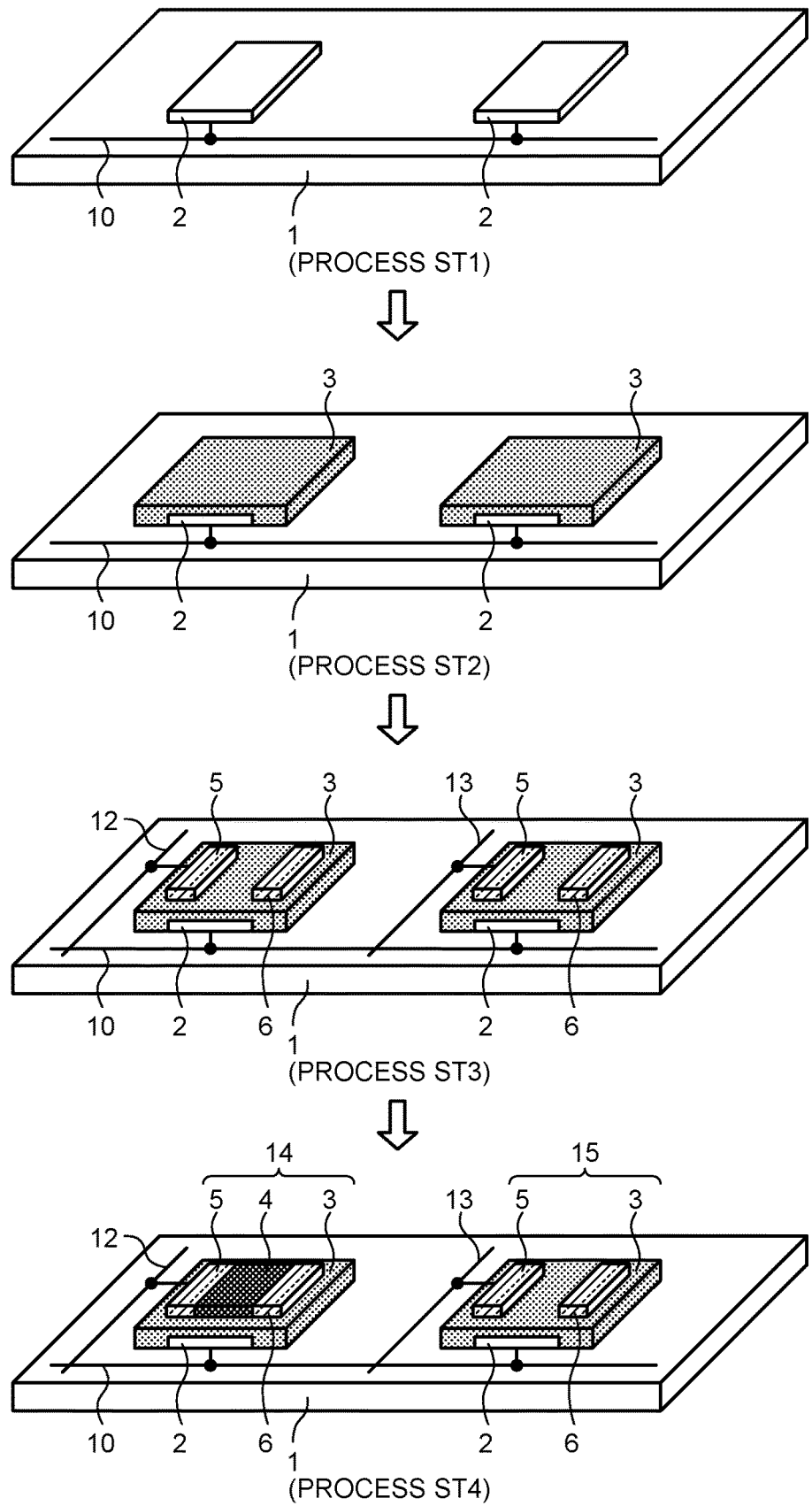
FIG. 11 is a diagram of an example of a method for manufacturing the memory array according to the first embodiment of the present invention.

The following first specifically describes an example of a method for manufacturing the memory array according to the first embodiment of the present invention. FIG. 11 is a diagram of an example of the method for manufacturing the memory array according to the first embodiment of the present invention. The method for manufacturing the memory array according to the first embodiment of the present invention includes various kinds of processes to form a plurality of memory elements, at least one word line, and a plurality of bit lines included in this memory array such as a first electrode and wire forming process, an insulating layer forming process, a second electrode and wire forming process, and an application process.

Specifically, as illustrated in FIG. 11, first, the first electrode and a wire forming process (Process ST1) is performed. In this Process ST1, at least one word line (the word line 10, for example) and a plurality of third electrodes 2 are simultaneously formed on the substrate 1 by the above method, or vacuum deposition through a mask, for example. In this process, when there are some necessary word lines (the word line 11 illustrated in FIG. 1, for example) apart from the word line 10 illustrated in FIG. 11, a necessary number of word lines are formed so as to be arranged spaced apart from each other with a certain direction as being long. Although FIG. 11 illustrates two third electrodes 2, the same number of them as the number of the memory elements to be manufactured are formed on the substrate 1. These third electrodes 2 are connected to one of the at least one word line such as the word line 10 illustrated in FIG. 11 via respective wires.

Next, as illustrated in FIG. 11, the insulating layer forming process (Process ST2) is performed. In this Process ST2, a plurality of insulating layers 3 are formed on the substrate 1 in correspondence with the third electrodes 2 by the above method, or printing, for example. Each of the insulating layers 3 is in contact with the third electrode 2 from above and interposes the third electrode 2 between the insulating layer 3 and the substrate 1 to cover the third electrode 2.

Next, as illustrated in FIG. 11, the second electrode and wire forming process (Process ST3) is performed. In this Process ST3, a plurality of bit lines (the bit lines 12 and 13, for example) and a plurality of pairs of the first electrode 5 and the second electrode 6 are simultaneously formed by the above method, or vacuum deposition through a mask using the same material, for example. In this process, the bit lines 12 and 13 are formed on the substrate 1 so as to be arranged spaced apart from each other with a direction crossing the at least one word line (the word line 10, for example) as being long. When there are some necessary bit lines apart from the bit lines 12 and 13 illustrated in FIG. 11, a necessary number of bit lines are formed similarly to these bit lines 12 and 13. Although two pairs of the first electrode 5 and the second electrode 6 (two first electrodes 5 and two second electrodes 6) are illustrated in FIG. 11, the same number of them as the number of the memory elements to be manufactured are formed on the corresponding insulating layers 3. Each of the first electrodes 5 is connected to one of the bit lines such as the bit line 12 or the bit line 13 illustrated in FIG. 11 via a wire.

Next, as illustrated in FIG. 11, the application process (Process ST4) is performed. The applied layer to be applied in this Process ST4 is the semiconductor layer 4. In this Process ST4, a memory element to which the applied layer is to be applied is selected out of the memory elements on the substrate 1 in correspondence with information to be recorded. Next, the semiconductor layer 4 is formed by application in the area between the first electrode 5 and the second electrode 6 of the selected memory element to which the applied layer is to be applied (the memory element 14 in FIG. 11). A solution containing CNT is applied to the area between the first electrode 5 and the second electrode 6 of the memory element 14 and is dried as needed to form the semiconductor layer 4, for example. In contrast, the semiconductor layer 4 is not formed in a memory element not selected as the memory element to which the applied layer is to be applied (the memory element 15 in FIG. 11) out of the memory elements. Thus, the memory elements on the substrate 1 are separately manufactured into two kinds of memory elements different from each other in electrical characteristics (that is, different from each other in information to be recorded) by the presence or absence of the semiconductor layer 4. Consequently, a memory array (the memory array 200 illustrated in FIG. 1, for example) that records unique information determined by any arrangement of these two kinds of memory elements can be manufactured.

The application in Process ST4, which is not limited to a particular method, is preferably any one selected from the group consisting of ink jetting, dispensing, and spraying. Among them, ink jetting is more preferred as the application in view of the pattern processability of the electrode and the wire and raw material use efficiency.

Figure 12:
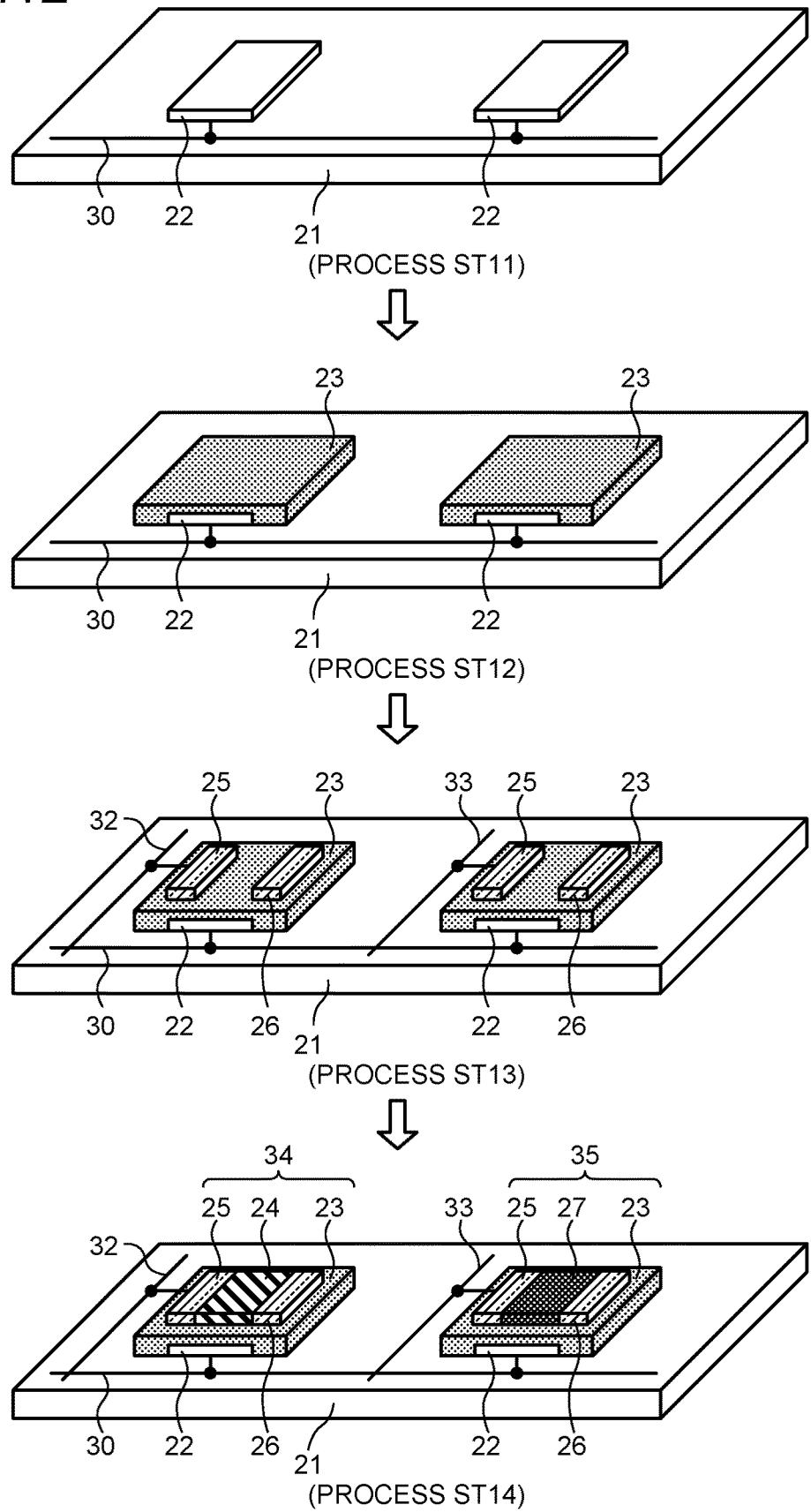
FIG. 12 is a diagram of an example of a method for manufacturing the memory array according to the second embodiment of the present invention.

The following specifically describes an example of a method for manufacturing the memory array according to the second embodiment of the present invention. FIG. 12 is a diagram of an example of the method for manufacturing the memory array according to the second embodiment of the present invention. The method for manufacturing the memory array according to the second embodiment includes various kinds of processes to form a plurality of memory elements, at least one word line, and a plurality of bit lines included in this memory array such as a first electrode and wire forming process, an insulating layer forming process, a second electrode and wire forming process, and an application process.

Specifically, as illustrated in FIG. 12, first, the first electrode and a wire forming process (Process ST11) is performed. In this Process ST11, at least one word line (the word line 30, for example) and a plurality of third electrodes 22 are simultaneously formed on the substrate 21 by the above method, or vacuum deposition through a mask, for example. In this process, when there are some necessary word lines (the word line 31 illustrated in FIG. 4, for example) apart from the word line 30 illustrated in FIG. 12, a necessary number of word lines are formed so as to be arranged spaced apart from each other with a certain direction as being long. Although FIG. 12 illustrates two third electrodes 22, the same number of them as the number of the memory elements to be manufactured are formed on the substrate 21. These third electrodes 22 are connected to one of the at least one word line such as the word line 30 illustrated in FIG. 12 via respective wires.

Next, as illustrated in FIG. 12, the insulating layer forming process (Process ST12) is performed. In this Process ST12, a plurality of insulating layers 23 are formed on the substrate 21 in correspondence with the third electrodes 22 by the above method, or printing, for example. Each of the insulating layers 23 is in contact with the third electrode 22 from above and interposes the third electrode 22 between the insulating layer 23 and the substrate 21 to cover the third electrode 22.

Next, as illustrated in FIG. 12, the second electrode and wire forming process (Process ST13) is performed. In this Process ST13, a plurality of bit lines (the bit lines 32 and 33, for example) and a plurality of pairs of the first electrode 25 and the second electrode 26 are simultaneously formed by the above method, or vacuum deposition through a mask using the same material, for example. In this process, the bit lines 32 and 33 are formed on the substrate 21 so as to be arranged spaced apart from each other with a direction crossing the at least one word line (the word line 30, for example) as being long. When there are some necessary bit lines apart from the bit lines 32 and 33 illustrated in FIG. 12, a necessary number of bit lines are formed similarly to these bit lines 32 and 33. Although two pairs of the first electrode 25 and the second electrode 26 (two first electrodes 25 and two second electrodes 26) are illustrated in FIG. 12, the same number of them as the number of the memory elements to be manufactured are formed on the corresponding insulating layers 23. Each of the first electrodes 25 is connected to one of the bit lines such as the bit line 32 or the bit line 33 illustrated in FIG. 12 via a wire.

Next, as illustrated in FIG. 12, the application process (Process ST14) is performed. The applied layers to be applied in this Process ST14 are the semiconductor layers 24 and 27 different from each other in electrical characteristics. In this Process ST14, the semiconductor layer 24 or the semiconductor layer 27 is formed by application in the area between the first electrode 25 and the second electrode 26 of each of the memory elements on the substrate 21 in correspondence with information to be recorded. A solution containing poly(3-hexylthiophene) (P3HT) is applied to the area between the first electrode 25 and the second electrode 26 of the memory element 35 and is dried as needed to form the semiconductor layer 27, for example. A solution containing CNT is applied to the area between the first electrode 25 and the second electrode 26 of the memory element 34 and is dried as needed to form the semiconductor layer 24. Thus, the memory elements on the substrate 21 are separately manufactured into two kinds of memory elements different from each other in electrical characteristics (that is, different from each other in information to be recorded) depending on which of the semiconductor layers 24 and 27 is included therein. Consequently, a memory array (the memory array 300 illustrated in FIG. 4, for example) that records unique information determined by any arrangement of these two kinds of memory elements can be manufactured.

The application in Process ST14 is preferably any one selected from the group consisting of ink jetting, dispensing, and spraying similarly to the application process (Process ST4) in the first embodiment. Among them, ink jetting is more preferred.

Examples of a method for giving electrical characteristics different from each other to the memory element 34 and the memory element 35 include the following methods apart from making the respective semiconductor materials forming the semiconductor layers 24 and 27 different from each other. One is a method that makes the amount of application of the CNT solution when the semiconductor layer 24 is formed larger than the amount of application of the CNT solution when the semiconductor layer 27 is formed and thereby makes the film thickness of the semiconductor layer 24 larger than the film thickness of the semiconductor layer 27 (refer to FIG. 5). Another is a method that makes the concentration of the CNT solution when the semiconductor layer 24 is formed higher than the concentration of the CNT solution when the semiconductor layer 27 is formed while equalizing the respective amounts of application of the semiconductor materials when the semiconductor layer 24 and the semiconductor layer 27 are formed (refer to FIG. 7). By these methods, the memory element 34 is caused to record one information of "0" and "1," whereas the memory element 35 is caused to record the other information, for example, whereby arrangement of a plurality of memory elements with any combination of the two kinds of memory elements that record respective pieces of information different from each other, that is, a memory array can be manufactured by the same process. It should be noted that another method may be used so long as it is a method that can make the electrical characteristics of the semiconductor layers sufficiently different from each other.

Figure 13:
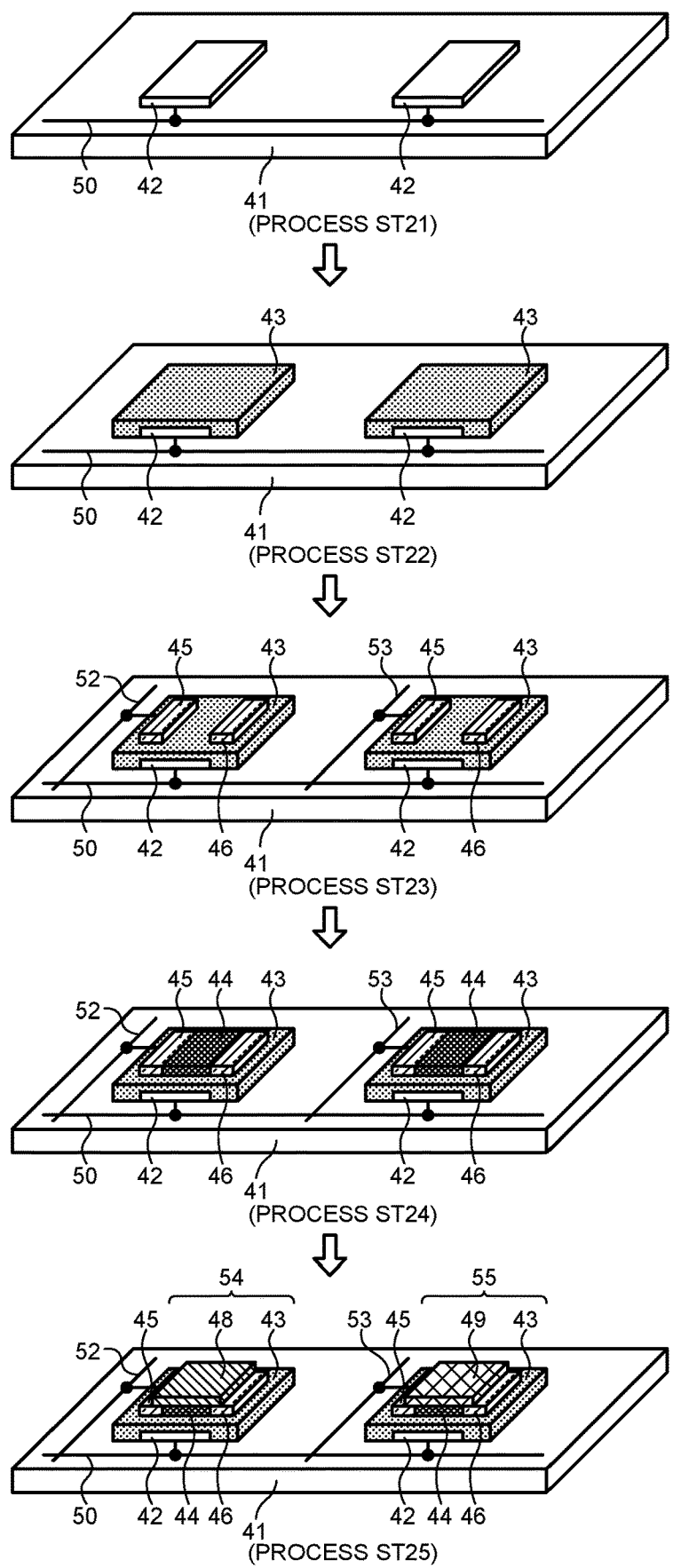
FIG. 13 is a diagram of an example of a method for manufacturing the memory array according to the third embodiment of the present invention.

The following specifically describes an example of a method for manufacturing the memory array according to the third embodiment of the present invention. FIG. 13 is a diagram of an example of the method for manufacturing the memory array according to the third embodiment of the present invention. The method for manufacturing the memory array according to the third embodiment includes various kinds of processes to form a plurality of memory elements, at least one word line, and a plurality of bit lines included in this memory array such as a first electrode and wire forming process, an insulating layer forming process, a second electrode and wire forming process, a semiconductor layer forming process, and an application process.

Specifically, as illustrated in FIG. 13, first, the first electrode and a wire forming process (Process ST21) is performed. In this Process ST21, at least one word line (the word line 50, for example) and a plurality of third electrodes 42 are simultaneously formed on the substrate 41 by the above method, or vacuum deposition through a mask, for example. In this process, when there are some necessary word lines (the word line 51 illustrated in FIG. 8, for example) apart from the word line 50 illustrated in FIG. 13, a necessary number of word lines are formed so as to be arranged spaced apart from each other with a certain direction as being long. Although FIG. 13 illustrates two third electrodes 42, the same number of them as the number of the memory elements to be manufactured are formed on the substrate 41. These third electrodes 42 are connected to one of the at least one word line such as the word line 50 illustrated in FIG. 13 via respective wires.

Next, as illustrated in FIG. 13, the insulating layer forming process (Process ST22) is performed. In this Process ST22, a plurality of insulating layers 43 are formed on the substrate 41 in correspondence with the third electrodes 42 by the above method, or printing, for example. Each of the insulating layers 43 is in contact with the third electrode 42 from above and interposes the third electrode 42 between the insulating layer 43 and the substrate 41 to cover the third electrode 42.

Next, as illustrated in FIG. 13, the second electrode and wire forming process (Process ST23) is performed. In this Process ST23, a plurality of bit lines (the bit lines 52 and 53, for example) and a plurality of pairs of the first electrode 45 and the second electrode 46 are simultaneously formed by the above method, or vacuum deposition through a mask using the same material, for example. In this process, the bit lines 52 and 53 are formed on the substrate 41 so as to be arranged spaced apart from each other with a direction crossing the at least one word line (the word line 50, for example) as being long. When there are some necessary bit lines apart from the bit lines 52 and 53 illustrated in FIG. 13, a necessary number of bit lines are formed similarly to these bit lines 52 and 53. Although two pairs of the first electrode 45 and the second electrode 46 (two first electrodes 45 and two second electrodes 46) are illustrated in FIG. 13, the same number of them as the number of the memory elements to be manufactured are formed on the corresponding insulating layers 43. Each of the first electrodes 45 is connected to one of the bit lines such as the bit line 52 or the bit line 53 illustrated in FIG. 13 via a wire.

Next, as illustrated in FIG. 13, the semiconductor layer forming process (Process ST24) is performed. In this Process ST24, the semiconductor layer 44 is formed in the area between the first electrode 45 and the second electrode 46 of each of the memory elements to be manufactured so as to be in contact with the insulating layer 43. A solution containing CNT is applied to the area between the first electrode 45 and the second electrode 46 as components of the memory element 54 and is dried as needed to form the semiconductor layer 44 being in contact with the upper face of the insulating layer 43, for example. Similarly, the semiconductor layer 44 is formed in the area between the first electrode 45 and the second electrode 46 as components of the memory element 55.

Next, as illustrated in FIG. 13, the application process (Process ST25) is performed. The applied layer to be applied in this Process ST25 is the first insulating layer 48 or the second insulating layer 49 different from each other in electrical characteristics. In this Process ST25, the first insulating layer 48 or the second insulating layer 49 is formed in the area between the first electrode 45 and the second electrode 46 of each of the memory elements on the substrate 41 so as to be in contact with the semiconductor layer 44 from a side opposite the insulating layer 43 in correspondence with information to be recorded. For the memory element 54, a solution containing an insulating material for forming the first insulating layer 48 is applied to the area between the first electrode 45 and the second electrode 46 so as to cover the semiconductor layer 44 and is dried as needed to form the first insulating layer 48, for example. For the memory element 55, a solution containing an insulating material for forming the second insulating layer 49 is applied to the area between the first electrode 45 and the second electrode 46 so as to cover the semiconductor layer 44 and is dried as needed to form the second insulating layer 49. Thus, the memory elements on the substrate 41 are separately manufactured into two kinds of memory elements different from each other in electrical characteristics (that is, different from each other in information to be recorded) depending on which of the first insulating layer 48 and the second insulating layer 49 is included therein. Consequently, a memory array (the memory array 500 illustrated in FIG. 8, for example) that records unique information determined by any arrangement of these two kinds of memory elements can be manufactured.

The application in Process ST25 is preferably any one selected from the group consisting of ink jetting, dispensing, and spraying similarly to the application process (Process ST4) in the first embodiment. Among them, ink jetting is more preferred.

As described above, when the memory array according to the first and the second embodiments of the present invention is manufactured, a batch process can be used that forms the respective components of all the memory elements to be manufactured on the same substrate in a batch manner in the processes before forming the semiconductor layer. After that, the semiconductor layer can be formed selectively only in a specific memory element by application, or the two kinds of semiconductor layers different from each other in electrical characteristics can be separately made for each of the memory elements by application.

When the memory array according to the third embodiment of the present invention is manufactured, a batch process can be used that forms the respective components of all the memory elements to be manufactured on the same substrate in a batch manner in the processes until forming the semiconductor layer. After that, the first insulating layer and the second insulating layer different from each other in the component material can be separately made for each of the memory elements by application.

In any of the methods for manufacturing the memory array according to the first to the third embodiments, memory elements that can record information of either "0" or "1" can be separately manufactured by the same process using a simple method, or application.

Any method of manufacture of the first to the third embodiments is advantageous in terms of processes and costs when many memory arrays different from each other in recorded information are manufactured. The memory arrays different from each other in recorded information are different from each other in arrangement with any combination of a memory element recording information of "0" and a memory element recording information of "1." When memory arrays are formed such that the arrangement of these two kinds of memory elements is different from one memory array to another, processes and costs generally increase for some reasons such as the necessity of photomasks corresponding to the respective memory arrays. The methods for manufacturing the memory array according to the first to the third embodiments of the present invention can change the position of a memory element to which the applied layer such as the semiconductor layer, the first insulating layer, or the second insulating layer is to be formed for each of the memory arrays simply without using any mask and can thereby manufacture many kinds of memory arrays different from each other in the arrangement of the two kinds of memory elements. Consequently, many memory arrays different from each other in recorded information can be manufactured by simple processes and at low costs.

<Memory Circuit>

Figure 14:
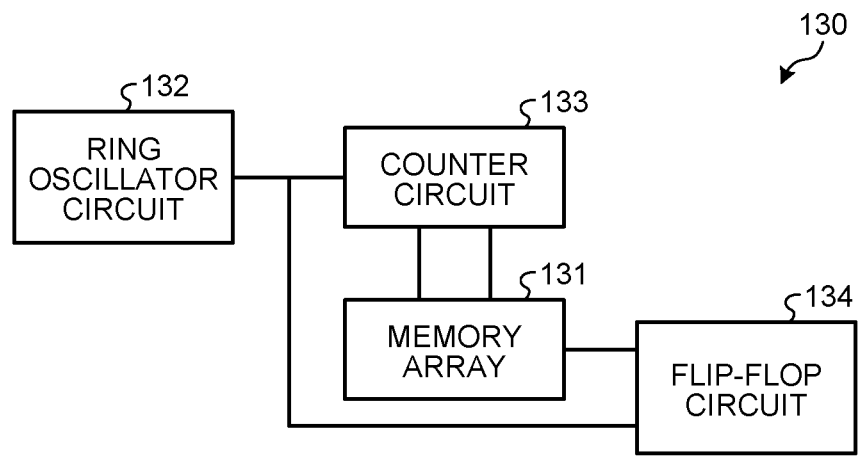
FIG. 14 is a block diagram of a configuration example of a memory circuit including a memory array according to the present invention.

The following describes a memory circuit including the memory array according to the first to the third embodiments of the present invention. FIG. 14 is a block diagram of a configuration example of the memory circuit including the memory array according to the present invention. As illustrated in FIG. 14, this memory circuit 130 has a memory array 131, a ring oscillator circuit 132, a counter circuit 133, and a flip-flop circuit 134. The memory array 131 is the memory array according to the present invention and is the memory array 200, the memory array 300, or the memory array 500 according to the first to the third embodiments, for example.

In this memory circuit 130, a clock signal generated from the ring oscillator circuit 132 is input to the counter circuit 133. With this operation, the counter circuit 133 outputs respective selection signals to bit lines (the bit lines 12 and 13 illustrated in FIG. 1, for example) and word lines (the word lines 10 and 11 illustrated in FIG. 1, for example) of the memory array 131. With such output of the selection signals, a memory element from which information is to be read is successively selected in certain order out of a plurality of memory elements within the memory array 131 (the memory elements 14 to 17 illustrated in FIG. 1, for example). Respective pieces of information (binary information such as "0" or "1," for example) recorded in the memory elements are successively read in accordance with this order of selection. These pieces of information arranged in order of reading are input from the memory array 131 to the flip-flop circuit 134 as the unique information of the memory array 131. The flip-flop circuit 134, on the basis of the clock signal input from the ring oscillator circuit 132 and the pieces of information input from the memory array 131, performs stabilization processing on the pieces of information. The pieces of information subjected to the stabilization processing are output from the flip-flop circuit 134 to the outside of the memory circuit 130 as the unique information of the memory array 131.

Transistors included in the circuits, or the ring oscillator circuit 132, the counter circuit 133, and the flip-flop circuit 134 may be ones generally used, in which materials used and shape are not limited to particular ones. Materials that electrically connect the circuits to each other may be any ones so long as they are electric conductive materials that can be generally used. A method for connecting the circuits may be any method so long as it can establish electric continuity, and connecting parts between the circuits have any width and thickness.

<Memory Array Sheet>

The following describes the memory array sheet according to the present invention. An example of the memory array sheet according to the present invention includes a combination of a plurality of any of the memory arrays according to the first to the third embodiments formed on a sheet. In this memory array sheet, the sheet is a sheet-shaped substrate and is used in place of the substrate in the first to the third embodiments. Respective pieces of information recorded in the memory arrays formed on the sheet are different from each other. The following describes this memory array sheet as a fourth embodiment of the present invention.

Fourth Embodiment

Figure 15:
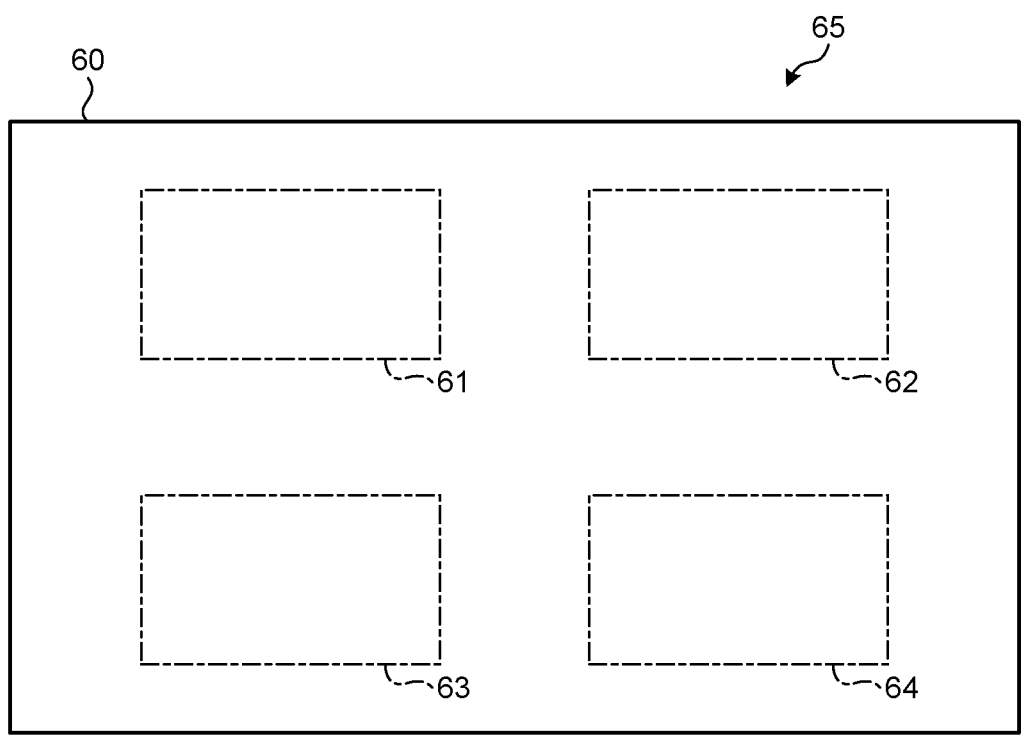
FIG. 15 is a schematic diagram of a configuration example of a memory array sheet according to a fourth embodiment of the present invention.

FIG. 15 is a schematic diagram of a configuration example of the memory array sheet according to the fourth embodiment of the present invention. As illustrated in FIG. 15, this memory array sheet 65 according to the fourth embodiment has a plurality of memory arrays, or four memory arrays, for example, including a memory array 61, a memory array 62, a memory array 63, and a memory array 64 on a sheet 60. These four memory arrays 61 to 64 record respective pieces of information different from each other, or respective pieces of information unique to the respective memory arrays (respective pieces of unique information), for example.

Although FIG. 15 exemplifies the memory array sheet 65 having the four memory arrays 61 to 64 in order to simplify the description, the memory array sheet 65 according to the fourth embodiment is not limited to one having the four memory arrays 61 to 64 and may be one having two or more memory arrays.

Figure 16:
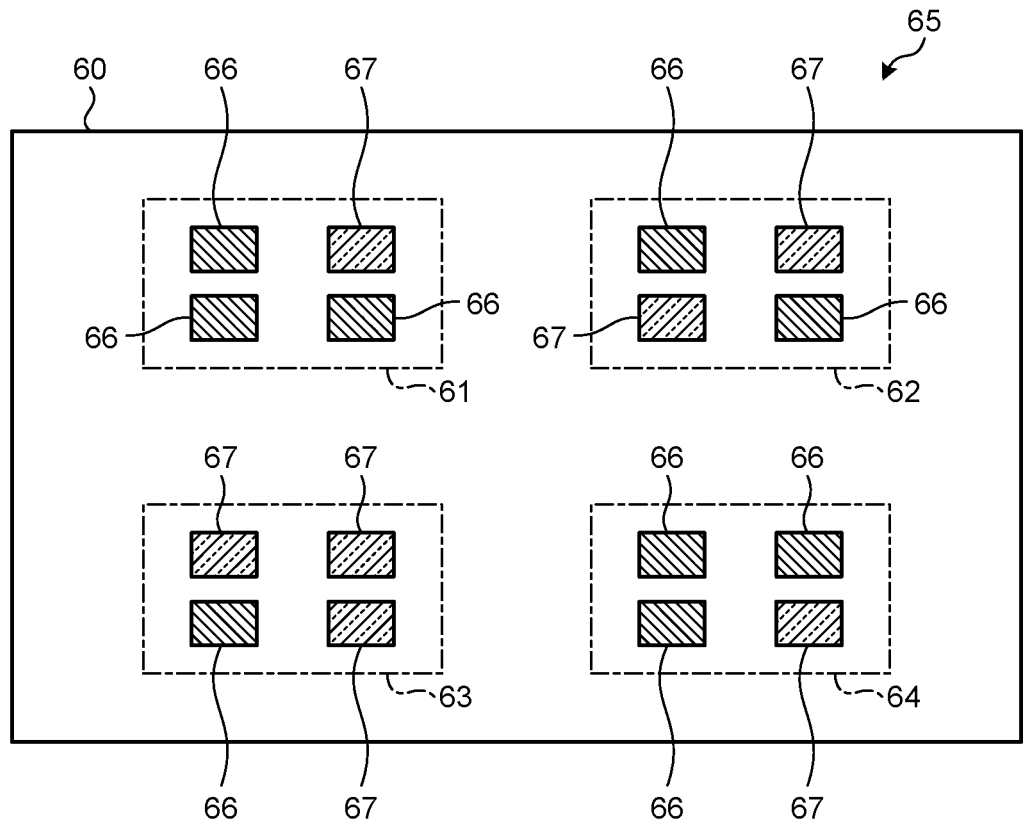
FIG. 16 is a schematic diagram illustrating the memory array sheet according to the fourth embodiment of the present invention in more detail.

Each of the memory arrays 61 to 64 in the fourth embodiment has a configuration similar to that of any of the memory arrays 200, 300, and 500 (refer to FIGS. 1, 4, and 8) according to the first to the third embodiments, for example. FIG. 16 is a schematic diagram illustrating the memory array sheet according to the fourth embodiment of the present invention in more detail. FIG. 16 exemplifies the memory array sheet 65 in which the four memory arrays 61 to 64 formed on the sheet 60 each contain four memory elements.

Specifically, as illustrated in FIG. 16, the memory arrays 61 to 64 each have a combination of four memory elements including two kinds of memory elements 66 and 67 recording respective pieces of binary information ("0" or "1," for example) different from each other.

As a first example of the fourth embodiment, the memory element 66 and the memory element 67 record respective pieces of information different from each other by the presence or absence of the semiconductor layer. In other words, the memory element 66 and the memory element 67 are similar to the two kinds of memory elements in the first embodiment. Specifically, the memory element 66 has a configuration similar to that of the memory element 14 (refer to FIGS. 2 and 3) having the semiconductor layer 4 in the area between the first electrode 5 and the second electrode 6 in the first embodiment. The memory element 67 has a configuration similar to that of the memory element 15 (refer to FIGS. 2 and 3) not having the semiconductor layer 4 in the first embodiment.

As a second example of the fourth embodiment, the memory element 66 and the memory element 67 record respective pieces of information different from each other by the difference in the electrical characteristics of the semiconductor layers. In other words, the memory element 66 and the memory element 67 are similar to the two kinds of memory elements in the second embodiment. Specifically, the memory element 66 has a configuration similar to that of the memory element 34 (refer to FIGS. 5 to 7) having the semiconductor layer 24 in the area between the first electrode 25 and the second electrode 26 in the second embodiment. The memory element 67 has a configuration similar to that of the memory element 35 (refer to FIGS. 5 to 7) having the semiconductor layer 27 different from the semiconductor layer 24 in electrical characteristics in the area between the first electrode 25 and the second electrode 26 in the second embodiment.

As a third example of the fourth embodiment, the memory element 66 and the memory element 67 record respective pieces of information different from each other by the difference in the electrical characteristics of the semiconductor layer by the first insulating layer and the second insulating layer. In other words, the memory element 66 and the memory element 67 are similar to the two kinds of memory elements in the third embodiment. Specifically, the memory element 66 has a configuration similar to that of the memory element 54 (refer to FIGS. 9A, 9B, and 10) having the first insulating layer 48 that covers the semiconductor layer 44 in the area between the first electrode 45 and the second electrode 46 in the third embodiment. The memory element 67 has a configuration similar to that of the memory element 55 (refer to FIGS. 9A, 9B, and 10) having the second insulating layer 49 that covers the semiconductor layer 44 in the area between the first electrode 45 and the second electrode 46 in the third embodiment.

Even though the two kinds of memory elements 66 and 67 are similar to those of any of the first to the third embodiments, the memory arrays 61 to 64 in the fourth embodiment are made different from each other in the combination of the four memory elements including the two kinds of memory elements 66 and 67 as illustrated in FIG. 16, for example. Consequently, respective pieces of information recorded in these memory arrays 61 to 64 are pieces of unique information different from each other among the memory arrays.

The memory array sheet according to the fourth embodiment arranges a plurality of memory arrays including a combination of two kinds of memory elements similar to any of the first to the third embodiments on a sheet. Consequently, the memory array sheet according to the fourth embodiment produces an effect similar to that of any of the first to the third embodiments.

Fifth Embodiment

The following describes a memory array sheet according to a fifth embodiment of the present invention. The memory array sheet according to the fifth embodiment includes a combination of a plurality of memory arrays each including a plurality of first wires, at least one second wire crossing the first wires, and a plurality of memory elements provided in correspondence with respective intersections of the first wires and the at least one second wire formed on a sheet. The memory elements include two kinds of memory elements including a memory element with a first wire pattern and a memory element with a second wire pattern. The first wire pattern is a wire pattern in which both the first wire and the second wire and the memory element are electrically connected to each other. The second wire pattern is a wire pattern in which at least either the first wire or the second wire and the memory element are not electrically connected to each other. The first wire pattern and the second wire pattern are formed of an electric conductive material applied to the sheet. Information to be recorded in the memory array on the sheet is determined by arrangement with any combination of these two kinds of memory elements. Further, respective pieces of information recorded in the memory arrays formed on the sheet are different from each other.

Figure 17:
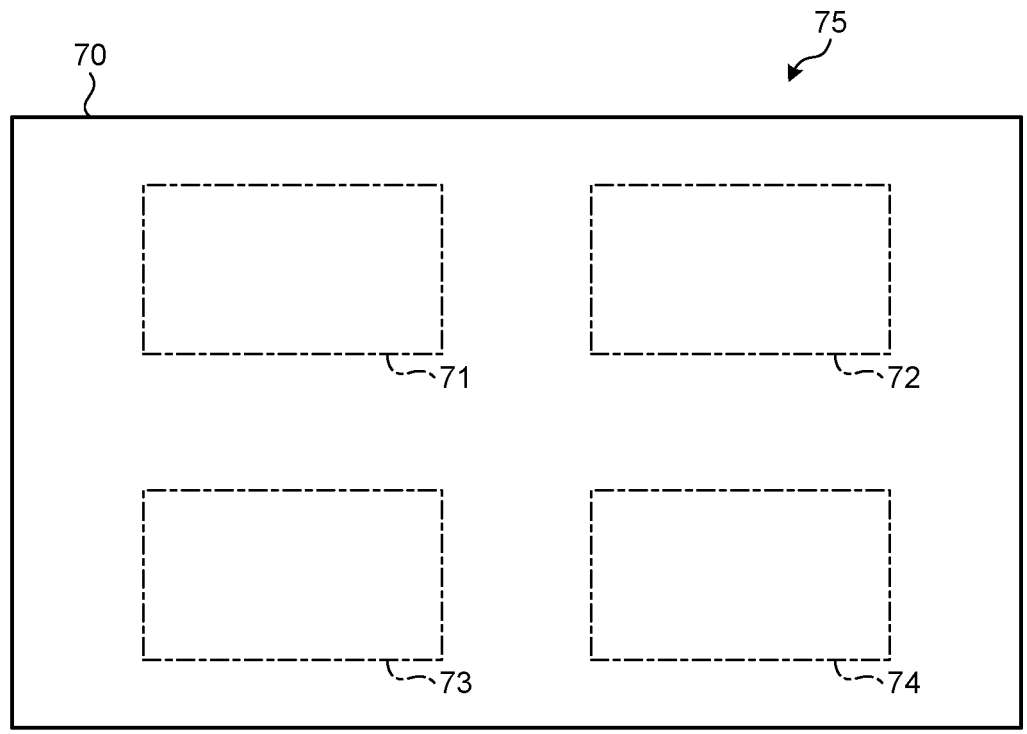
FIG. 17 is a schematic diagram of an example of a schematic configuration of a memory array sheet according to a fifth embodiment of the present invention.

FIG. 17 is a schematic diagram of an example of a schematic configuration of the memory array sheet according to the fifth embodiment of the present invention. As illustrated in FIG. 17, this memory array sheet 75 according to the fifth embodiment has a plurality of memory arrays, or four memory arrays 71, 72, 73, and 74, for example, on a sheet 70. These four memory arrays record respective pieces of information different from each other (respective pieces of unique information such as ID numbers unique to the respective memory arrays, for example).

Although FIG. 17 exemplifies the memory array sheet 75 having the four memory arrays 71, 72, 73, and 74 in order to simplify the description, the memory array sheet 75 according to the fifth embodiment is not limited to one having four memory arrays and may be one having two or more memory arrays.

Figure 18:
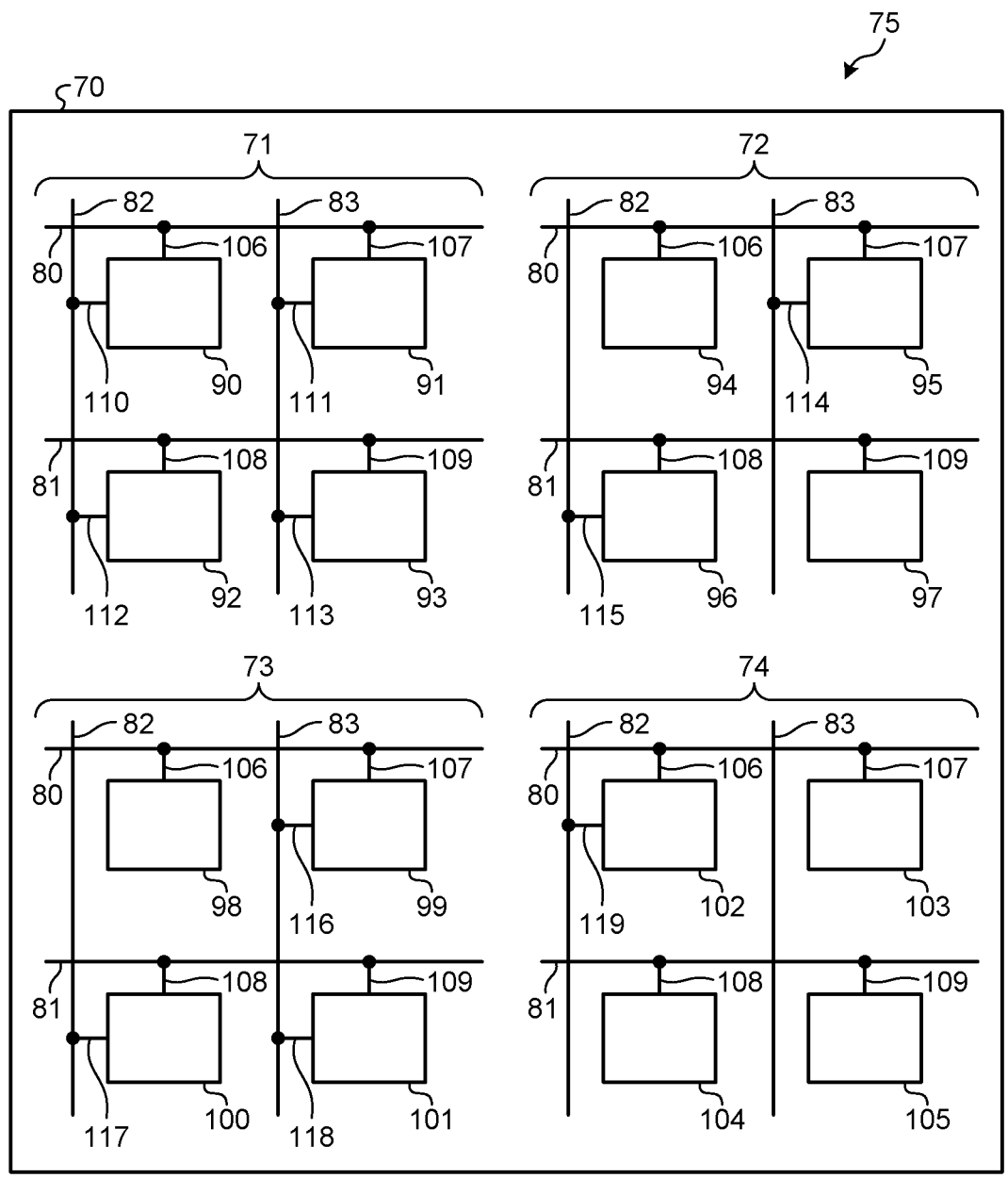
FIG. 18 is a schematic diagram of a specific configuration example of the memory array sheet illustrated in FIG. 17.

FIG. 18 is a schematic diagram of a specific configuration example of the memory array sheet illustrated in FIG. 17. In the memory array sheet 75 according to the fifth embodiment, the memory element with the first wire pattern has a first electrode electrically connected to one of the first wires, a second electrode electrically connected to the first electrode via a semiconductor layer, and a third electrode electrically connected to one of the at least one second wire. In contrast, the memory element with the second wire pattern lacks at least one of the electric connection between one of the first wires and the first electrode, the electric connection between the first electrode and the second electrode, and the electric connection between one of the at least one second wire and the third electrode.

As illustrated in FIG. 18, the memory array sheet 75 according to the fifth embodiment has word lines 80 and 81 as examples of the second wire, bit lines 82 and 83 as examples of the first wires, memory elements 90 to 105 as examples of the memory elements, connecting parts 106 to 109 that each electrically connect one memory element and one word line to each other, and connecting parts 110 to 119 that each electrically connect one memory element and one bit line to each other on the sheet 70. The word lines 80 and 81 are similar to the word lines in the first to the third embodiments. The bit lines 82 and 83 are similar to the bit lines in the first to the third embodiments.

Specifically, as illustrated in FIG. 18, the memory array 71 has the word lines 80 and 81, the bit lines 82 and 83, the memory elements 90 to 93, the connecting parts 106 to 109 and the connecting parts 110 to 113 such as wires on the sheet 70. In this memory array 71, the memory element 90 is electrically connected to the word line 80 via the connecting part 106 and is electrically connected to the bit line 82 via the connecting part 110. The memory element 91 is electrically connected to the word line 80 via the connecting part 107 and is electrically connected to the bit line 83 via the connecting part 111. The memory element 92 is electrically connected to the word line 81 via the connecting part 108 and is electrically connected to the bit line 82 via the connecting part 112. The memory element 93 is electrically connected to the word line 81 via the connecting part 109 and is electrically connected to the bit line 83 via the connecting part 113. In other words, these memory elements 90 to 93 are all the memory elements with the first wire pattern, in which both the first wire and the second wire and the memory element are electrically connected to each other. These memory elements 90 to 93 record the same pieces of information (information of either "0" or "1," for example).

As illustrated in FIG. 18, the memory array 72 has the word lines 80 and 81, the bit lines 82 and 83, the memory elements 94 to 97, the connecting parts 106 to 109 and the connecting parts 114 and 115 such as wires on the sheet 70. In this memory array 72, the memory element 94 is electrically connected to the word line 80 via the connecting part 106 but is not connected to the bit line 82. The memory element 95 is electrically connected to the word line 80 via the connecting part 107 and is electrically connected to the bit line 83 via the connecting part 114. The memory element 96 is electrically connected to the word line 81 via the connecting part 108 and is electrically connected to the bit line 82 via the connecting part 115. The memory element 97 is electrically connected to the word line 81 via the connecting part 109 but is not connected to the bit line 83. In other words, out of these memory elements 94 to 97, the memory elements 95 and 96 are the memory elements with the first wire pattern. In contrast, the memory elements 94 and 97 are the memory elements with the second wire pattern, in which at least either the first wire or the second wire and the memory element is not electrically connected to each other. These memory elements 94 to 97 record respective pieces of information of "0" or "1." In this case, the respective pieces of information recorded in the memory elements 95 and 96 with the first wire pattern are the same as each other. The respective pieces of information recorded in the memory elements 94 and 97 with the second wire pattern are the same as each other and are different from those of the memory elements 95 and 96.

As illustrated in FIG. 18, the memory array 73 has the word lines 80 and 81, the bit lines 82 and 83, the memory elements 98 to 101, the connecting parts 106 to 109 and the connecting parts 116 to 118 such as wires on the sheet 70. In this memory array 73, the memory element 98 is electrically connected to the word line 80 via the connecting part 106 but is not connected to the bit line 82. The memory element 99 is electrically connected to the word line 80 via the connecting part 107 and is electrically connected to the bit line 83 via the connecting part 116. The memory element 100 is electrically connected to the word line 81 via the connecting part 108 and is electrically connected to the bit line 82 via the connecting part 117. The memory element 101 is electrically connected to the word line 81 via the connecting part 109 and is electrically connected to the bit line 83 via the connecting part 118. In other words, out of these memory elements 98 to 101, the memory elements 99 to 101 are the memory elements with the first wire pattern. In contrast, the memory element 98 is the memory element with the second wire pattern. These memory elements 98 to 101 record respective pieces of information of "0" or "1." In this case, the respective pieces of information recorded in the memory elements 99 to 101 with the first wire pattern are the same as each other. The information recorded in the memory element 98 with the second wire pattern is different from those of the memory elements 99 to 101.

As illustrated in FIG. 18, the memory array 74 has the word lines 80 and 81, the bit lines 82 and 83, the memory elements 102 to 105, the connecting parts 106 to 109 and the connecting part 119 such as wires on the sheet 70. In this memory array 74, the memory element 102 is electrically connected to the word line 80 via the connecting part 106 and is electrically connected to the bit line 82 via the connecting part 119. The memory element 103 is electrically connected to the word line 80 via the connecting part 107 but is not connected to the bit line 83. The memory element 104 is electrically connected to the word line 81 via the connecting part 108 but is not connected to the bit line 82. The memory element 105 is electrically connected to the word line 81 via the connecting part 109 but is not connected to the bit line 83. In other words, out of these memory elements 102 to 105, the memory element 102 is the memory element with the first wire pattern. In contrast, the memory elements 103 to 105 are the memory elements with the second wire pattern. These memory elements 102 to 105 record respective pieces of information of "0" or "1." The respective pieces of information recorded in the memory elements 103 to 105 with the second wire pattern are the same as each other. The information recorded in the memory element 102 with the first wire pattern is different from those of the memory elements 103 to 105.

As described above, the memory arrays 71 to 74 are different from each other in arrangement by a combination of the four memory elements recording information of "0" or "1." With this configuration, the memory arrays 71 to 74 record respective pieces of information different from each other, or respective pieces of unique information for the respective memory arrays, for example.

Figure 19:
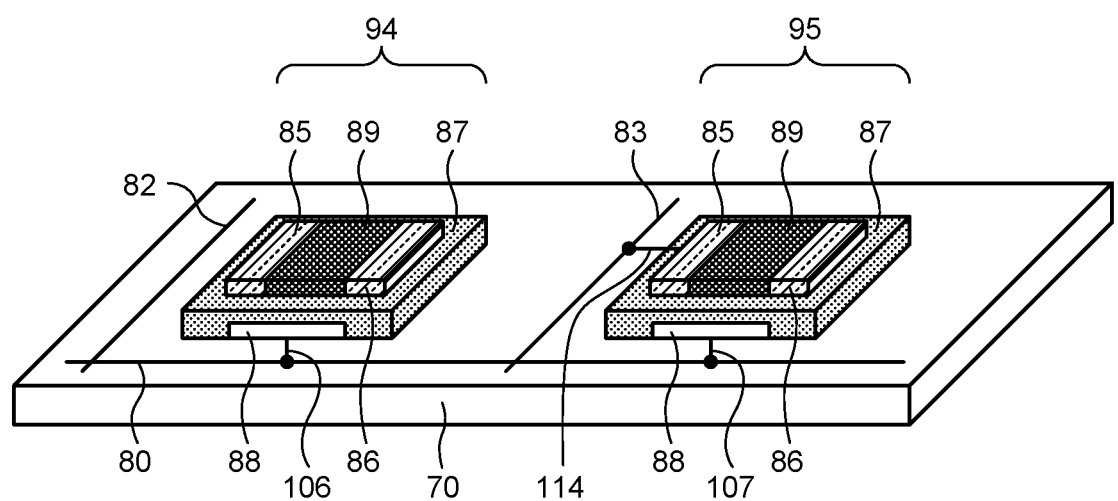
FIG. 19 is a perspective view with the surrounding part of two kinds of memory elements included in the memory array sheet illustrated in FIG. 18 extracted.

FIG. 19 is a perspective view with the surrounding part of the two kinds of memory elements included in the memory array sheet illustrated in FIG. 18 extracted. FIG. 19 exemplifies the memory element 94 with the second wire pattern and the memory element 95 with the first wire pattern as these two kinds of memory elements. It should be noted that although FIG. 18 illustrates the word line 80 on the drawing's upper side (far side) of the memory elements 94 and 95, FIG. 19 illustrates the word line 80 on the near side of the memory elements 94 and 95 for easy understanding.

As illustrated in FIG. 19, the memory element 94 and the memory element 95 are formed on the sheet 70. The memory element 94 and the memory element 95 each have a first electrode 85, a second electrode 86, an insulating layer 87, and a third electrode 88 on the sheet 70. The third electrode 88 is electrically insulated from the first electrode 85 and the second electrode 86 by the insulating layer 87. The first electrode 85 and the second electrode 86 are arranged spaced apart from each other on the insulating layer 87, for example. The memory element 94 and the memory element 95 each have a semiconductor layer 89 in an area between the first electrode 85 and the second electrode 86.

As illustrated in FIG. 19, the memory element 94 and the memory element 95 have the connecting parts 106 and 107, respectively, that electrically connect the third electrode 88 and the word line 80 to each other. Out of the memory element 94 and the memory element 95, the memory element 95 further has the connecting part 114 that electrically connects the first electrode 85 and the bit line 83 to each other. The connecting part 114 is formed of an electric conductive material applied by desired application. In contrast, the memory element 94 does not have any connecting part that electrically connects the first electrode 85 and the bit line 82 to each other. Although not illustrated in particular, the second electrode 86 of each of the memory elements 94 and 95 is connected to a reference potential line via a wire.

In the memory elements 94 and 95 illustrated in FIG. 19, depending on whether the connecting part 114 is formed between the first electrode 85 of the memory element 94 and the bit line 82 and between the first electrode 85 of the memory element 95 and the bit line 83, respective pieces of information to be recorded in the memory elements 94 and 95 such as "0" or "1" are determined. In other words, the memory elements 94 and 95 record respective pieces of information different from each other depending on whether they have a connecting part that electrically connects the first electrode and the bit line to each other (being the memory element with which of the first wire pattern and the second wire pattern). The reason why the respective pieces of information recorded in the two kinds of memory elements different from each other in the wire pattern are thus different from each other is because when the memory elements 94 and 95 are selected, that is, when a certain voltage is applied to the respective third electrodes 88 of the memory elements 94 and 95, although a current passes through the memory element 95 having the connecting part 114, no current passes through the memory element 94 not having the connecting part.

In the four memory arrays 71 to 74 included in the memory array sheet 75 illustrated in FIG. 18, the memory elements 97, 98, and 103 to 105 have the same structure as that of the memory element 94 illustrated in FIG. 19. The memory elements 90 to 93, 96, and 99 to 102 have the same structure as that of the memory element 95 illustrated in FIG. 19.

In the memory array 72, information to be recorded is determined by arrangement with any combination of the two kinds of memory elements including "the memory element having the connecting part that electrically connects the first electrode and the bit line to each other (the memory element with the first wire pattern)" exemplified by the memory element 95 and "the memory element not having the connecting part that electrically connects the first electrode and the bit line to each other (the memory element with the second wire pattern)" exemplified by the memory element 94. This determined information can be recorded in the memory array 72 as unique information such as an ID number unique to the memory array 72. In the arrangement of the four memory elements 94, 95, 96, and 97 [memory element 94, memory element 95, memory element 96, memory element 97], when the memory elements 95 and 96 each have the connecting part and the memory elements 94 and 97 do not each have the connecting part, information of [1, 0, 0, 1] or [0, 1, 1, 0] is recorded in the memory array 72 as the unique information, for example. When the memory element 95 has the connecting part and the memory elements 94, 96, and 97 do not each have the connecting part, information of [0, 1, 0, 0] or [1, 0, 1, 1] is recorded in the memory array 72 as the unique information.

The memory array sheet according to the fourth and the fifth embodiments of the present invention may repeatedly arrange memory arrays recording the same pieces of unique information but preferably combines a plurality of memory arrays recording respective pieces of unique information different from each other as illustrated in FIGS. 16 and 18. This is because doing so can obtain memory arrays corresponding to the variety of pieces of unique information to be recorded simply by cutting the memory array sheet having a combination of these memory arrays into each individual memory array.

In the fifth embodiment, binary information (information of "0" or "1," for example) is recorded in each of the memory elements depending on being the memory element with which wire pattern of the first wire pattern having the connecting part that electrically connects the memory element and the bit line to each other and the second wire pattern not having such a connecting part, and information to be recorded in the memory array is determined by arrangement with any combination of these memory elements. Consequently, a memory array sheet having a plurality of memory arrays recording respective pieces of unique information different from each other on a sheet can be achieved at low costs using simpler processes such as application than the mask ROM method.

Although the fifth embodiment exemplifies the second wire pattern, in which the memory element and the bit line are not electrically connected to each other, the present invention is not limited to this example; the second wire pattern is only required to be a wire pattern that makes at least either the bit line or the word line and the memory element insulated from each other and may be a wire pattern (an electrode pattern) in which at least one of the first electrode, the second electrode, and the third electrode of the memory element is not formed or a wire pattern in which a connecting part that electrically connects the third electrode of the memory element and the word line to each other is not formed, for example.

(Sheet)

The sheet in the fourth and fifth embodiments (the sheet 60 illustrated in FIGS. 15 and 16 or the sheet 70 illustrated in FIGS. 17 and 18, for example) may be formed of any material so long as at least the surface on which the electrodes are arranged is electrically insulating. Preferred examples of the sheet include ones formed of inorganic materials such as silicon wafers, glass, sapphire, and alumina sintered bodies and organic materials such as polyimide, polyvinyl alcohol, polyvinyl chloride, polyethylene terephthalate, polyvinylidene fluoride, polysiloxane, PVP, polyester, polycarbonate, polysulfone, polyethersulfone, polyethylene, polyphenylene sulfide, and poly-p-xylene.

The sheet is not limited to the above and may be formed of a plurality of materials stacked such as a PVP film formed on a silicon wafer and a polysiloxane film formed on polyethylene terephthalate.

Among them, in view of the capability of manufacturing many memory arrays on the same sheet by a roll-to-roll method or the like using a film sheet, preferably contained is one or more materials selected from the group consisting of organic materials such as polyimide, polyvinyl alcohol, polyvinyl chloride, polyethylene terephthalate, polyvinylidene fluoride, polysiloxane, PVP, polyester, polycarbonate, polysulfone, polyether sulfone, polyethylene, polyphenylene sulfide, and poly-p-xylene.

<Method for Manufacturing Memory Array Sheet>

The following describes the method for manufacturing a memory array sheet according to the present invention. The method for manufacturing a memory array sheet according to the present invention is to manufacture the memory array sheet according to the fourth embodiment or the memory array sheet according to the fifth embodiment. The method of manufacture when the memory array sheet according to the fourth embodiment is manufactured includes at least an application process that forms an applied layer by application in the area between the first electrode and the second electrode of at least one memory element out of the memory elements. The method of manufacture when the memory array sheet according to the fifth embodiment is manufactured includes at least an application process that forms the first wire pattern, in which both the first wire and the second wire and the memory element are electrically connected to each other or the second wire pattern, in which at least either the first wire or the second wire and the memory element are not electrically connected to each other by application for each memory element included in the memory elements.

Figure 20A:
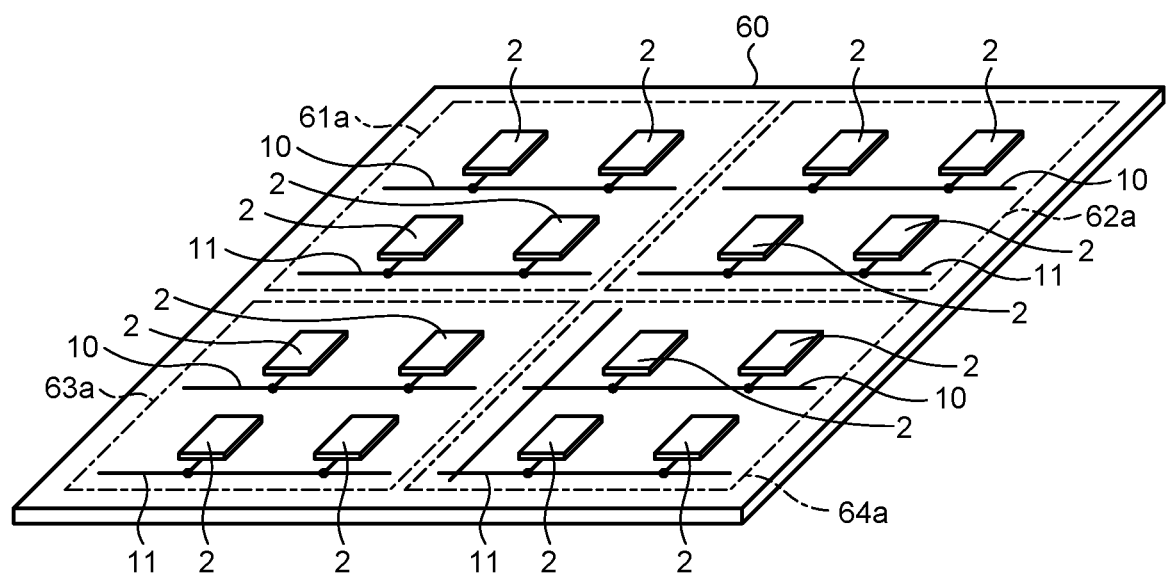
FIG. 20A is a diagram exemplifying a first half process of a first example of a method for manufacturing the memory array sheet according to the fourth embodiment of the present invention.
Figure 20A:
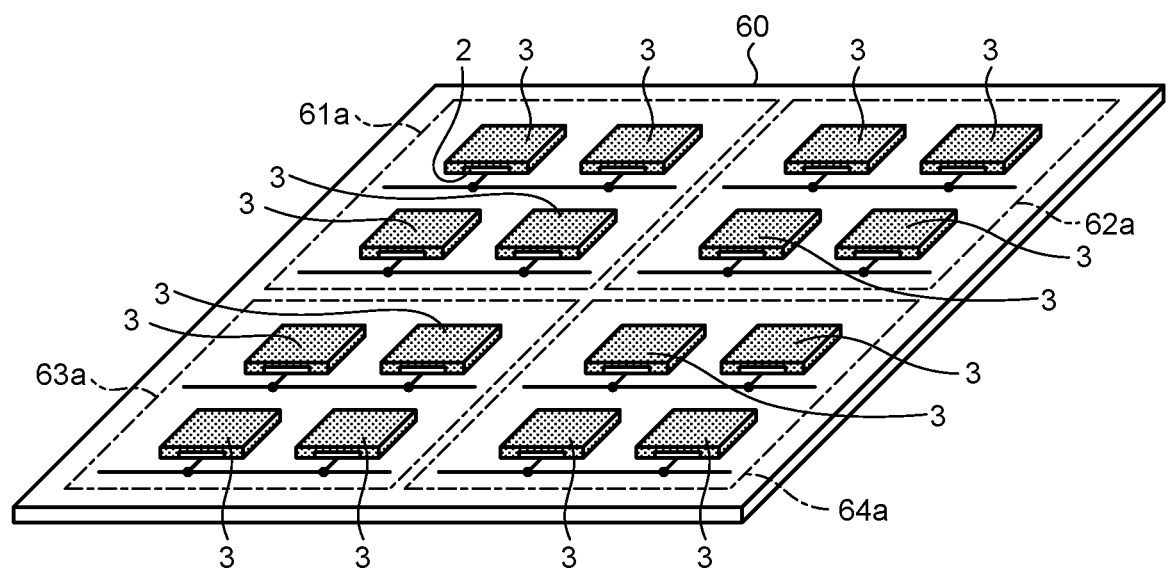
Figure 20B:
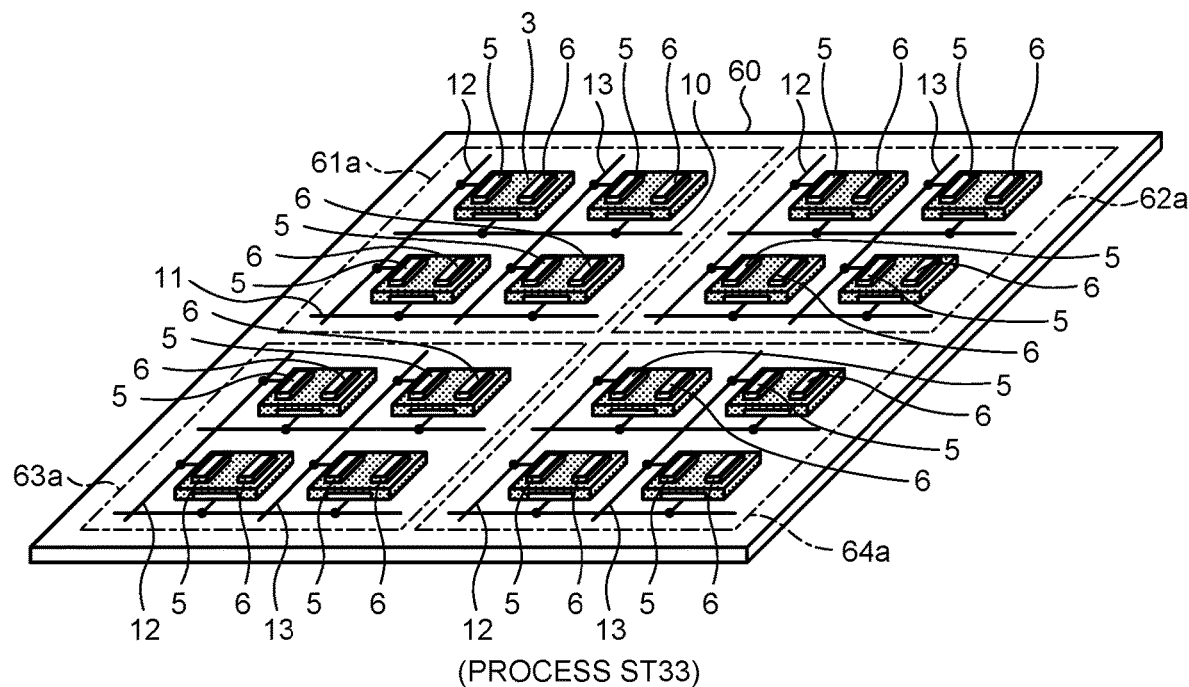
FIG. 20B is a diagram exemplifying a latter half process of the first example of the method for manufacturing the memory array sheet according to the fourth embodiment of the present invention.
Figure 20B:
Figure 20B:
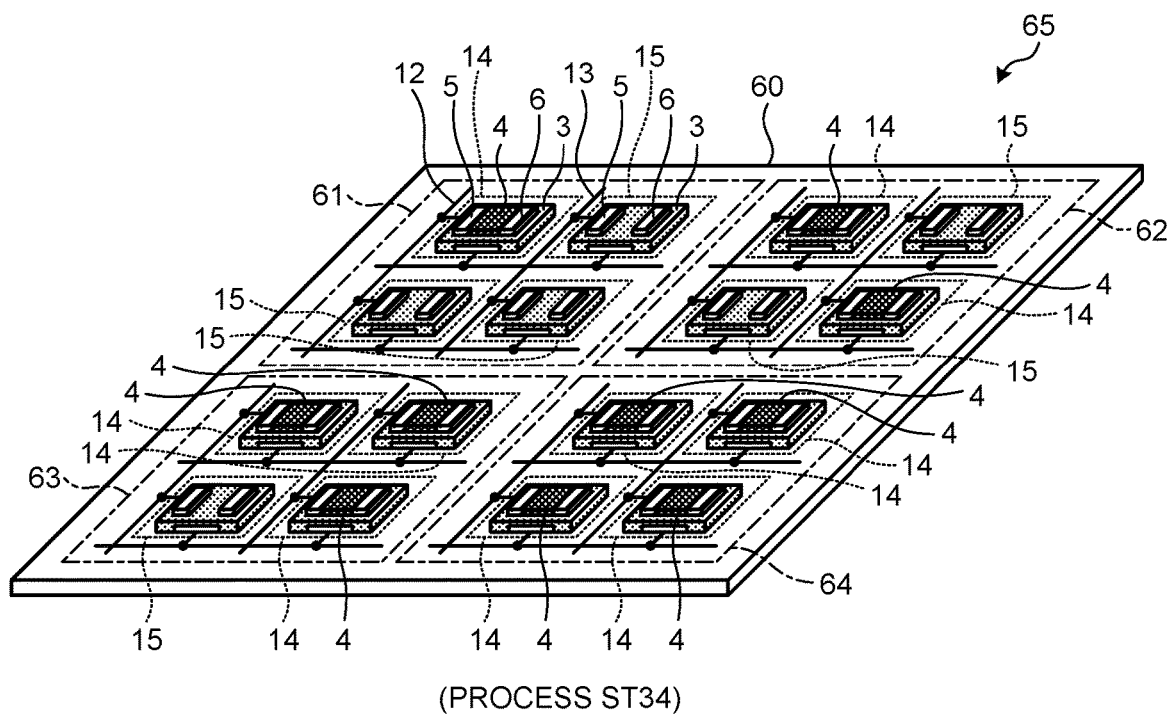

The following first specifically describes a first example of a method for manufacturing the memory array sheet according to the fourth embodiment of the present invention. FIG. 20A is a diagram exemplifying a first half process of the first example of the method for manufacturing the memory array sheet according to the fourth embodiment of the present invention. FIG. 20B is a diagram exemplifying a latter half process of the first example of the method for manufacturing the memory array sheet according to the fourth embodiment of the present invention. The method for manufacturing the memory array sheet as this first example manufactures a memory array sheet having a plurality of memory arrays according to the first embodiment on the same sheet. This method of manufacture includes various kinds of processes to form the memory arrays such as a first electrode and wire forming process, an insulating layer forming process, a second electrode and wire forming process, and an application process.

Specifically, as illustrated in FIG. 20A, first, the first electrode and wire forming process (Process ST31) is performed. In this Process ST31, at least one word line (the word lines 10 and 11, for example) and a plurality of third electrodes 2 are simultaneously formed on the sheet 60 by the above method, or vacuum deposition through a mask, for example. In this process, when there are some necessary word lines apart from the word lines 10 and 11 illustrated in FIG. 20A, a necessary number of word lines are formed so as to be arranged spaced apart from each other with a certain direction as being long. The same number of the third electrodes 2 as the number of the memory elements to be manufactured are formed on the sheet 60. These word lines 10 and 11 and the third electrodes 2 are formed so as to be electrically connected to each other via wires in the process of the vacuum deposition through a mask. As illustrated in FIG. 20A, such formation of the word lines 10 and 11 and the third electrodes 2 is performed for each of a plurality of areas 61a to 64a of the sheet 60. These areas 61a to 64a are areas in which the memory arrays 61 to 64 in the fourth embodiment are formed, respectively.

Next, as illustrated in FIG. 20A, the insulating layer forming process (Process ST32) is performed. In this Process ST32, a plurality of insulating layers 3 are formed on the sheet 60 in correspondence with the third electrodes 2 by the above methods, or printing, for example. Each of the insulating layers 3 is in contact with the third electrode 2 from above and interposes the third electrode 2 between the insulating layer 3 and the sheet 60 to cover the third electrode 2. As illustrated in FIG. 20A, such formation of the insulating layers 3 is performed for each of the areas 61a to 64a.

Next, as illustrated in FIG. 20B, the second electrode and wire forming process (Process ST33) is performed. In this Process ST33, a plurality of bit lines (the bit lines 12 and 13, for example) and a plurality of pairs of the first electrode 5 and the second electrode 6 are simultaneously formed by the above method, or vacuum deposition through a mask, for example. In this process, the bit lines 12 and 13 are formed on the sheet 60 so as to be arranged spaced apart from each other with a direction crossing the word lines 10 and 11 as being long. When there are some necessary bit lines apart from the bit lines 12 and 13 illustrated in FIG. 20B, a necessary number of bit lines are formed similarly to these bit lines 12 and 13. The same number of the first electrodes 5 and the second electrodes 6 as the number of the memory elements to be manufactured are formed on the corresponding insulating layers 3. These bit lines 12 and 13 and the first electrodes 5 are formed so as to be electrically connected to each other via wires in the process of the vacuum deposition through a mask. As illustrated in FIG. 20B, such formation of the bit lines 12 and 13, the first electrodes 5, and the second electrodes 6 is performed for each of the areas 61a to 64a.

Next, as illustrated in FIG. 20B, the application process (Process ST34) is performed. The applied layer to be applied in this Process ST34 is the semiconductor layer 4. In this Process ST34, a memory element to which the applied layer is to be applied is selected out of the memory elements on the sheet 60 in correspondence with information to be recorded. Next, the semiconductor layer 4 is formed by application in the area between the first electrode 5 and the second electrode 6 of the selected memory element to which the applied layer is to be applied (the memory element 14 in FIG. 20B). A solution containing CNT is applied to the area between the first electrode 5 and the second electrode 6 of the memory element 14 and is dried as needed to form the semiconductor layer 4, for example. In contrast, the semiconductor element 4 is not formed in a memory element not selected as the memory element to which the applied layer is to be applied (the memory element 15 in FIG. 11) out of the memory elements.

Thus, the memory elements on the sheet 60 are separately manufactured into the two kinds of memory elements different from each other in electrical characteristics (that is, different from each other in information to be recorded) by the presence or absence of the semiconductor layer 4. Consequently, memory arrays 61, 62, 63, and 64 are formed on the sheet 60. In this process, the memory arrays 61, 62, 63, and 64 are made different from each other in the arrangement of the memory element 14 having the semiconductor layer 4 and the memory element 15 not having the semiconductor layer 4. The respective pieces of unique information of the memory arrays 61, 62, 63, and 64 are determined by such any arrangement of the memory elements 14 and 15. Consequently, these memory arrays 61, 62, 63, and 64 record respective pieces of information different from each other as the pieces of unique information, and the memory array sheet 65 having these memory arrays 61, 62, 63, and 64 can be manufactured.

The application in Process ST34, which is not limited to a particular method, is preferably any one selected from the group consisting of ink jetting, dispensing, and spraying. Among them, ink jetting is more preferred as the application in view of the pattern processability of the electrode and the wire and raw material use efficiency.

Figure 21A:
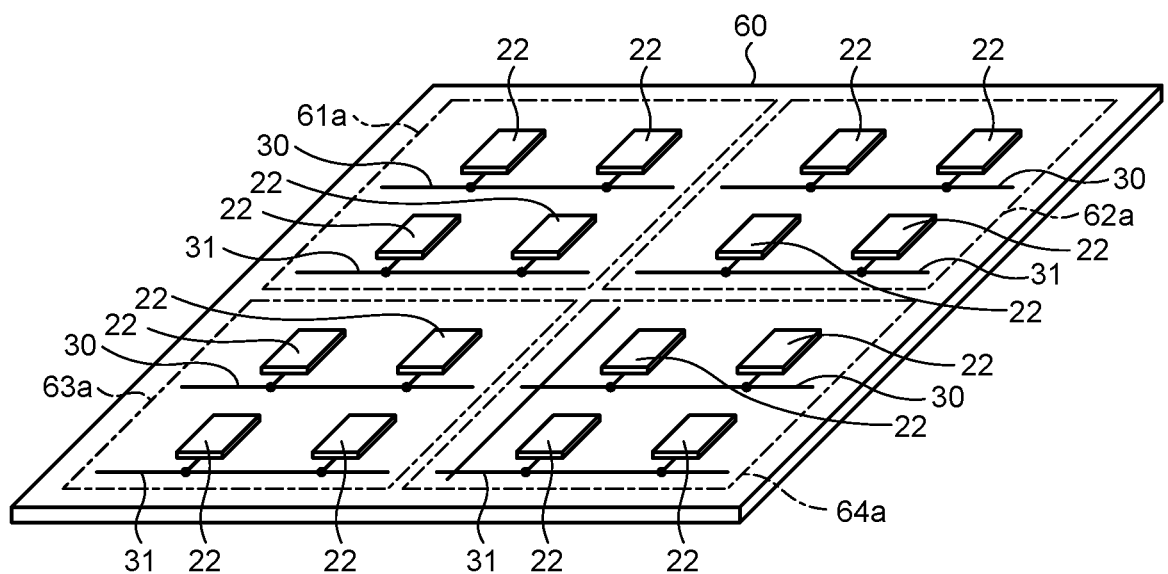
FIG. 21A is a diagram exemplifying a first half process of a second example of the method for manufacturing the memory array sheet according to the fourth embodiment of the present invention.
Figure 21A:
Figure 21A:
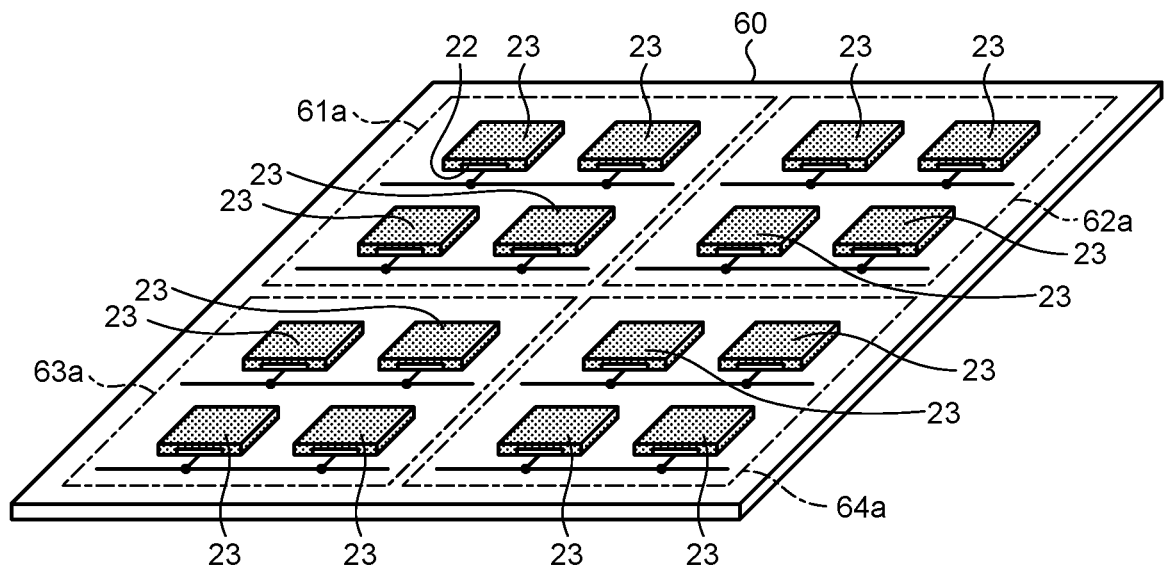
Figure 21B:
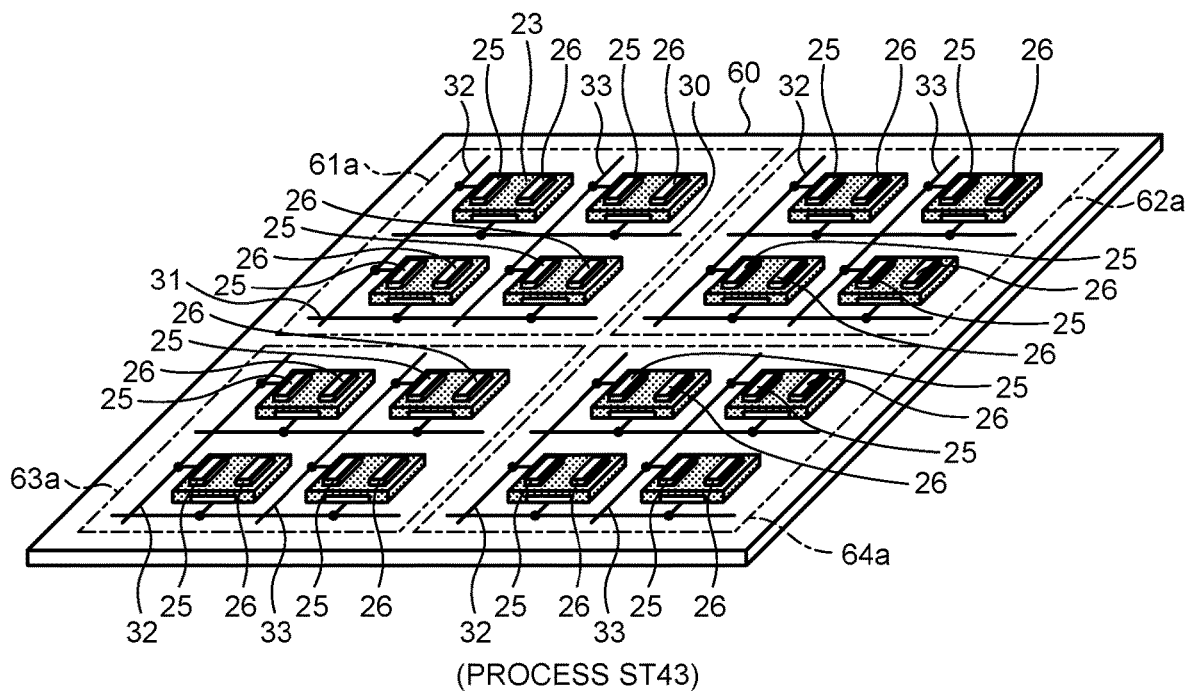
FIG. 21B is a diagram exemplifying a latter half process of the second example of the method for manufacturing the memory array sheet according to the fourth embodiment of the present invention.
Figure 21B:
Figure 21B:
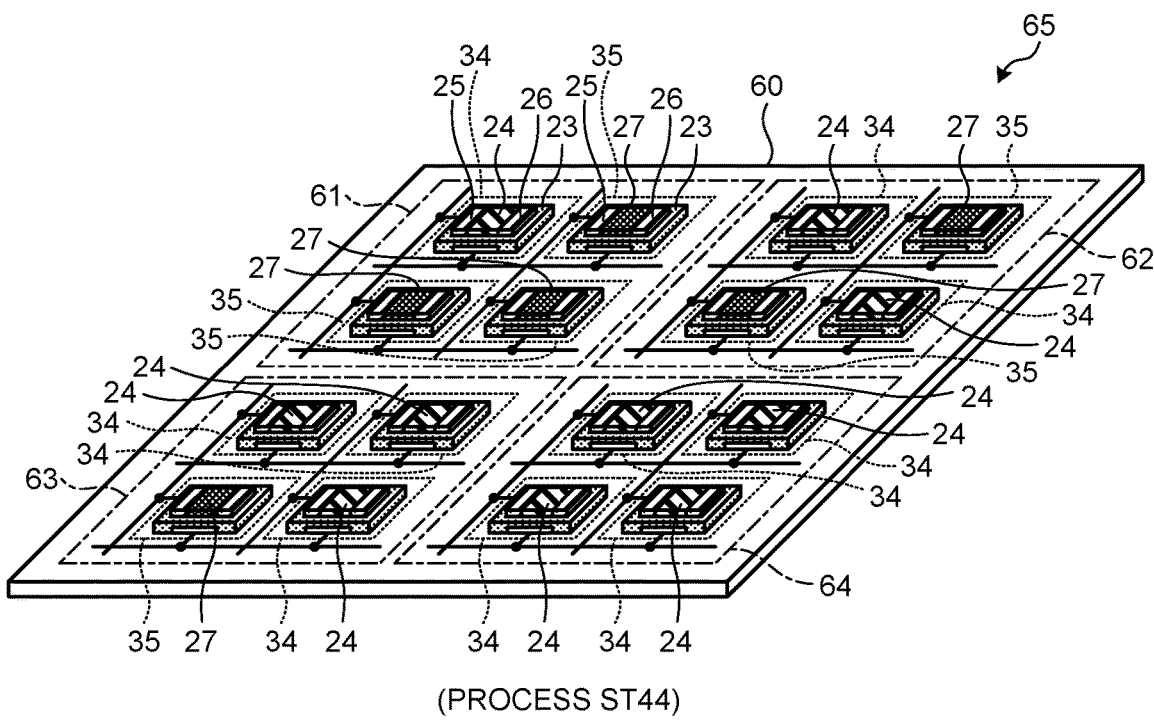

The following specifically describes a second example of the method for manufacturing the memory array sheet according to the fourth embodiment of the present invention. FIG. 21A is a diagram exemplifying a first half process of the second example of the method for manufacturing the memory array sheet according to the fourth embodiment of the present invention. FIG. 21B is a diagram exemplifying a latter half process of the second example of the method for manufacturing the memory array sheet according to the fourth embodiment of the present invention. The method for manufacturing the memory array sheet as this second example manufactures a memory array sheet having a plurality of memory arrays according to the second embodiment on the same sheet. This method of manufacture includes various kinds of processes to form the memory arrays such as a first electrode and wire forming process, an insulating layer forming process, a second electrode and wire forming process, and an application process.

Specifically, as illustrated in FIG. 21A, first, the first electrode and wire forming process (Process ST41) is performed. In this Process ST41, at least one word line (the word lines 30 and 31, for example) and a plurality of third electrodes 22 are simultaneously formed on the sheet 60 by the above method, or vacuum deposition through a mask, for example. In this process, when there are some necessary word lines apart from the word lines 30 and 31 illustrated in FIG. 21A, a necessary number of word lines are formed so as to be arranged spaced apart from each other with a certain direction as being long. The same number of the third electrodes 22 as the number of the memory elements to be manufactured are formed on the sheet 60. These word lines 30 and 31 and the third electrodes 22 are formed so as to be electrically connected to each other via wires in the process of the vacuum deposition through a mask. As illustrated in FIG. 21A, such formation of the word lines 30 and 31 and the third electrodes 22 is performed for each of the areas 61a to 64a of the sheet 60.

Next, as illustrated in FIG. 21A, the insulating layer forming process (Process ST42) is performed. In this Process ST42, a plurality of insulating layers 23 are formed on the sheet 60 in correspondence with the third electrodes 22 by the above method, or printing, for example. Each of the insulating layers 23 is in contact with the third electrode 22 from above and interposes the third electrode 22 between the insulating layer 23 and the sheet 60 to cover the third electrode 22. As illustrated in FIG. 21A, such formation of the insulating layers 23 is performed for each of the areas 61a to 64a.

Next, as illustrated in FIG. 21B, the second electrode and wire forming process (Process ST43) is performed. In this Process ST43, a plurality of bit lines (the bit lines 32 and 33, for example) and a plurality of pairs of the first electrode 25 and the second electrode 26 are simultaneously formed by the above method, or vacuum deposition through a mask, for example. In this process, the bit lines 32 and 33 are formed on the sheet 60 so as to be arranged spaced apart from each other with a direction crossing the word lines 30 and 31 as being long. When there are some necessary bit lines apart from the bit lines 32 and 33 illustrated in FIG. 21B, a necessary number of bit lines are formed similarly to these bit lines 32 and 33. The same number of the first electrodes 25 and the second electrodes 26 as the number of the memory elements to be manufactured are formed on the corresponding insulating layers 23. These bit lines 32 and 33 and the first electrodes 25 are formed so as to be electrically connected to each other via wires in the process of the vacuum deposition through a mask. As illustrated in FIG. 21B, such formation of the bit lines 32 and 33, the first electrodes 25, and the second electrodes 26 is performed for each of the areas 61a to 64a.

Next, as illustrated in FIG. 21B, the application process (Process ST44) is performed. The applied layers to be applied in this Process ST44 are the semiconductor layers 24 and 27 different from each other in electrical characteristics. In this Process ST44, the semiconductor layer 24 or the semiconductor layer 27 is formed by application in the area between the first electrode 25 and the second electrode 26 of each of the memory elements on the sheet 60 in correspondence with information to be recorded. A solution containing CNT is applied to the area between the first electrode 25 and the second electrode 26 of the memory element 34 and is dried as needed to form the semiconductor layer 24, for example. A solution containing P3HT is applied to the area between the first electrode 25 and the second electrode 26 of the memory element 35 and is dried as needed to form the semiconductor layer 27.

Thus, the memory elements on the sheet 60 are separately manufactured into the two kinds of memory elements different from each other in electrical characteristics (that is, different from each other in information to be recorded) depending on which of the semiconductor layers 24 and 27 is included therein. Consequently, the memory arrays 61, 62, 63, and 64 are formed on the sheet 60. In this process, the memory arrays 61, 62, 63, and 64 are made different from each other in the arrangement of the memory element 34 having the semiconductor layer 24 and the memory element 35 having the semiconductor layer 27. The respective pieces of unique information of the memory arrays 61, 62, 63, and 64 are determined by such any arrangement of the memory elements 34 and 35. Consequently, these memory arrays 61, 62, 63, and 64 record respective pieces of information different from each other as the pieces of unique information, and the memory array sheet 65 having these memory arrays 61, 62, 63, and 64 can be manufactured.

The application in Process ST44 is preferably any one selected from the group consisting of ink jetting, dispensing, and spraying similarly to the application process (Process ST34) in the method of manufacture as the first example. Among them, ink jetting is more preferred.

Figure 22A:
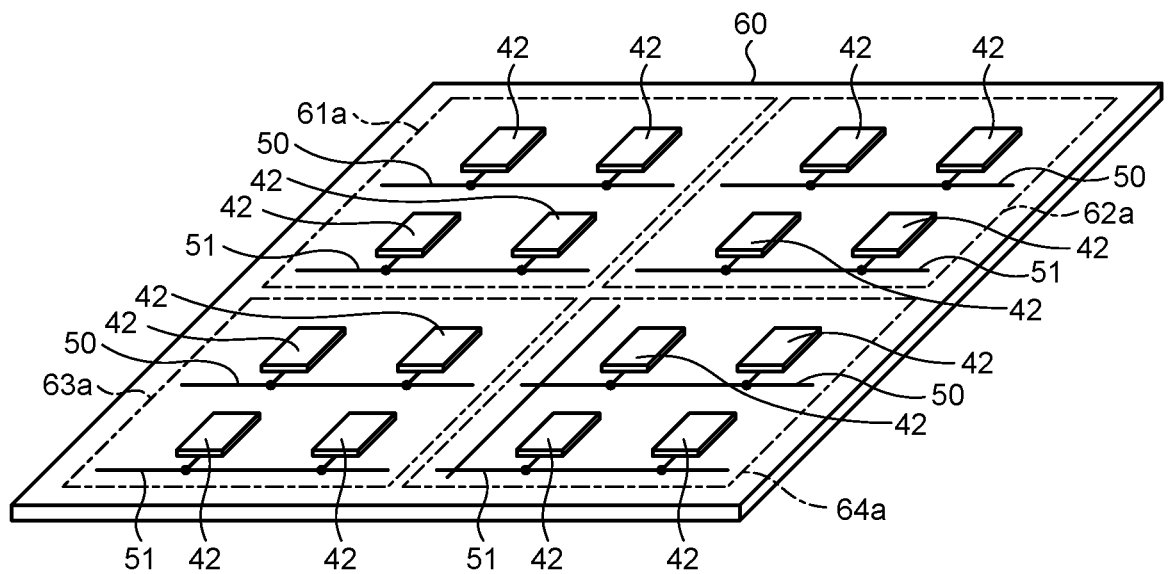
FIG. 22A is a diagram exemplifying a first half process of a third example of the method for manufacturing the memory array sheet according to the fourth embodiment of the present invention.
Figure 22A:
Figure 22A:
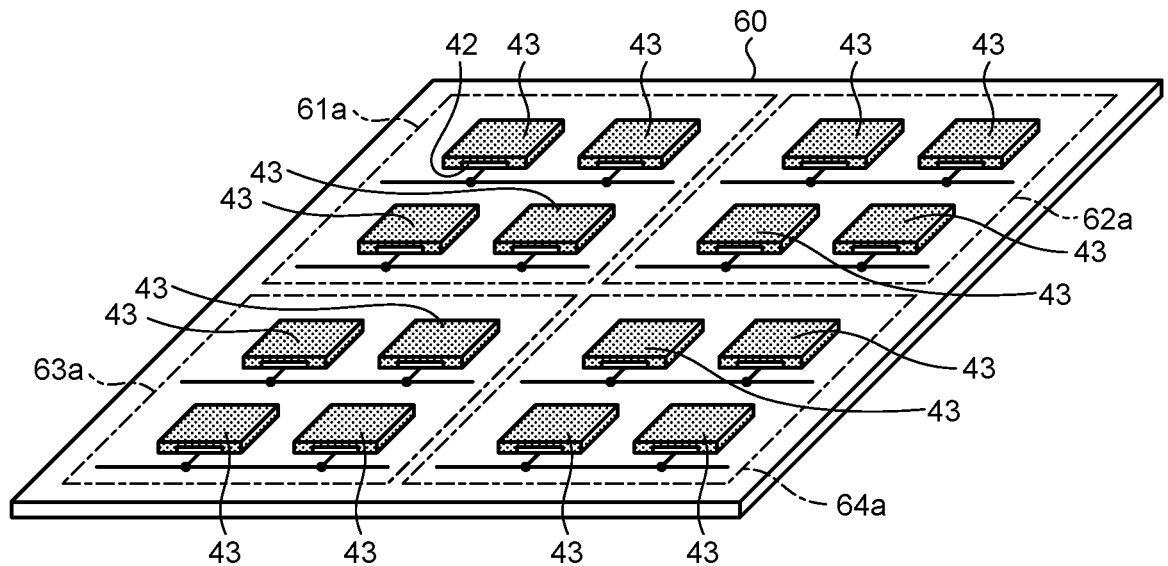
Figure 22B:
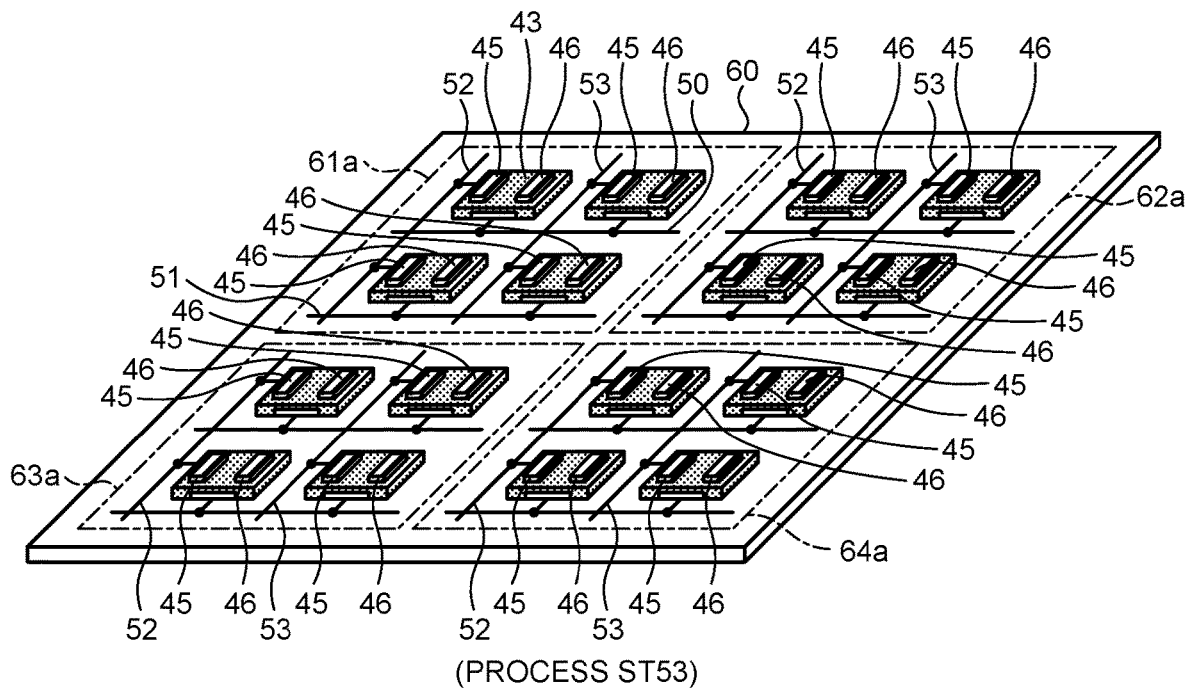
FIG. 22B is a diagram exemplifying a latter half process of the third example of the method for manufacturing the memory array sheet according to the fourth embodiment of the present invention.
Figure 22B:
Figure 22B:
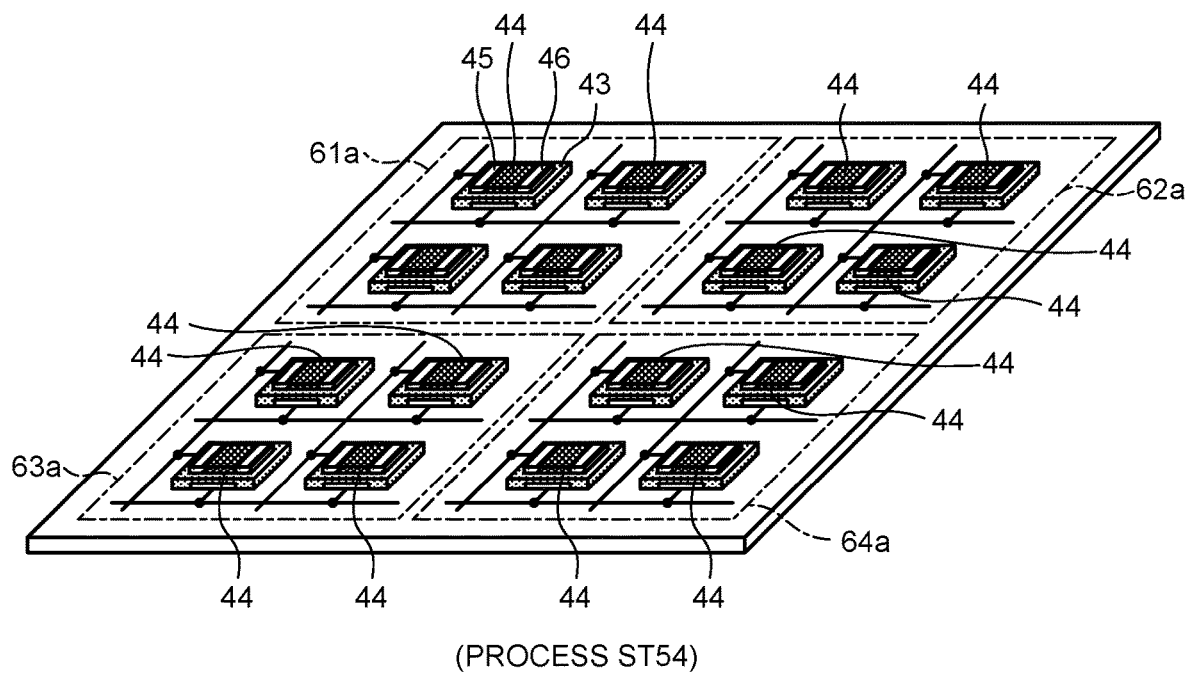
Figure 22C:
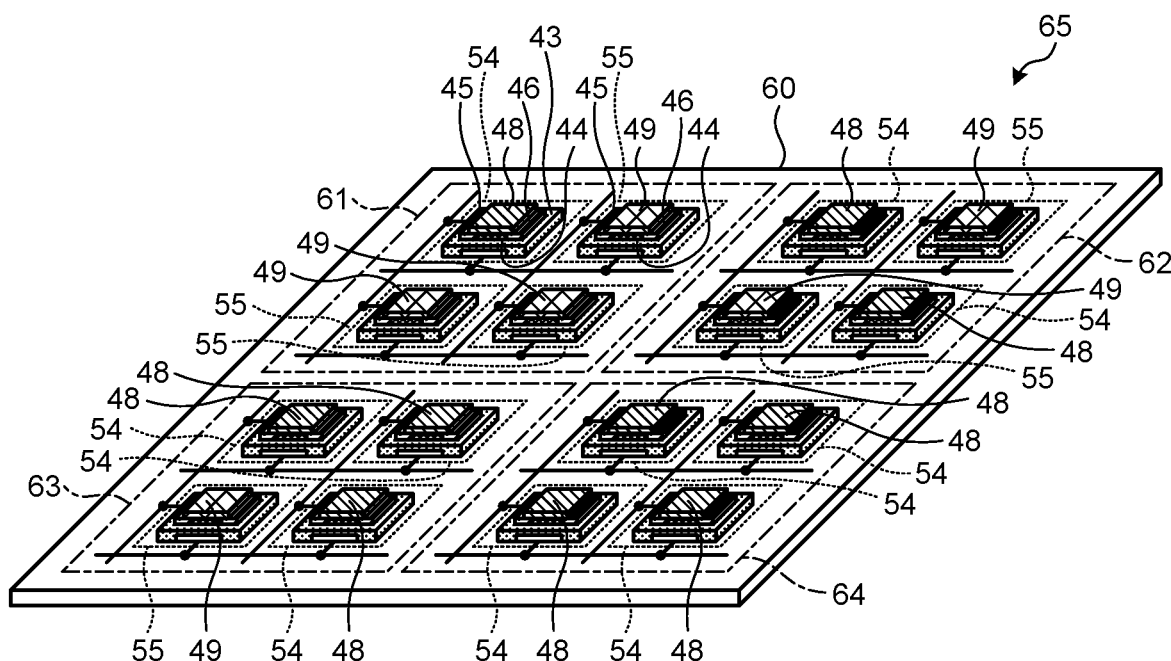
FIG. 22C is a diagram exemplifying an application process of the third example of the method for manufacturing the memory array sheet according to the fourth embodiment of the present invention.

The following specifically describes a third example of the method for manufacturing the memory array sheet according to the fourth embodiment of the present invention. FIG. 22A is a diagram exemplifying a first half process of the third example of the method for manufacturing the memory array sheet according to the fourth embodiment of the present invention. FIG. 22B is a diagram exemplifying a latter half process of the third example of the method for manufacturing the memory array sheet according to the fourth embodiment of the present invention. FIG. 22C is a diagram exemplifying an application process of the third example of the method for manufacturing the memory array sheet according to the fourth embodiment of the present invention. The method for manufacturing the memory array sheet as this third example manufactures a memory array sheet having a plurality of memory arrays according to the third embodiment on the same sheet. This method of manufacture includes various kinds of processes to form the memory arrays such as a first electrode and wire forming process, an insulating layer forming process, a second electrode and wire forming process, a semiconductor layer forming process, and an application process.

Specifically, as illustrated in FIG. 22A, first, the first electrode and wire forming process (Process ST51) is performed. In this Process ST51, at least one word line (the word lines 50 and 51, for example) and a plurality of third electrodes 42 are simultaneously formed on the sheet 60 by the above method, or by applying a silver fine particle dispersion liquid, which is then dried and baked as needed, for example. In this process, when there are some necessary word lines apart from the word lines 50 and 51 illustrated in FIG. 22A, a necessary number of word lines are formed so as to be arranged spaced apart from each other with a certain direction as being long. The same number of the third electrodes 42 as the number of the memory elements to be manufactured are formed on the sheet 60. These word lines 50 and 51 and the third electrodes 42 are formed so as to be electrically connected to each other via wires in the process of the application of the silver fine particle dispersion liquid. As illustrated in FIG. 22A, such formation of the word lines 50 and 51 and the third electrodes 42 is performed for each of the areas 61a to 64a of the sheet 60.

Next, as illustrated in FIG. 22A, the insulating layer forming process (Process ST52) is performed. In this Process ST52, a plurality of insulating layers 43 are formed on the sheet 60 in correspondence with the third electrodes 42 by the above method, or printing, for example. Each of the insulating layers 43 is in contact with the third electrode 42 from above and interposes the third electrode 42 between the insulating layer 43 and the sheet 60 to cover the third electrode 42. As illustrated in FIG. 22A, such formation of the insulating layers 43 is performed for each of the areas 61a to 64a.

Next, as illustrated in FIG. 22B, the second electrode and wire forming process (Process ST53) is performed. In this Process ST53, a plurality of bit lines (the bit lines 52 and 53, for example) and a plurality of pairs of the first electrode 45 and the second electrode 46 are simultaneously formed by the above method, or by applying a silver fine particle dispersion liquid using the same material, which is then dried and baked as needed, for example. In this process, the bit lines 52 and 53 are formed on the sheet 60 so as to be arranged spaced apart from each other with a direction crossing the word lines 50 and 51 as being long. When there are some necessary bit lines apart from the bit lines 52 and 53 illustrated in FIG. 22B, a necessary number of bit lines are formed similarly to these bit lines 52 and 53. The same number of the first electrodes 45 and the second electrodes 46 as the number of the memory elements to be manufactured are formed on the corresponding insulating layers 43. These bit lines 52 and 53 and the first electrodes 45 are formed so as to be electrically connected to each other via wires in the process of the application of the silver fine particle dispersion liquid. As illustrated in FIG. 22B, such formation of the bit lines 52 and 53, the first electrodes 45, and the second electrodes 46 is performed for each of the areas 61a to 64a.

Next, as illustrated in FIG. 22B, the semiconductor layer forming process (Process ST54) is performed. In this Process ST54, the semiconductor layer 44 is formed in the area between the first electrode 45 and the second electrode 46 of each of the memory elements to be manufactured so as to be in contact with the insulating layer 43. A solution containing CNT is applied to the area between the first electrode 45 and the second electrode 46 as components of the memory element 54 (refer to FIG. 22C) and is dried as needed to form the semiconductor layer 44 being in contact with the upper face of the insulating layer 43, for example. Similarly, the semiconductor layer 44 is formed in the area between the first electrode 45 and the second electrode 46 as components of the memory element 55 (refer to FIG. 22C). As illustrated in FIG. 22B, such formation of the semiconductor layers 44 is performed for each of the areas 61a to 64a.

Next, as illustrated in FIG. 22C, the application process (Process ST55) is performed. The applied layer to be applied in this Process ST55 is the first insulating layer 48 or the second insulating layer 49 different from each other in electrical characteristics. In this Process ST55, the first insulating layer 48 or the second insulating layer 49 is formed in the area between the first electrode 45 and the second electrode 46 of each of the memory elements on the sheet 60 so as to be in contact with the semiconductor layer 44 from a side opposite the insulating layer 43 in correspondence with information to be recorded. For the memory element 54, a solution containing an insulating material for forming the first insulating layer 48 is applied to the area between the first electrode 45 and the second electrode 46 so as to cover the semiconductor layer 44 and is dried as needed to form the first insulating layer 48, for example. For the memory element 55, a solution containing an insulating material for forming the second insulating layer 49 is applied to the area between the first electrode 45 and the second electrode 46 so as to cover the semiconductor layer 44 and is dried as needed to form the second insulating layer 49.

Thus, the memory elements on the sheet 60 are separately manufactured into the two kinds of memory elements different from each other in electrical characteristics (that is, different from each other in information to be recorded) depending on which of the first insulating layer 48 and the second insulating layer 49 is included therein. Consequently, the memory arrays 61, 62, 63, and 64 are formed on the sheet 60. In this process, the memory arrays 61, 62, 63, and 64 are made different from each other in the arrangement of the memory element 54 having the first insulating layer 48 and the memory element 55 having the second insulating layer 49. The respective pieces of unique information of the memory arrays 61, 62, 63, and 64 are determined by such any arrangement of the memory elements 54 and 55. Consequently, these memory arrays 61, 62, 63, and 64 record respective pieces of information different from each other as the pieces of unique information, and the memory array sheet 65 having these memory arrays 61, 62, 63, and 64 can be manufactured.

The application in Process ST55 is preferably any one selected from the group consisting of ink jetting, dispensing, and spraying similarly to the application process (Process ST34) in the method of manufacture as the first example. Among them, ink jetting is more preferred.

Figure 23A:
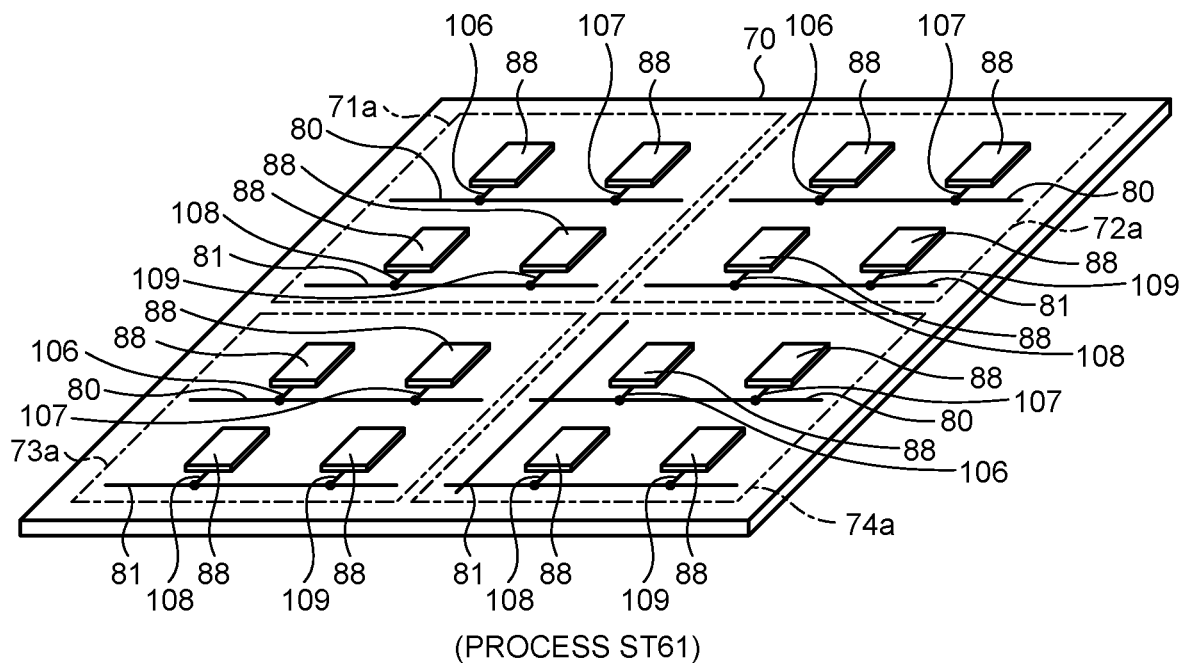
FIG. 23A is a diagram exemplifying a first half process of a method for manufacturing the memory array sheet according to the fifth embodiment of the present invention.
Figure 23A:
Figure 23A:
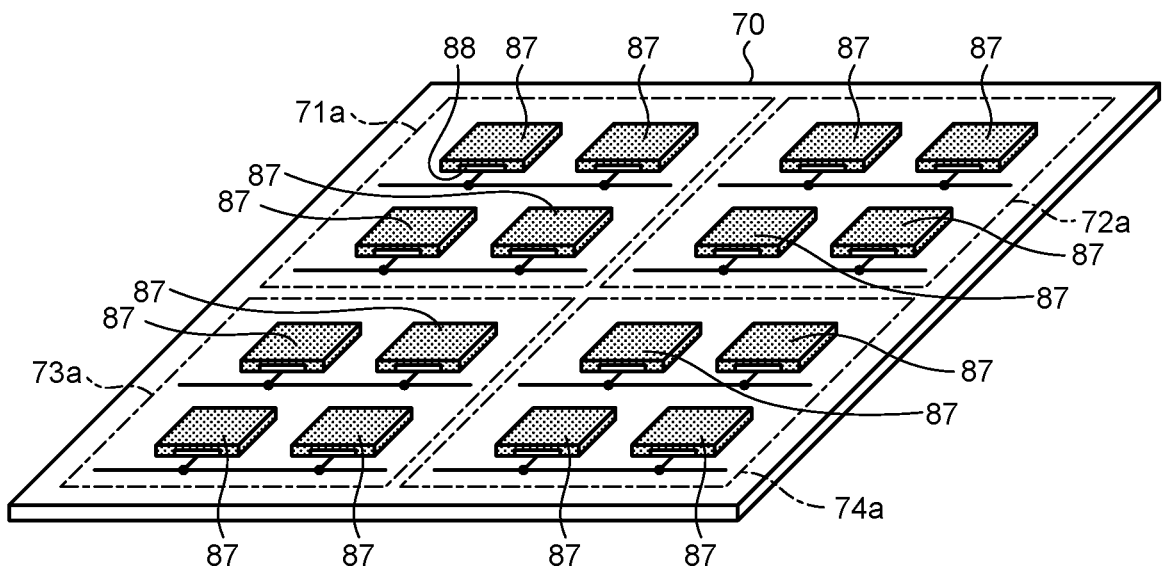
Figure 23B:
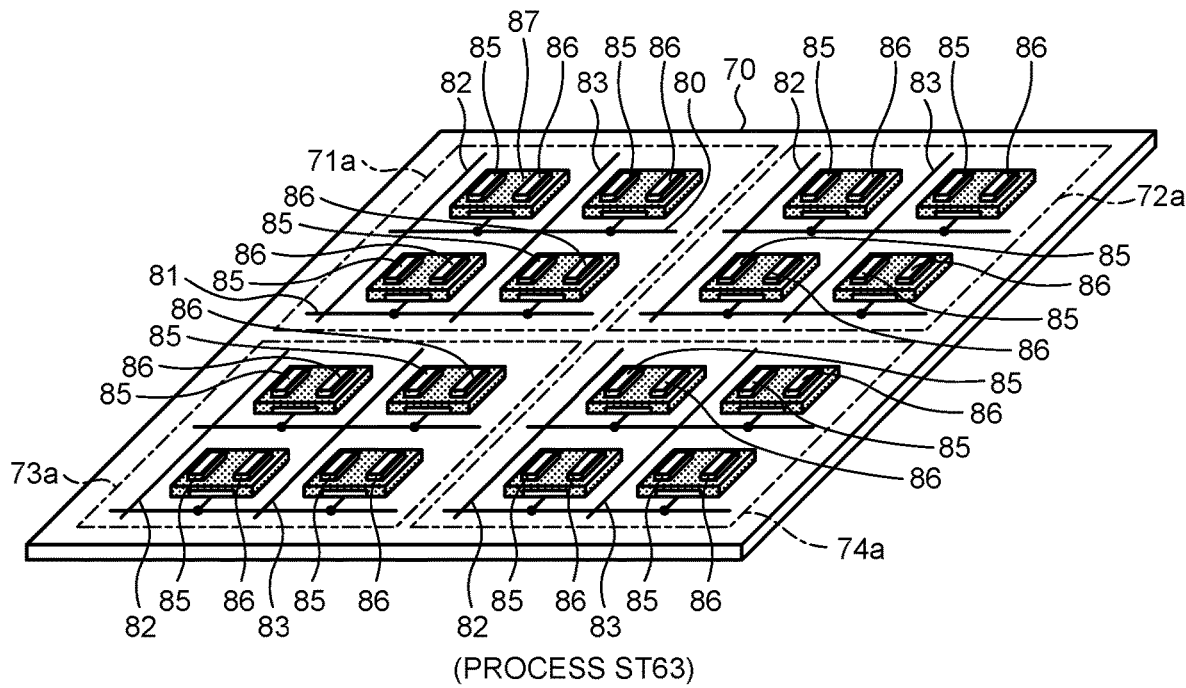
FIG. 23B is a diagram exemplifying a latter half process of the method for manufacturing the memory array sheet according to the fifth embodiment of the present invention.
Figure 23B:
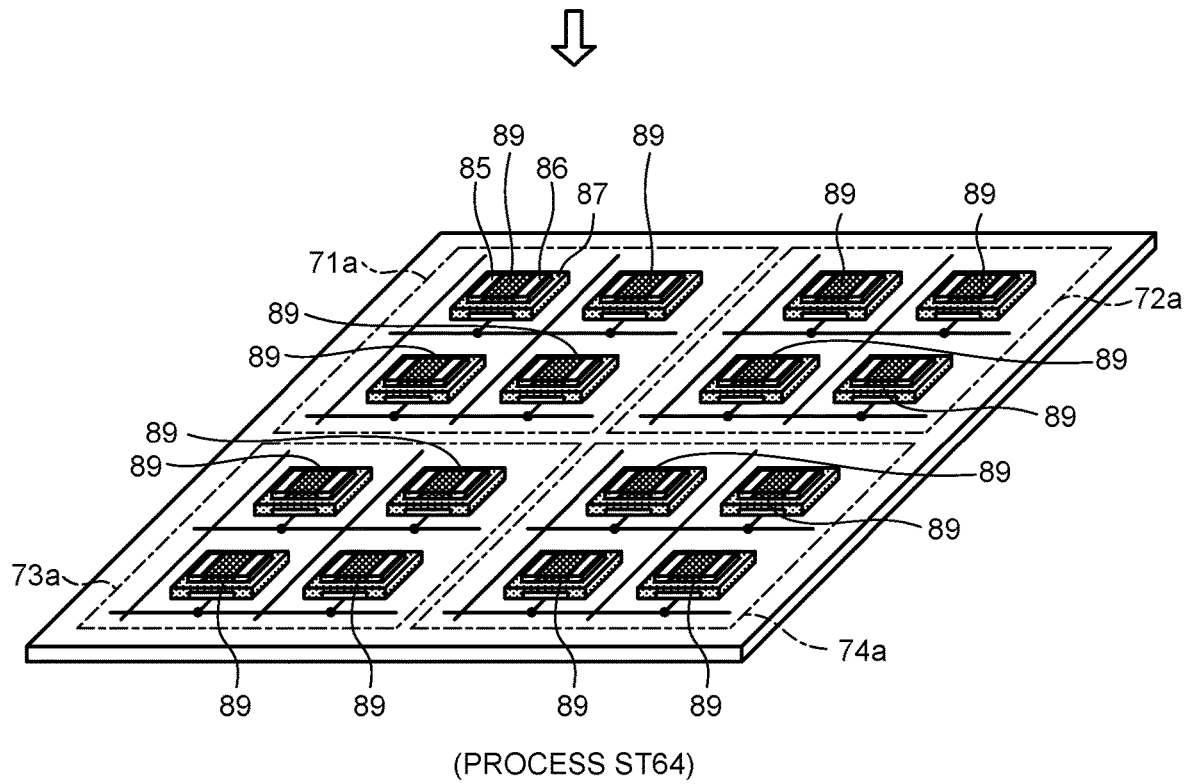
Figure 23C:
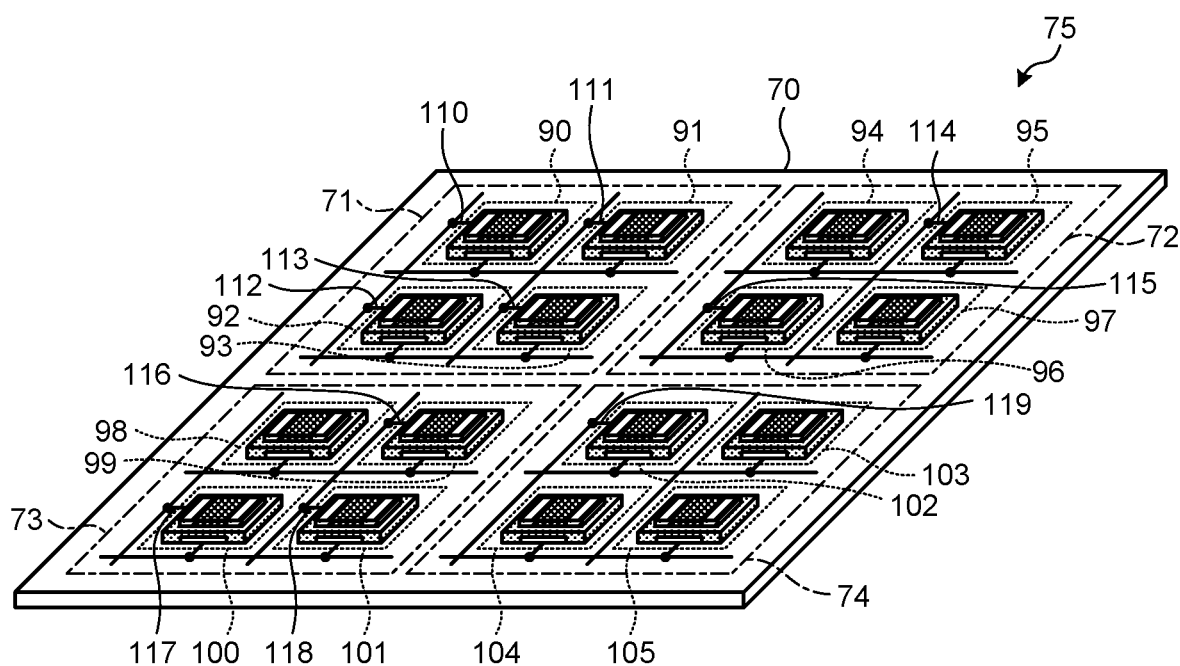
FIG. 23C is a diagram exemplifying an application process of the method for manufacturing the memory array sheet according to the fifth embodiment of the present invention.

The following specifically describes a method for manufacturing the memory array sheet according to the fifth embodiment of the present invention. FIG. 23A is a diagram exemplifying a first half process of the method for manufacturing the memory array sheet according to the fifth embodiment of the present invention. FIG. 23B is a diagram exemplifying a latter half process of the method for manufacturing the memory array sheet according to the fifth embodiment of the present invention. FIG. 23C is a diagram exemplifying an application process of the method for manufacturing the memory array sheet according to the fifth embodiment of the present invention. The method for manufacturing the memory array sheet according to the fifth embodiment of the present invention includes various kinds of processes to form a plurality of memory arrays included in this memory array sheet such as a first electrode and wire forming process, an insulating layer forming process, a second electrode and wire forming process, a semiconductor layer forming process, and an application process.

Specifically, as illustrated in FIG. 23A, first, the first electrode and wire forming process (Process ST61) is performed. In this Process ST61, at least one word line (the word lines 80 and 81, for example), a plurality of third electrodes 88, and the connecting parts 106 to 109 that electrically connect these words lines 80 and 81 and the third electrodes 88 to each other are simultaneously formed on the sheet 70 by the above method, or by applying a silver fine particle dispersion liquid, which is then dried and baked as needed, for example. In this process, when there are some necessary word lines apart from the word lines 80 and 81 illustrated in FIG. 23A, a necessary number of word lines are formed so as to be arranged spaced apart from each other with a certain direction as being long. The same number of the third electrodes 88 as the number of the memory elements to be manufactured are formed on the sheet 70. As illustrated in FIG. 23A, such formation of the word lines 80 and 81, the third electrodes 88, and the connecting parts 106 to 109 is performed for each of a plurality of areas 71a to 74a of the sheet 70. These areas 71a to 74a are areas in which the memory arrays 71 to 74 in the fifth embodiment are formed, respectively.

Next, as illustrated in FIG. 23A, the insulating layer forming process (Process ST62) is performed. In this Process ST62, a plurality of insulating layers 87 are formed on the sheet 70 in correspondence with the third electrodes 88 by the above method, or printing, for example. Each of the insulating layers 87 is in contact with the third electrode 88 from above and interposes the third electrode 88 between the insulating layer 87 and the sheet 70 to cover the third electrode 88. As illustrated in FIG. 23A, such formation of the insulating layers 87 is performed for each of the areas 71a to 74a.

Next, as illustrated in FIG. 23B, the second electrode and wire forming process (Process ST63) is performed. In this Process ST63, a plurality of bit lines (the bit lines 82 and 83, for example) and a plurality of pairs of the first electrode 85 and the second electrode 86 are simultaneously formed by the above method, or by applying a silver fine particle dispersion liquid, which is then dried and baked as needed, for example. In this process, the bit lines 82 and 83 are formed on the sheet 70 so as to be arranged spaced apart from each other with a direction crossing the word lines 80 and 81 as being long. When there are some necessary bit lines apart from the bit lines 82 and 83 illustrated in FIG. 23B, a necessary number of bit lines are formed similarly to these bit lines 82 and 83. The same number of the first electrodes 85 and the second electrodes 86 as the number of the memory elements to be manufactured are formed on the corresponding insulating layers 87. As illustrated in FIG. 23B, such formation of the bit lines 82 and 83, the first electrodes 85, and the second electrodes 86 is performed for each of the areas 71a to 74a.

Next, as illustrated in FIG. 23B, the semiconductor layer forming process (Process ST64) is performed. In this process ST64, the semiconductor layer 89 is formed in the area between the first electrode 85 and the second electrode 86 of each of the memory elements to be manufactured so as to be in contact with the insulating layer 87. A solution containing CNT is applied to the area between the first electrode 85 and the second electrode 86 as components of the memory element 90 (refer to FIG. 23C) and is dried as needed to form the semiconductor layer 89 being in contact with the upper face of the insulating layer 87, for example. Similarly, the semiconductor layer 89 is formed also in the area between the first electrode 85 and the second electrode 86 as components of each of the memory elements 91 to 105 (refer to FIG. 23C). As illustrated in FIG. 23B, such formation of the semiconductor layers 89 is performed for each of the areas 71a to 74a.

Next, as illustrated in FIG. 23C, the application process (Process ST65) is performed. In this Process ST65, the first wire pattern, in which both the bit line and the word line and the memory element are electrically connected to each other or the second wire pattern, in which at least either the bit line or the word line and the memory element are not electrically connected to each other, is formed by application for each of the memory elements 90 to 105 on the sheet 70. A silver fine particle dispersion liquid is applied to the area between the first electrode and the bit line of each of the memory elements 90 to 93, 95, 96, and 99 to 102 selected out of the memory elements 90 to 105 in correspondence with information to be recorded and is then dried and baked as needed to form the connecting parts 110 to 119, for example. In this case, the memory elements 90 to 93, 95, 96, and 99 to 102 for which the connecting parts 110 to 119 have been formed, respectively, are the memory elements with the first wire pattern. The memory elements 94, 97, 98, and 103 to 105 for which the connecting parts 110 to 119 have not been formed are the memory elements with the second wire pattern.

Thus, the memory elements on the sheet 70 are separately manufactured into the two kinds of memory elements different from each other in electrical characteristics (that is, different from each other in information to be recorded) depending on which of the first wire pattern and the second wire pattern is included therein. Consequently, the memory arrays 71, 72, 73, and 74 are formed on the sheet 70. In this process, the memory arrays 71, 72, 73, and 74 are made different from each other in the arrangement of the memory element with the first wire pattern having the connecting part that electrically connects the bit line and the first electrode to each other and the memory element with the second wire pattern not having the connecting part that electrically connects the bit line and the first electrode to each other. The respective pieces of unique information of the memory arrays 71, 72, 73, and 74 are determined by such any arrangement of the two kinds of memory elements. Consequently, these memory arrays 71, 72, 73, and 74 record respective pieces of information different from each other as the pieces of unique information, and the memory array sheet 75 having these memory arrays 71, 72, 73, and 74 can be manufactured.

The application in Process ST65 is preferably any one selected from the group consisting of ink jetting, dispensing, and spraying similarly to the application process (Process ST34) in the method of manufacture as the first example. Among them, ink jetting is more preferred.

Although the method for manufacturing the memory array sheet according to the fifth embodiment separately manufactures the first wire pattern having the connecting part that electrically connects the bit line and the first electrode to each other and the second wire pattern not having the connecting part that electrically connects the bit line and the first electrode to each other by application, the present invention is not limited to this example; the second wire pattern may be a wire pattern that lacks at least one of electric connection between the bit line and the first electrode, electric connection between the first electrode and the second electrode, and electric connection between the word line and the third electrode, and the second wire pattern and the first wire pattern "including the first electrode electrically connected to the bit line, the second electrode electrically connected to the first electrode via the semiconductor layer, and the third electrode electrically connected to the word line" may be separately manufactured by selecting whether the connecting parts or the various kinds of electrodes are formed for each of the memory elements by application, for example.

As described above, when the memory array sheet having the memory array according to the first and the second embodiments of the present invention is manufactured, a batch process can be used that forms the respective components of all the memory elements to be manufactured on the same substrate in a batch manner in the processes before forming the semiconductor layer. After that, the semiconductor layer can be formed selectively only in a specific memory element by application, or the two kinds of semiconductor layers different from each other in electrical characteristics can be separately made for each of the memory elements by application.

When the memory array sheet having the memory arrays according to the third embodiment of the present invention is manufactured, a batch process can be used that forms the respective components of all the memory elements to be manufactured on the same substrate in a batch manner in the processes until forming the semiconductor layer. After that, the first insulating layer and the second insulating layer different from each other in the component material can be separately made for each of the memory elements by application.

When the memory array sheet according to the fifth embodiment of the present invention is manufactured, a batch process can be used that forms the respective components of all the memory elements to be manufactured on the same sheet in a batch manner in the processes until forming the semiconductor layer. After that, the connecting parts that electrically connect the wires such as a bit line and the memory elements can be separately made for each of the memory elements by application.

In any of the methods for manufacturing the memory array sheet, memory elements that can record information of either "0" or "1" can be separately manufactured by the same process using a simple method, or application.

Any of such methods for manufacturing the memory array sheet is advantageous in terms of processes and costs when many memory arrays different from each other in recorded unique information are manufactured on the same sheet. The memory arrays different form each other in recorded information are different from each other in arrangement with any combination of the memory element recording information of "0" and the memory element recording information of "1." When memory arrays are formed such that the arrangement of these two kinds of memory elements is different from one memory array to another, processes and costs generally increase. When many memory arrays different from each other in recorded information are manufactured, a photomask corresponding to information to be recorded is required to be prepared for each of the memory arrays, for example; the size of the photomask is limited, and the number of manufacturable memory arrays is limited in accordance with the mask size. For this reason, when memory arrays different from each other in recorded unique information are further manufactured on the same sheet, another photomask corresponding to the unique information is required to be prepared. The method for manufacturing the memory array sheet according to the fourth and the fifth embodiments of the present invention can change the position of a memory element in which the applied layer such as the semiconductor layer, the first insulating layer, or the second insulating layer or the wire pattern such as the connecting part is to be formed for each of the memory arrays simply without using any mask and can thereby manufacture many kinds of memory arrays different from each other in the arrangement of the two kinds of memory elements. Consequently, a memory array sheet in which many memory arrays different from each other in recorded information are formed on the same sheet can be manufactured by simple processes and at low costs. Such a memory array sheet is cut into each memory array, whereby these many memory arrays can be obtained simply.

<Wireless Communication Apparatus>

The following describes a wireless communication apparatus including the memory array according to the present invention. This wireless communication apparatus is an apparatus that receives a wireless signal (a carrier wave) transmitted from an antenna installed in a reader/writer to perform electric communication such as an RFID tag.

A specific operation of the RFID tag as an example of the wireless communication apparatus is as follows, for example. An antenna of the RFID tag receives the wireless signal transmitted from the antenna installed in the reader/writer. The received wireless signal is converted into a DC signal by a rectifier circuit of the RFID tag. On the basis of this DC current, the RFID tag is energized. Next, the energized RFID tag acquires a command on the basis of the wireless signal from the reader/writer and performs an operation responsive to this command. Subsequently, the RFID tag transmits a response of a result responsive to this command as a wireless signal from its antenna to the antenna of the reader/writer. The operation responsive to the command is performed by at least a demodulation circuit, a control circuit, and a modulation circuit that are known.

The wireless communication apparatus according to the present invention has at least a memory circuit having the memory array, transistors, and an antenna. The transistors are components in a rectifier circuit and a logic circuit. The logic circuit includes a demodulation circuit, a control circuit, and a modulation circuit.

Figure 24:
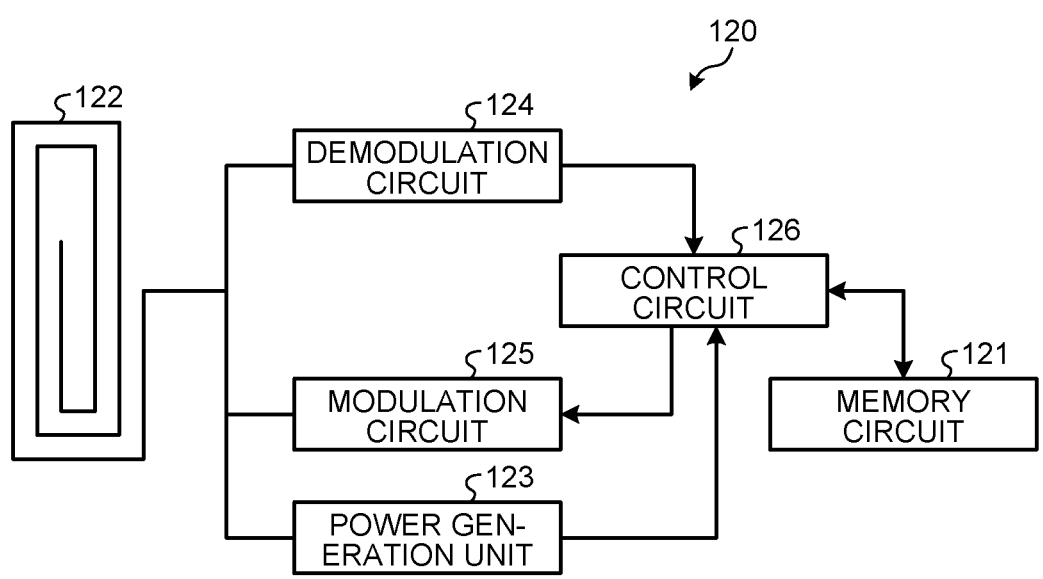
FIG. 24 is a block diagram of a configuration example of a wireless communication apparatus including a memory array according to the present invention.

FIG. 24 is a block diagram of a configuration example of the wireless communication apparatus including the memory array according to the present invention. As illustrated in FIG. 24, this wireless communication apparatus 120 includes a memory circuit 121, an antenna 122, a power generation unit 123, a demodulation circuit 124, a modulation circuit 125, and a control circuit 126. As exemplified by the memory circuit 130 illustrated in FIG. 14, the memory circuit 121 includes a memory array in which unique information such as an ID number is recorded in a readable manner. The memory array included in this memory circuit 121 is the memory array according to the first to the third embodiments or a memory array cut out of the memory array sheet according to the fourth and the fifth embodiments. The antenna 122 transmits and receives wireless signals to and from an external apparatus such as a reader/writer. The power generation unit 123 functions as a rectifier circuit in the wireless communication apparatus 120. The demodulation circuit 124, the modulation circuit 125, and the control circuit 126 are circuits forming a logic circuit in the wireless communication apparatus 120. As illustrated in FIG. 24, these circuits and the antenna 122 are electrically connected to each other via wires.

In the wireless communication apparatus 120, the antenna 122 receives a wireless signal (a modulated wave signal) transmitted from the external apparatus. The power generation unit 123 performs rectification that converts the modulated wave signal received by the antenna 122 into a DC current and supplies the DC current (electric power) obtained thereby to the units of the wireless communication apparatus 120. The demodulation circuit 124 demodulates this modulated wave signal and transmits an electric signal (a command) obtained thereby to the control circuit 126. The memory circuit 121 holds the unique information recorded in the memory array as data. The control circuit 126 reads the data from the memory circuit 121 on the basis of the command acquired on the basis of the electric signal received from the demodulation circuit 124 and transmits this read data to the modulation circuit 125. The modulation circuit 125 modulates the data received from the control circuit 126 and transmits a modulated wave signal generated thereby to the antenna 122. The antenna 122 transmits this modulated wave signal from the modulation circuit 125 as a wireless signal containing the data to the external apparatus.

The wireless communication apparatus 120 includes the memory circuit 121 including the memory array according to the first to the third embodiments or the memory array cut out of the memory array sheet according to the fourth and the fifth embodiments and can include a memory array that is manufactured at low costs using simple processes and records unique information different from that of another memory array.

In the wireless communication apparatus 120, an input terminal, an output terminal, the antenna 122, the transistors included in the circuits may be ones generally used, and material for use in them and their shapes are not limited to particular ones. Materials of wires and the like that electrically connect them to each other may be any ones so long as they are electric conductive materials that can be generally used. A method for connecting them may be any method so long as it can establish electric continuity, and wires and electrodes for connection have any width and thickness.

EXAMPLES

The following describes the present invention more specifically on the basis of examples. The following examples do not limit the present invention.

(Manufacture of Semiconductor Solution)

In the manufacture of a semiconductor solution, first, 1.0 mg of CNT (manufactured by CNI, a single-layer CNT, purity: 95%) was added to a chloroform solution (10 ml) containing 2.0 mg of P3HT (manufactured by Aldrich, poly(3-hexylthiophene)) and was ultrasonically stirred using an ultrasonic homogenizer (manufactured by Tokyo Rikakikai Co., Ltd., VCX-500) with an output of 20% for 4 hours while being cooled with ice. With this operation, CNT Dispersion Liquid A11 (with a CNT composite concentration relative to the solvent of 0.96 g/l) was obtained.

Next, using a membrane filter (pore diameter: 10 µm, diameter: 25 mm, Omnipore Membrane manufactured by Millipore Corporation), CNT Dispersion Liquid A11 was filtered to remove a CNT composite with a length of 10 µm or more. To the filtrate obtained by this filtering, 5 ml of o-DCB (manufactured by Wako Pure Chemical Corporation) was added, and chloroform as a low boiling point solvent was distilled off using a rotary evaporator, whereby the solvent was replaced with o-DCB to obtain CNT Dispersion Liquid B11. To CNT Dispersion Liquid B11 (1 ml), 3 ml of o-DCB was added, whereby Semiconductor Solution A1 (with a CNT composite concentration relative to the solvent of 0.03 g/l) was obtained.

Composition Manufacture Example 1

In Composition Manufacture Example 1, Insulating Layer Solution A2 was manufactured. Specifically, first, dissolved in 203.36 g of propylene glycol monobutyl ether (boiling point: 170° C.) were methyltrimethoxysilane (61.29 g (0.45 mol)), 2(3,4-epoxycyclohexyl)ethyltrimethoxysilane (12.31 g (0.05 mol)), and phenyltrimethoxysilane (99.15 g (0.5 mol)). Water (54.90 g) and phosphoric acid (0.864 g) were added thereto with stirring. The thus obtained solution was heated at a bath temperature of 105° C. for 2 hours to increase the internal temperature up to 90° C. to distill off a component mainly containing methanol as a by-product.

Next, the solution was heated at a bath temperature of 130° C. for 2 hours to increase the internal temperature up to 118° C. to distill off a component mainly containing water and propylene glycol monobutyl ether. Subsequently, the solution was cooled to room temperature to obtain Polysiloxane Solution A3 with a solid content concentration of 26.0% by weight. The weight average molecular weight of polysiloxane in the obtained Polysiloxane Solution A3 was 6,000.

Next, 10 g of the obtained Polysiloxane Solution A3 was weighed out and was mixed with 54.4 g of propylene glycol monoethyl ether acetate (hereinafter referred to as PGMEA), and the mixture was stirred at room temperature for 2 hours. Insulating Layer Solution A2 was thus obtained.

Composition Manufacture Example 2

In Composition Manufacture Example 2, Insulating Layer Solution B2 was manufactured. Specifically, 10 g of Polysiloxane Solution A3 was weighed out and was mixed with a certain aluminum organic compound (aluminum bis(ethyl acetoacetate)mono(2,4-pentanedionato), manufactured by Kawaken Fine Chemicals Co., Ltd., product name: "Alumichelate D") (0.13 g) and propylene glycol monoethyl ether acetate (hereinafter referred to as "PGMEA") (54.4 g), and the mixture was stirred at room temperature for 2 hours. Consequently, Insulating Layer Solution B2 was obtained. The content of the polymer in this solution was 2,000 parts by weight relative to 100 parts by weight of the certain aluminum organic compound (Alumichelate D). When this Insulating Layer Solution B2 was stored in the air at room temperature, no precipitate was observed even after 1 month, showing stability.

Synthesis Example 1

In Synthesis Example 1, Compound P1 as an organic component was synthesized. In this Synthesis Example 1, the copolymerization ratio (in terms of weight) among ethyl acrylate (hereinafter referred to as "EA"), 2-ethylhexyl methacrylate (hereinafter referred to as "2-EHMA"), styrene (hereinafter referred to as "St"), glycidyl methacrylate (hereinafter referred to as "GMA"), and acrylic acid (hereinafter referred to as "AA") was 20:40:20:5:15.

Specifically, first, 150 g of diethylene glycol monoethyl ether acetate (hereinafter referred to as "DMEA") was charged into a reaction vessel in a nitrogen atmosphere and was heated up to 80° C. using an oil bath. Added dropwise thereto was a mixture of 20 g of EA, 40 g of 2-EHMA, 20 g of St, 15 g of AA, 0.8 g of 2,2'-azobisisobutyronitrile, and 10 g of DMEA over 1 hour. After the end of the dropwise addition, a polymerization reaction was performed for additional 6 hours. Subsequently, 1 g of hydroquinone monomethyl ether was added thereto to stop the polymerization reaction. Subsequently, a mixture of 5 g of GMA, 1 g of triethylbenzyl ammonium chloride, and 10 g of DMEA was added dropwise thereto over 0.5 hour. After the end of the dropwise addition, an addition reaction was performed for additional 2 hours. The reaction solution obtained by this procedure was refined with methanol to remove unreacted impurities and was then vacuum dried for 24 hours. Consequently, Compound P1 was obtained.

Synthesis Example 2

In Synthesis Example 2, Compound P2 as an organic component was synthesized. In this Synthesis Example 2, the copolymerization ratio (in terms of weight) among a bifunctional epoxy acrylate monomer (Epoxyester 3002A, manufactured by Kyoeisha Chemical Co., Ltd.), a bifunctional epoxy acrylate monomer (Epoxyester 70PA, manufactured by Kyoeisha Chemical Co., Ltd.), GMA, St, and AA was 20:40:5:20:15.

Specifically, first, 150 g of DMEA was charged into a reaction vessel in a nitrogen atmosphere and was heated up to 80° C. using an oil bath. Added dropwise thereto was a mixture of 20 g of Epoxyester 3002A, 40 g of Epoxyester 70PA, 20 g of St, 15 g of AA, 0.8 g of 2,2'-azobisisobutyronitrile, and 10 g of DMEA over 1 hour. After the end of the dropwise addition, a polymerization reaction was performed for additional 6 hours. Subsequently, 1 g of hydroquinone monomethyl ether was added thereto to stop the polymerization reaction. Subsequently, a mixture of 5 g of GMA, 1 g of triethylbenzyl ammonium chloride, and 10 g of DMEA was added dropwise thereto over 0.5 hour. After the end of the dropwise addition, an addition reaction was performed for additional 2 hours. The reaction solution obtained by this procedure was refined with methanol to remove unreacted impurities and was then vacuum dried for 24 hours. Consequently, Compound P2 was obtained.

Synthesis Example 3

In Synthesis Example 3, Compound P3 as an organic component was synthesized. Compound P3 is a urethane-modified compound of Compound P2 in Synthesis Example 2.

Specifically, first, 100 g of DMEA was charged into a reaction vessel in a nitrogen atmosphere and was heated up to 80° C. using an oil bath. Added dropwise thereto was a mixture of 10 g of Compound P2 (a photosensitive component), 3.5 g of n-hexyl isocyanate, and 10 g of DMEA over 1 hour. After the end of the dropwise addition, a reaction was performed for additional 3 hours. The reaction solution obtained by this procedure was refined with methanol to remove unreacted impurities and was then vacuum dried for 24 hours. Consequently, Compound P3 having a urethane bond was obtained.

Preparation Example 1

In Preparation Example 1, Electric Conductive Paste A4 was prepared. Specifically, first, charged into a 100 ml of clean bottle were 16 g of Compound P1, 4 g of Compound P3, 4 g of a photopolymerization initiator OXE-01 (manufactured by BASF Japan Ltd.), 0.6 g of an acid generator SI-110 (manufactured by Sanshin Chemical Industry Co., Ltd.), and 10 g of γ-butyrolactone (manufactured by Mitsubishi Gas Chemical Company, Inc.), which were mixed with a rotation/revolution vacuum mixer "Awatori Rentaro" (registered trademark) (ARE-310 manufactured by Thinky Corporation). With this operation, 46.6 g (solid content: 78.5% by weight) of a photosensitive resin solution was obtained. Next, this obtained photosensitive resin solution (8.0 g) and Ag particles (42.0 g) with an average particle diameter of 0.2 μm were mixed with each other and were kneaded using three rollers (product name: "EXAKT M-50" manufactured by EXAKT). Consequently, 50 g of Electric Conductive Paste A4 was obtained.

Example 1

In Example 1, the memory array according to the first embodiment of the present invention (refer to FIGS. 1 to 3) was manufactured. Specifically, first, 5 nm of chromium and 50 nm of gold were vacuum deposited on the substrate 1 made of glass (film thickness: 0.7 mm) through a mask by resistance heating to form the third electrodes 2 of the memory elements 14, 15, 16, and 17, the word line 10, and the word line 11. Next, Insulating Layer Solution A2 was applied to the substrate 1 by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 3 with a film thickness of 0.5 μm. Next, gold was vacuum deposited thereon so as to give a film thickness of 50 nm by resistance heating, and a photoresist (product name: "LC100-10 cP" manufactured by Rohm and Haas Company) was applied thereto by spin coating (1,000 rpm×20 seconds) and was heated and dried at 100° C. for 10 minutes.

Next, the photoresist film manufactured as described above was subjected to pattern exposure via a mask using a parallel light mask aligner (manufactured by Canon Inc., PLA-501F), was subjected to shower development with a 2.38% by weight aqueous tetramethylammonium hydroxide solution (product name: "ELM-D" manufactured by Mitsubishi Gas Chemical Company, Inc.) for 70 seconds using an automatic developing apparatus (manufactured by Takizawa Sangyo K.K., AD-2000), and was washed with water for 30 seconds. Subsequently, the substrate 1 was subjected to etching treatment with an etchant (product name: "AURUM-302" manufactured by Kanto Chemical Co., Inc.) for 5 minutes and was washed with water for 30 seconds. Next, the substrate 1 was immersed in a remover (product name: "AZ Remover 100" manufactured by AZ Electronic Materials) for 5 minutes to remove the resist, was washed with water for 30 seconds, and was heated and dried at 120° C. for 20 minutes to form the first electrode 5, the second electrode 6, the bit line 12, and the bit line 13.

The width of the first electrode 5 and the second electrode 6 was set to 100 μm, and the distance between these electrodes was set to 10 μm. On the substrate 1 on which the electrodes have been formed as described above, 100 pl of Semiconductor Solution A1 was applied to the memory elements 14 and 17 by ink jetting and was subjected to heating treatment on a hot plate under a nitrogen stream at 150° C. for 30 minutes to form the semiconductor layer 4. A memory array of Example 1 was thus obtained.

Next, electrical characteristics between the first electrode and the second electrode of the memory elements included in the memory array of Example 1 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id at Vg=−3 V and Vsd=−5 V was determined.

Table 1 below lists the values of Id (current values) of the memory elements 14 to 17 of the memory array of Example 1. As can be seen by referring to Table 1, there was a sufficient difference in Id passing between the first electrode and the second electrode between the memory elements 14 and 17 having the semiconductor layer 4 and the memory elements 15 and 16 not having the semiconductor layer 4 in Example 1. It has been revealed from this result that as to Example 1 respective pieces of information different from each other are recorded between the memory elements 14 and 17 and the memory elements 15 and 16.

Example 2

In Example 2, a PET film with a film thickness of 50 μm was used in place of the substrate 1 made of glass in Example 1, and Electric Conductive Paste A4 was applied to this PET film substrate by screen printing and was prebaked with a drying oven at 100° C. for 10 minutes. Subsequently, the resultant thin film was exposed using an exposure apparatus (product name: "PEM-8M" manufactured by Union Optical Co., Ltd.), was immersion developed with a 0.5% Na$_2$CO$_3$ solution for 30 seconds, was rinsed with ultrapure water, and was cured with a drying oven at 140° C. for 30 minutes to form the second electrodes 2 of the memory elements 14, 15, 16, and 17, the word line 10, and the word line 11.

Next, Insulating Layer Solution A2 was applied to the PET film substrate by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 3 with a film thickness of 0.5 μm.

Next, Electric Conductive Paste A4 was applied to the PET film substrate by screen printing and was prebaked with a drying oven at 100° C. for 10 minutes. Subsequently, the resultant thin film was exposed using an exposure apparatus "PEM-8M," was immersion developed with a 0.5% Na$_2$CO$_3$ solution for 30 seconds, was rinsed with ultrapure water, and was cured with a drying oven at 140° C. for 30 minutes to form the first electrode 5, the second electrode 6, the bit line 12, and the bit line 13.

On the substrate on which the electrodes have been formed as described above, 100 pl of Semiconductor Solution A1 was applied to the memory elements 14 and 17 by ink jetting and was subjected to heating treatment on a hot plate under a nitrogen stream at 150° C. for 30 minutes to form the semiconductor layer 4. A memory array of Example 2 was thus obtained. The width and spacing of the first electrode and the second electrode of the memory elements of the memory array of Example 2 are the same as those of Example 1.

Next, electrical characteristics between the first electrode and the second electrode of the memory elements included in the memory array of Example 2 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id at Vg=−3 V and Vsd=−5 V was determined.

Table 1 lists the values of Id (current values) of the memory elements 14 to 17 of the memory array of Example 2. As can be seen by referring to Table 1, there was a sufficient difference in Id passing between the first electrode and the second electrode between the memory elements 14 and 17 having the semiconductor layer 4 and the memory elements 15 and 16 not having the semiconductor layer 4 in Example 2. It has been revealed from this result that as to Example 2 respective pieces of information different from each other are recorded between the memory elements 14 and 17 and the memory elements 15 and 16.

Example 3

In Example 3, the memory array according to the second embodiment of the present invention (refer to FIGS. 4 to 6)

were manufactured. Specifically, first, 5 nm of chromium and 50 nm of gold were vacuum deposited on the substrate 21 made of glass (film thickness: 0.7 mm) through a mask by resistance heating to form the third electrodes 22 of the memory elements 34, 35, 36, and 37 and the word lines 30 and 31. Next, Insulating Layer Solution A2 was applied to the substrate 21 by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 23 with a film thickness of 0.5 μm. Next, gold was vacuum deposited thereon so as to give a film thickness of 50 nm by resistance heating, and a photoresist (product name: "LC100-10 cP" manufactured by Rohm and Haas Company) was applied thereto by spin coating (1,000 rpm×20 seconds) and was heated and dried at 100° C. for 10 minutes.

Next, the photoresist film manufactured as described above was subjected to pattern exposure via a mask using a parallel light mask aligner (manufactured by Canon Inc., PLA-501F), was subjected to shower development with a 2.38% by weight aqueous tetramethylammonium hydroxide solution (product name: "ELM-D" manufactured by Mitsubishi Gas Chemical Company, Inc.) for 70 seconds using an automatic developing apparatus (manufactured by Takizawa Sangyo K.K., AD-2000), and was washed with water for 30 seconds. Subsequently, the substrate 21 was subjected to etching treatment with an etchant (product name: "AURUM-302" manufactured by Kanto Chemical Co., Inc.) for 5 minutes and was washed with water for 30 seconds. Next, the substrate 21 was immersed in a remover (product name: "AZ Remover 100" manufactured by AZ Electronic Materials) for 5 minutes to remove the resist, was washed with water for 30 seconds, and was heated and dried at 120° C. for 20 minutes to form the first electrode 25, the second electrode 26, the bit line 32, and the bit line 33.

The width of the first electrode 25 and the second electrode 26 was set to 100 μm, and the distance between these electrodes was set to 10 μm. On the substrate 21 on which the electrodes have been formed as described above, 100 pl of Semiconductor Solution A1 was applied to the memory elements 34 and 37 by ink jetting and 20 pl of Semiconductor Solution A1 was applied to the memory elements 35 and 36 by ink jetting, which were subjected to heating treatment on a hot plate under a nitrogen stream at 150° C. for 30 minutes to form the semiconductor layer 24 and the semiconductor layer 27. A memory array of Example 3 was thus obtained.

Next, electrical characteristics between the first electrode and the second electrode of the memory elements included in the memory array of Example 3 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id at Vg=−3 V and Vsd=−5 V was determined.

Table 2 below lists the values of Id (current values) of the memory elements 34 to 37 of the memory array of Example 3. As can be seen by referring to Table 2, there was a sufficient difference in Id passing between the first electrode and the second electrode between the memory elements 34 and 37 having the semiconductor layer 24 and the memory elements 35 and 36 having the semiconductor layer 27 in Example 3. It has been revealed from this result that as to Example 3 respective pieces of information different from each other are recorded between the memory elements 34 and 37 and the memory elements 35 and 36.

Example 4

In Example 4, the memory array according to the third embodiment of the present invention (refer to FIGS. 8 to 10) was manufactured. Specifically, first, 5 nm of chromium and 50 nm of gold were vacuum deposited on the substrate 41 made of glass (film thickness: 0.7 mm) through a mask by resistance heating to form the third electrodes 42 of the memory elements 54, 55, 56, and 57 and the word lines 50 and 51. Next, Insulating Layer Solution B2 was applied to the substrate 41 by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 43 with a film thickness of 0.5 μm. Next, gold was vacuum deposited thereon so as to give a film thickness of 50 nm by resistance heating, and a photoresist (product name: "LC100-10 cP" manufactured by Rohm and Haas Company) was applied thereto by spin coating (1,000 rpm×20 seconds) and was heated and dried at 100° C. for 10 minutes.

Next, the photoresist film manufactured as described above was subjected to pattern exposure via a mask using a parallel light mask aligner (manufactured by Canon Inc., PLA-501F), was subjected to shower development with a 2.38% by weight aqueous tetramethylammonium hydroxide solution (product name: "ELM-D" manufactured by Mitsubishi Gas Chemical Company, Inc.) for 70 seconds using an automatic developing apparatus (AD-2000 manufactured by Takizawa Sangyo K.K.), and was washed with water for 30 seconds. Subsequently, the substrate 41 was subjected to etching treatment with an etchant (product name: "AURUM-302" manufactured by Kanto Chemical Co., Inc.) for 5 minutes and was washed with water for 30 seconds. Next, the substrate 41 was immersed in a remover (product name: "AZ Remover 100" manufactured by AZ Electronic Materials) for 5 minutes to remove the resist, was washed with water for 30 seconds, and was heated and dried at 120° C. for 20 minutes to form the first electrode 45, the second electrode 46, the bit line 52, and the bit line 53.

The width of the first electrode 45 and the second electrode 46 was set to 100 μm, and the distance between these electrodes was set to 10 μm. On the substrate 41 on which the electrodes have been formed as described above, 100 pl of Semiconductor Solution A1 was applied to the memory elements 54, 55, 56, and 57 by ink jetting and was subjected to heating treatment on a hot plate under a nitrogen stream at 150° C. for 30 minutes to form the semiconductor layer 44.

Next, polyvinyl alcohol (PVA manufactured by Nacalai Tesque, Inc.) was dissolved in water so as to be 2% by weight, 150 pl of which was applied to the respective semiconductor layers 44 of the memory element 54 and the memory element 57 by ink jetting so as to cover the semiconductor layers 44. Polystyrene was dissolved in methyl ethyl ketone (hereinafter referred to as "MEK") so as to be 5% by weight, 150 pl of which was applied to the respective semiconductor layers 44 of the memory element 55 and the memory element 56 by ink jetting so as to cover the semiconductor layers 44. Subsequently, these applied liquids were subjected to heating treatment under a nitrogen stream at 100° C. for 10 minutes to form the first insulating layer 48 on the respective semiconductor layers 44 of the memory element 54 and the memory element 57 and to form the second insulating layer 49 on the respective semiconductor layers 44 of the memory element 55 and the memory element 56. A memory array of Example 4 was thus obtained.

Next, electrical characteristics between the first electrode and the second electrode of the memory elements included in the memory array of Example 4 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id at Vg=−3 V and Vsd=−5 V was determined.

Table 3 below lists the values of Id (current values) of the memory elements 54 to 57 of the memory array of Example 4. As can be seen by referring to Table 3, there was a sufficient difference in Id passing between the first electrode and the second electrode between the memory elements 54 and 57 having the first insulating layer 48 and the memory elements 55 and 56 having the second insulating layer 49 in Example 4. It has been revealed from this result that as to Example 4 respective pieces of information different from each other are recorded between the memory elements 54 and 57 and the memory elements 55 and 56.

Examples 5 to 13

In Examples 5 to 13, memory arrays were manufactured similarly to Example 4 on the conditions listed in Table 3. For the memory elements of the obtained memory arrays, values of Id at Vg=−3 V and Vsd=−5 V were determined similarly to Example 4. Table 3 lists the obtained results.

Table 3 lists the respective materials used for the first insulating layer 48 and the second insulating layer 49 in abbreviated form. These materials listed in abbreviated form are as follows.

"PVA" is obtained by dissolving polyvinyl alcohol (manufactured by Nacalai Tesque, Inc.) in water so as to be 2% by weight. "PVP" is obtained by dissolving polyvinylphenol (manufactured by Aldrich) in 1-butanol so as to be 5% by weight. "PMF" is obtained by dissolving poly(melamine-co-formaldehyde) (manufactured by Aldrich, solid content concentration: 84% by weight, 1-butanol solution) in 1-butanol so as to be 5% by weight. "CYEP" is obtained by dissolving cyanoethyl pullulan (manufactured by Shin-Etsu Chemical Co., Ltd.) in MEK so as to be 5% by weight. "P(VDF-TrFE)" is obtained by dissolving poly(vinylidene fluoride-trifluoroethylene) (manufactured by Solvay, Solvene 250) in PGMEA so as to be 5% by weight. "Polysiloxane Solution A3" is obtained by dissolving Polysiloxane Solution A3 in PGMEA so as to be 3% by weight. "Polystyrene+DBU" is obtained by dissolving polystyrene so as to be 5% by weight and 1,8-diazabicyclo[5.4.0]undec-7-ene (DBU, manufactured by Tokyo Chemical Industry Co., Ltd., first class) so as to be 0.5% by weight in MEK. "Polystyrene+DBN" is obtained by dissolving polystyrene so as to be 5% by weight and 1,5-diazabicyclo[4.3.0]non-5-ene (DBN, manufactured by Tokyo Chemical Industry Co., Ltd., first class) so as to be 0.5% by weight in MEK.

Table 3 lists the values of Id of the respective memory elements 54 to 57 of Examples 5 to 13. As can be seen by referring to Table 3, there was a sufficient difference in Id passing between the first electrode and the second electrode between the memory elements 54 and 57 having the first insulating layer 48 and the memory elements 55 and 56 having the second insulating layer 49 in each of Examples 5 to 13. It has been revealed from this result that as to each of Examples 5 to 13 respective pieces of information different from each other are recorded between the memory elements 54 and 57 and the memory elements 55 and 56.

Example 14

In Example 14, the memory elements 66 and 67 in the fourth embodiment of the present invention (refer to FIG. 16) were manufactured with a configuration similar to those of the memory elements 14 and 15 in the first embodiment (refer to FIG. 2), and a memory array sheet having the memory arrays 61 to 64 in the first example of the fourth embodiment was manufactured.

Specifically, first, Electric Conductive Paste A4 was applied to the sheet 60 made of polyimide (film thickness: 0.02 mm) by slit die coating and was prebaked with a drying oven at 100° C. for 10 minutes. Subsequently, the resultant thin film was exposed using an exposure apparatus (product name: "PEM-8M" manufactured by Union Optical Co., Ltd.), was immersion developed with a 0.5% KOH solution for 60 seconds, was rinsed with ultrapure water, and was cured with a drying oven at 200° C. for 30 minutes to form the third electrodes 2 of the memory elements 66 and 67, the word line 10, and the word line 11.

Next, Insulating Layer Solution A2 was applied to the sheet 60 by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 3 with a film thickness of 0.5 μm. Next, Electric Conductive Paste A4 was applied to the sheet 60 by slit die coating and was prebaked with a drying oven at 100° C. for 10 minutes. Subsequently, the resultant thin film was exposed using an exposure apparatus (product name: "PEM-8M" manufactured by Union Optical Co., Ltd.), was immersion developed with a 0.5% KOH solution for 60 seconds, was rinsed with ultrapure water, and was cured with a drying oven at 200° C. for 30 minutes to form the first electrode 5, the second electrode 6, the bit line 12, and the bit line 13.

The width of the first electrode 5 and the second electrode 6 was set to 100 μm, and the distance between these electrodes was set to 10 μm. On the sheet 60 on which the first electrode 5 and the second electrode 6 have been formed as described above, 100 pl of Semiconductor Solution A1 was applied to the memory element 66 by ink jetting and was subjected to heating treatment on a hot plate under a nitrogen stream at 150° C. for 30 minutes to form the semiconductor layer 4. A memory array sheet of Example 14 was thus obtained.

Next, electrical characteristics between the first electrode and the second electrode of the memory elements within the memory array sheet of Example 14 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id (a current value) at Vg=−3 V and Vsd=−5 V was determined.

In Example 14, for the memory element 66 having the semiconductor layer 4, a value of Id on the order of μA was observed. In contrast, for the memory element 67 not having the semiconductor layer 4, no value of Id was observed. It has been revealed from this result that the memory element 66 and the memory element 67 record respective pieces of information different from each other such as "1" or "0." Further, the memory arrays 61 to 64 are different from each other in the arrangement pattern of the memory element 66 and the memory element 67, and it has been revealed that these memory arrays 61 to 64 record respective pieces of unique information different from each other.

Example 15

In Example 15, the memory elements 90 to 105 in the fifth embodiment of the present invention (refer to FIG. 18) were manufactured with a configuration similar to those of the memory elements 94 and 95 illustrated in FIG. 19, and a memory array sheet having the memory arrays 71 to 74 in the fifth embodiment was manufactured.

Specifically, first, Electric Conductive Paste A4 was applied to the sheet 70 made of polyimide (film thickness: 0.02 mm) by slit die coating and was prebaked with a drying oven at 100° C. for 10 minutes. Subsequently, the resultant thin film was exposed using an exposure apparatus (product name: "PEM-8M" manufactured by Union Optical Co., Ltd.), was immersion developed with a 0.5% KOH solution for 60 seconds, was rinsed with ultrapure water, and was cured with a drying oven at 200° C. for 30 minutes to form the third electrodes 88 of the memory elements 90 to 105, the word line 80, the word line 81, and the connecting parts 106 to 109.

Next, Insulating Layer Solution A2 was applied to the sheet 70 by spin coating (1,000 rpm×20 seconds), was subjected to heating treatment under the air atmosphere at 120° C. for 3 minutes, and was subjected to heating treatment under a nitrogen atmosphere at 150° C. for 120 minutes to form the insulating layer 87 with a film thickness of 0.5 μm. Next, Electric Conductive Paste A4 was applied to the sheet 70 by slit die coating and was prebaked with a drying oven at 100° C. for 10 minutes. Subsequently, the resultant thin film was exposed using an exposure apparatus (product name: "PEM-8M" manufactured by Union Optical Co., Ltd.), was immersion developed with a 0.5% KOH solution for 60 seconds, was rinsed with ultrapure water, and was cured with a drying oven at 200° C. for 30 minutes to form the first electrode 85, the second electrode 86, the bit line 82, and the bit line 83.

The width of the first electrode 85 and the second electrode 86 was set to 100 μm, and the distance between these electrodes was set to 10 μm. To the sheet 70 on which the first electrode 85 and the second electrode 86 have been formed as described above, 100 pl of Semiconductor Solution A1 was applied by ink jetting and was subjected to heating treatment on a hot plate under a nitrogen stream at 150° C. for 30 minutes to form the semiconductor layer 89. Next, on the sheet 70 on which the first electrode 85 and the second electrode 86 have been formed, 30 pl of Electric Conductive Paste A4 was applied only to the memory elements 90 to 93, 95, 96, and 99 to 102 by ink jetting, was prebaked with a drying oven at 100° C. for 10 minutes, and was further cured with a drying oven at 200° C. for 30 minutes to form the connecting parts 110 to 119. A memory array sheet of Example 15 was thus obtained.

Next, electrical characteristics between the first electrode and the second electrode of the memory elements within the memory array sheet of Example 15 were measured. Specifically, as the electrical characteristics, a current (Id) and a voltage (Vsd) between the first electrode and the second electrode when a voltage (Vg) of the third electrode of the memory elements was changed were measured. For this measurement, a semiconductor characteristics evaluation system 4200-SCS Model (manufactured by Keithley Instruments Ltd.) was used, and the measurement was performed in the air. With this measurement, a value of Id (a current value) at Vg=−3 V and Vsd=−5 V was determined.

In Example 15, for the memory elements 90 to 93, 95, 96, and 99 to 102 having the connecting parts 110 to 119, that is, having the first wire pattern, a value of Id on the order of μA was observed. In contrast, for the memory elements 94, 97, 98, and 103 to 105 not having the connecting part that electrically connects the first electrode 85 and the bit line 82 or the bit line 83 to each other, that is, having the second wire pattern, no value of Id was observed. It has been revealed from this result that the memory element with the first wire pattern and the memory element with the second wire pattern record respective pieces of information different from each other such as "1" or "0." Further, the memory arrays 71 to 74 are different from each other in the arrangement pattern of the memory element with the first wire pattern and the memory element with the second wire pattern, and it has been revealed that these memory arrays 71 to 74 record respective pieces of unique information different from each other.

TABLE 1

|  | Electrode material | Current value/μA | | | |
|---|---|---|---|---|---|
|  |  | Memory element 14 | Memory element 15 | Memory element 16 | Memory element 17 |
| Example 1 | Au | 1.2 | Unmeasurable | Unmeasurable | 1.1 |
| Example 2 | Electric Conductive Paste A4 | 1.3 | Unmeasurable | Unmeasurable | 1.3 |

TABLE 2

|  | Electrode material | Current value/μA | | | |
|---|---|---|---|---|---|
|  |  | Memory element 34 | Memory element 35 | Memory element 36 | Memory element 37 |
| Example 3 | Au | 1.0 | $3.0 \times 10^{-3}$ | $5.0 \times 10^{-3}$ | 1.1 |

TABLE 3

| | Electrode material | First insulating layer 48 Compound | Second insulating layer 49 Compound | Current value/µA | | | |
|---|---|---|---|---|---|---|---|
| | | | | Memory element 54 | Memory element 55 | Memory element 56 | Memory element 57 |
| Example 4 | Au | PVA | Polystyrene | 1.0 | $3.0 \times 10^{-3}$ | $4.0 \times 10^{-3}$ | 0.9 |
| Example 5 | Au | PVA | Polysiloxane Solution A3 | 1.0 | $6.0 \times 10^{-3}$ | $5.0 \times 10^{-3}$ | 0.9 |
| Example 6 | Au | CYEP | Polystyrene | 1.0 | $5.0 \times 10^{-3}$ | $3.0 \times 10^{-3}$ | 1.0 |
| Example 7 | Au | CYEP | PVP | 0.9 | $8.0 \times 10^{-3}$ | $7.0 \times 10^{-3}$ | 1.0 |
| Example 8 | Au | PMF | PVP | 0.9 | $8.0 \times 10^{-3}$ | $6.0 \times 10^{-3}$ | 0.9 |
| Example 9 | Au | PMF | Polysiloxane Solution A3 | 0.9 | $8.0 \times 10^{-3}$ | $6.0 \times 10^{-3}$ | 0.9 |
| Example 10 | Au | P(VDF-TrFE) | Polystyrene + DBU | 0.9 | $1.0 \times 10^{-4}$ | $1.0 \times 10^{-4}$ | 0.9 |
| Example 11 | Au | P(VDF-TrFE) | Polystyrene + DBN | 1.0 | $3.0 \times 10^{-4}$ | $3.0 \times 10^{-4}$ | 1.1 |
| Example 12 | Electric Conductive Paste A4 | P(VDF-TrFE) | Polystyrene + DBU | 1.1 | $3.0 \times 10^{-4}$ | $3.0 \times 10^{-4}$ | 0.9 |
| Example 13 | Electric Conductive Paste A4 | CYEP | PVP | 1.0 | $1.0 \times 10^{-3}$ | $1.0 \times 10^{-3}$ | 0.9 |

INDUSTRIAL APPLICABILITY

As described above, the memory array, the method for manufacturing a memory array, the memory array sheet, the method for manufacturing a memory array sheet, and the wireless communication apparatus according to the present invention are suitable for the achievement of a memory array that can be manufactured at low costs using simple processes and can record pieces of unique information different each time it is manufactured and a memory array sheet and a wireless communication apparatus including the same.

REFERENCE SIGNS LIST

1 Substrate
2 Third electrode
3 Insulating layer
4 Semiconductor layer
5 First electrode
6 Second electrode
10, 11 Word line
12, 13 Bit line
14, 15, 16, 17 Memory element
21 Substrate
22 Third electrode
23 Insulating layer
24, 27 Semiconductor layer
25 First electrode
26 Second electrode
30, 31 Word line
32, 33 Bit line
34, 35, 36, 37 Memory element
41 Substrate
42 Third electrode
43 Insulating layer
44 Semiconductor layer
45 First electrode
46 Second electrode
48 First insulating layer
49 Second insulating layer
50, 51 Word line
52, 53 Bit line
54, 55, 56, 57 Memory element
60 Sheet
61, 62, 63, 64 Memory array
61a, 62a, 63a, 64a Area
65 Memory array sheet
66, 67 Memory element
70 Sheet
71, 72, 73, 74 Memory array
71a, 72a, 73a, 74a Area
75 Memory array sheet
80, 81 Word line
82, 83 Bit line
85 First electrode
86 Second electrode
87 Insulating layer
88 Third electrode
89 Semiconductor layer
90, 91, 92, 93, 94, 95, 96, 97, 98, 99, 100, 101, 102, 103, 104, 105 Memory element
106, 107, 108, 109, 110, 111, 112, 113, 114, 115, 116, 117, 118, 119 Connecting part
120 Wireless communication apparatus
121 Memory circuit
122 Antenna
123 Power generation unit
124 Demodulation circuit
125 Modulation circuit
126 Control Circuit
130 Memory circuit
131 Memory array
132 Ring oscillator circuit
133 Counter circuit
134 Flip-flop circuit
200, 300, 500 Memory array

The invention claimed is:

1. A memory array comprising:
a plurality of first wires;
at least one second wire crossing the first wires; and
a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate, either the first electrode or the second electrode being connected to one of the first wires, at least one of the memory elements having an applied layer in an area between the first electrode and the second electrode, the memory elements including two kinds of memory elements different from each other in electrical characteristics between the first electrode and the second electrode by the applied layer, information to be recorded being determined by arrangement with any combination of the two kinds of memory elements, wherein:

the applied layer is a semiconductor layer formed of a semiconductor material applied to the area between the first electrode and the second electrode, out of the two kinds of memory elements, one kind of memory element is a memory element having the semiconductor layer, whereas another kind of memory element is a memory element not having the semiconductor layer, the one kind of memory element and the other kind of memory element record respective pieces of information different from each other by presence or absence of the semiconductor layer, and the other kind of memory element does not have any semiconductor layer applied to the area between the first electrode and the second electrode.

2. A memory array comprising:

a plurality of first wires;

at least one second wire crossing the first wires; and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate, either the first electrode or the second electrode being connected to one of the first wires, at least one of the memory elements having an applied layer in an area between the first electrode and the second electrode, the memory elements including two kinds of memory elements different from each other in electrical characteristics between the first electrode and the second electrode by the applied layer, information to be recorded being determined by arrangement with any combination of the two kinds of memory elements, wherein:

the applied layer is formed of a semiconductor material applied to the area between the first electrode and the second electrode and is a first semiconductor layer or a second semiconductor layer, the first and the second semiconductor layers being different from each other in electrical characteristics, out of the two kinds of memory elements, one kind of memory element is a memory element having the first semiconductor layer, whereas another kind of memory element is a memory element having the second semiconductor layer, the first semiconductor layer and the second semiconductor layer each contain carbon nanotubes as the semiconductor material, a concentration of carbon nanotubes of the second semiconductor layer is higher than a concentration of carbon nanotubes of the first semiconductor layer, and the one kind of memory element and the other kind of memory element record respective pieces of information different from each other by a difference in a current value between the one kind of memory element and the other kind of memory element when a certain voltage is applied to the third electrode of the one kind of memory element and the third electrode of the other kind of memory element, the current value being a current value passing between the first electrode and the second electrode of each of the one kind of memory element and the other kind of memory element.

3. The memory array according to claim 1, wherein the semiconductor layer contains one or more selected from the group consisting of carbon nanotubes, graphene, fullerenes, and organic semiconductors.

4. The memory array according to claim 1, wherein the semiconductor layer contains carbon nanotubes.

5. The memory array according to claim 4, wherein the carbon nanotubes contain a carbon nanotube composite in which a conjugated polymer is attached to at least part of surfaces of the carbon nanotubes.

6. A memory array sheet comprising a combination of a plurality of memory arrays formed on a sheet, each of the plurality of memory arrays comprising:

a plurality of first wires;

at least one second wire crossing the first wires; and a plurality of memory elements provided in correspondence with respective intersections of the first wires and the at least one second wire and each having a first electrode and a second electrode arranged spaced apart from each other, a third electrode connected to one of the at least one second wire, and an insulating layer that electrically insulates the first electrode and the second electrode and the third electrode from each other, the first wires, the at least one second wire, and the first wires, the at least one second wire, and the memory elements being formed on a substrate, either the first electrode or the second electrode being connected to one of the first wires, at least one of the memory elements having an applied layer in an area between the first electrode and the second electrode, the memory elements including two kinds of memory elements different from each other in electrical characteristics between the first electrode and the second electrode by the applied layer, information to be recorded being determined by arrangement with any combination of the two kinds of memory elements, wherein the applied layer is a semiconductor layer formed of a semiconductor material applied to the area between the first electrode and the second electrode, out of the two kinds of memory elements, one kind of memory element is a memory element having the semiconductor layer, whereas another kind of memory element is a memory element not having the semiconductor layer,
the other kind of memory element does not have any semiconductor layer applied to the area between the first electrode and the second electrode,
the one kind of memory element and the other kind of memory element record respective pieces of information different from each other by presence or absence of the semiconductor layer, and
respective pieces of information recorded in the memory arrays formed on the sheet is different from each other.

* * * * *